(12) United States Patent
Kadota et al.

(10) Patent No.: US 12,052,012 B2
(45) Date of Patent: *Jul. 30, 2024

(54) ACOUSTIC WAVE DEVICES

(71) Applicant: TOHOKU UNIVERSITY, Sendai (JP)

(72) Inventors: Michio Kadota, Sendai (JP); Shuji Tanaka, Sendai (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,079

(22) Filed: Feb. 18, 2022

(65) Prior Publication Data

US 2022/0173720 A1    Jun. 2, 2022

Related U.S. Application Data

(63) Continuation of application No. 16/463,649, filed as application No. PCT/JP2017/041165 on Nov. 15, 2017, now Pat. No. 11,258,427.

(30) Foreign Application Priority Data

Nov. 25, 2016 (JP) ................................ 2016-228508
May 11, 2017 (JP) ................................ 2017-095057

(51) Int. Cl.
  *H03H 9/54* (2006.01)
  *H03H 9/02* (2006.01)
  *H03H 9/64* (2006.01)

(52) U.S. Cl.
  CPC .......... *H03H 9/54* (2013.01); *H03H 9/02551* (2013.01); *H03H 9/64* (2013.01)

(58) Field of Classification Search
  CPC ......... H03H 9/54; H03H 9/02551; H03H 9/64
  See application file for complete search history.

(56) References Cited

U.S. PATENT DOCUMENTS

| 5,446,330 A | 8/1995 | Eda et al. | |
| 5,838,217 A * | 11/1998 | Kadota | H03H 9/02669 333/194 |
| 7,474,033 B2 * | 1/2009 | Oshio | H03H 9/14538 310/313 R |
| 7,626,314 B2 * | 12/2009 | Kadota | H03H 9/145 310/313 A |
| 11,258,427 B2 * | 2/2022 | Kadota | H03H 9/02574 |
| 2004/0164645 A1 * | 8/2004 | Oshio | H03H 9/25 310/313 B |

(Continued)

FOREIGN PATENT DOCUMENTS

| CN | 1707944 A | 12/2005 |
| JP | 10-224172 A | 8/1998 |

(Continued)

*Primary Examiner* — Samuel S Outten
(74) *Attorney, Agent, or Firm* — Chang & Hale LLP

(57) ABSTRACT

An acoustic wave device that has a better TCF and can improve a resonator Q or impedance ratio is provided. The acoustic wave device includes a substrate 11 containing 70 mass % or greater of silicon dioxide ($SiO_2$), a piezoelectric thin film 12 including $LiTaO_3$ crystal or $LiNbO_3$ crystal and disposed on the substrate 11, and an interdigital transducer electrode 13 disposed in contact with the piezoelectric thin film 12.

24 Claims, 36 Drawing Sheets

(56) References Cited

U.S. PATENT DOCUMENTS

| | | | |
|---|---|---|---|
| 2007/0090898 A1* | 4/2007 | Kando | H03H 9/14538 |
| | | | 333/195 |
| 2008/0169724 A1 | 7/2008 | Bhattacharjee et al. | |
| 2014/0203893 A1* | 7/2014 | Kando | H03H 9/02574 |
| | | | 333/187 |
| 2014/0225684 A1 | 8/2014 | Kando et al. | |
| 2018/0034439 A1* | 2/2018 | Ruby | H03H 9/02574 |
| 2018/0048282 A1* | 2/2018 | Kurimoto | H03H 9/02574 |

FOREIGN PATENT DOCUMENTS

| | | |
|---|---|---|
| JP | 2003-142984 A | 5/2003 |
| JP | 2004-254291 A | 9/2004 |
| JP | 2005347295 A | 12/2005 |
| JP | 2010-283807 A | 12/2010 |
| WO | 2015/186661 A1 | 12/2015 |

* cited by examiner

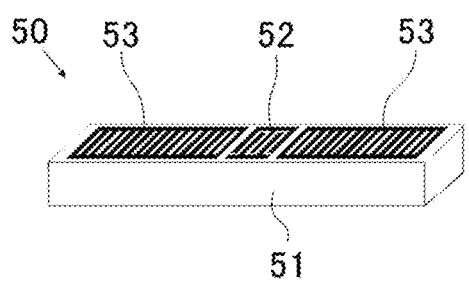
FIG. 1(a)
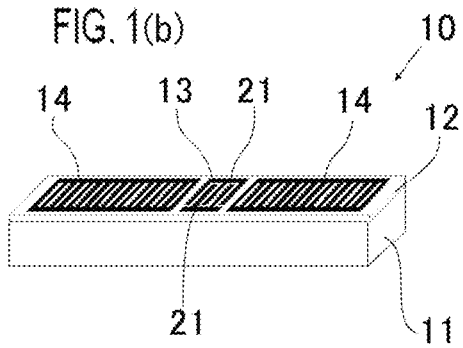
FIG. 1(b)
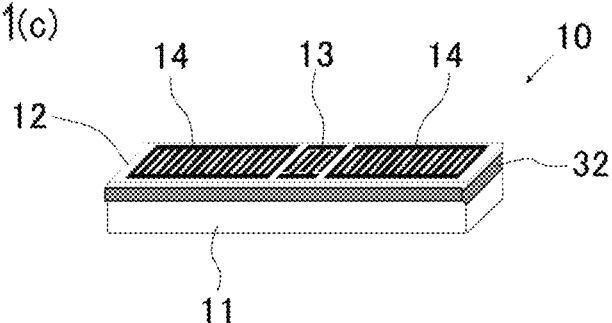
FIG. 1(c)
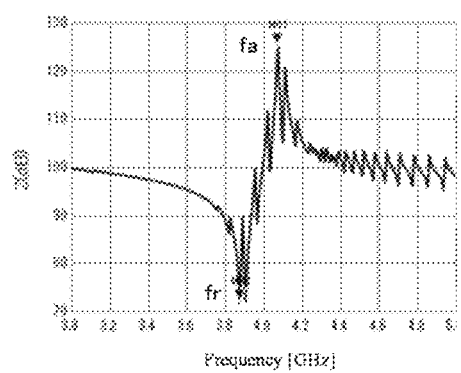
FIG. 2(a) (0°, 110°, 0°)LT
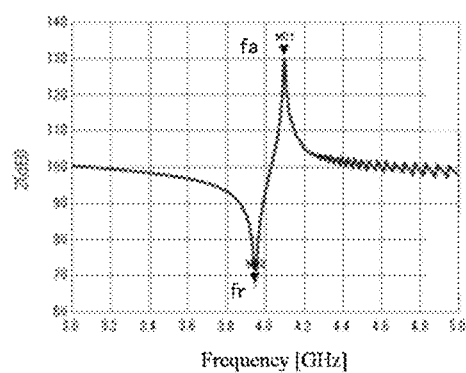
FIG. 2(b) (0°, 132°, 0°)LT FIG. 3(a) (0°, 110°, 0°)LT/(0°, 130°, 90°) quartz
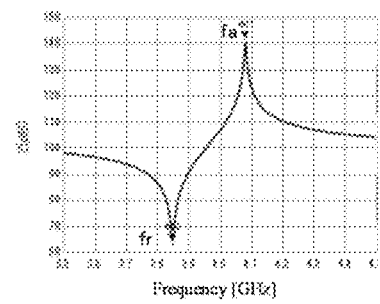
FIG. 3(b) (0°, 120°, 0°)LT/(0°, 130°, 0°) quartz
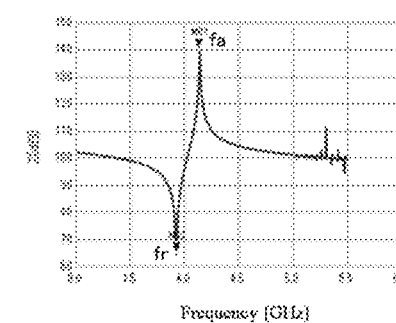
FIG. 4(a) (0°, 110°, 0°)LT/(0°, 130°, 30°) quartz
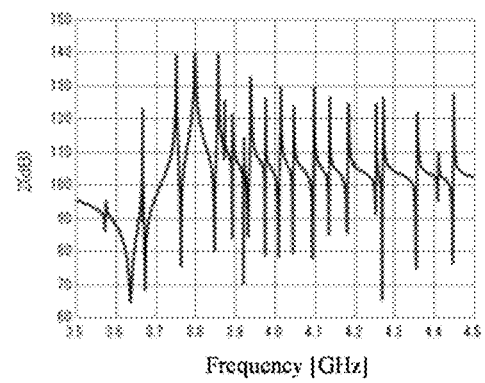
FIG. 4(b) (0°, 110°, 0°)LT/(0°, 130°, 60°) quartz
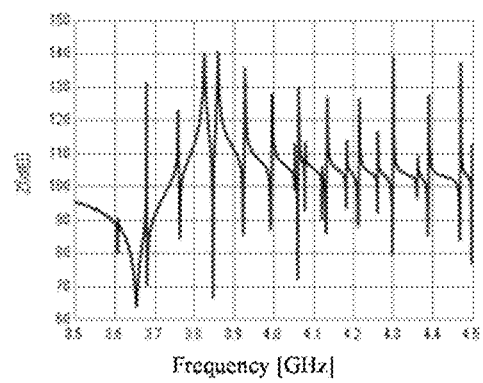

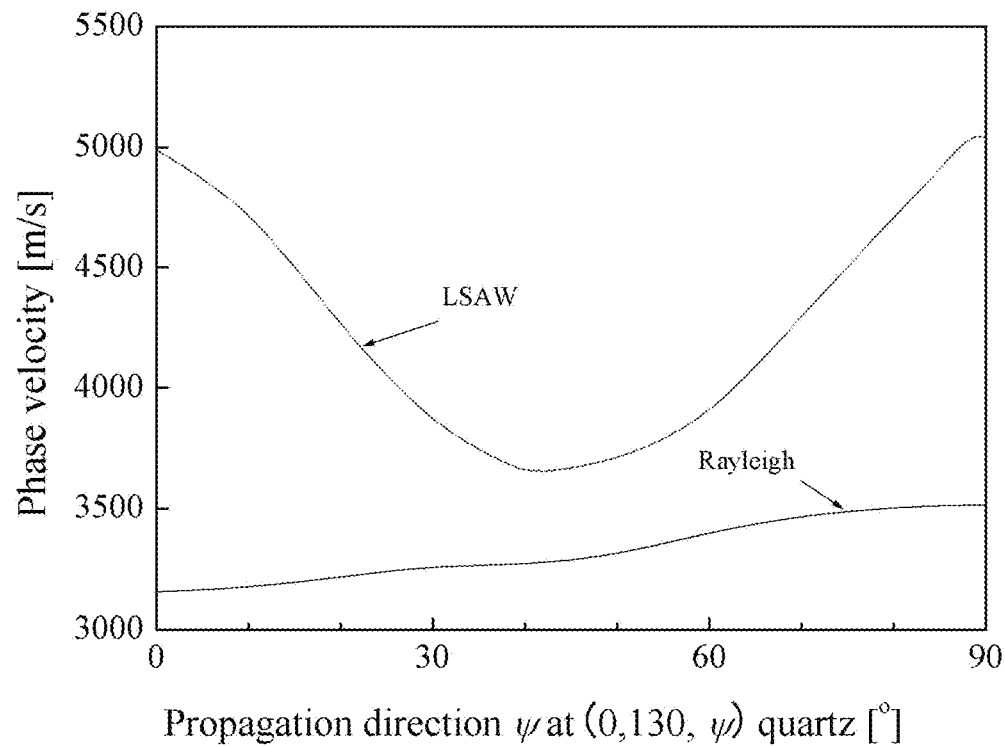
FIG. 5  (0°, 130°, ψ) quartz
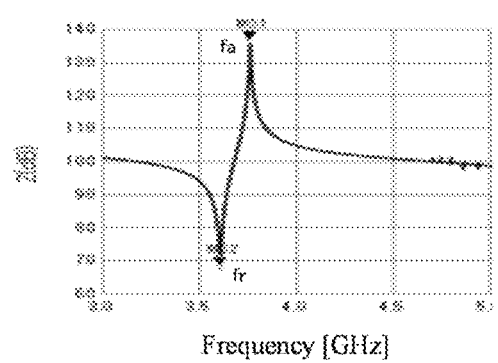
FIG.6(a) (0°, 132°, 0°) LT/(110) Si substrate
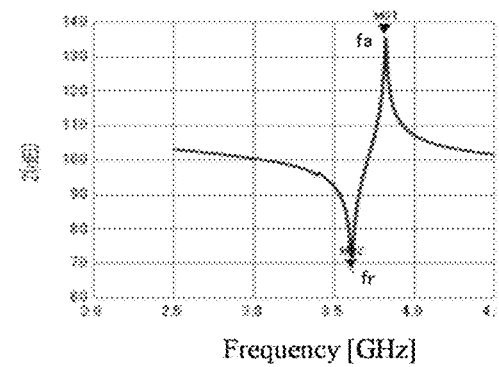
FIG.6(b) (0°, 132°, 0°) LT/c-sapphire substrate FIG. 7(a) (0°, θ, 0°) quartz
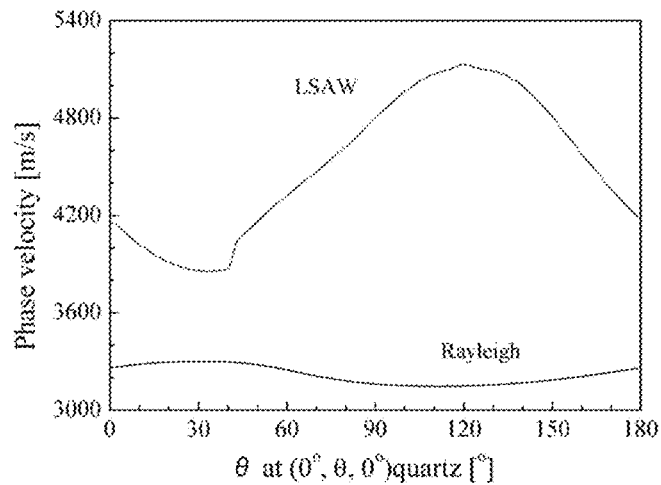
FIG. 7(b) (0°, θ, 0°) quartz
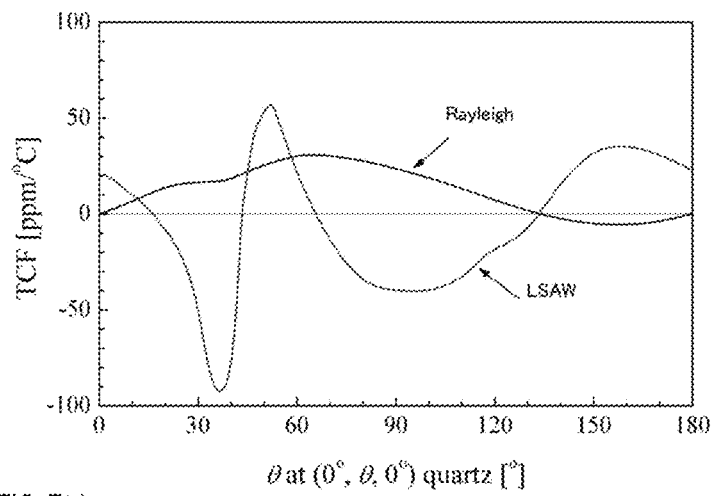
FIG. 7(c) (0°, θ, 0°) quartz
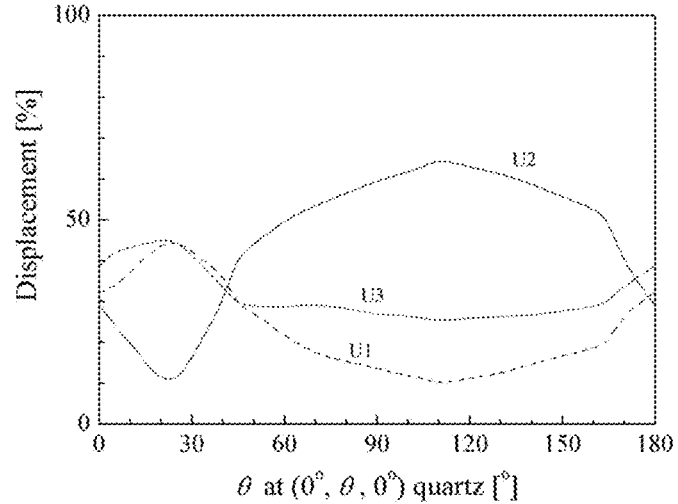

FIG. 8(a) (0°, θ, 90°) quartz
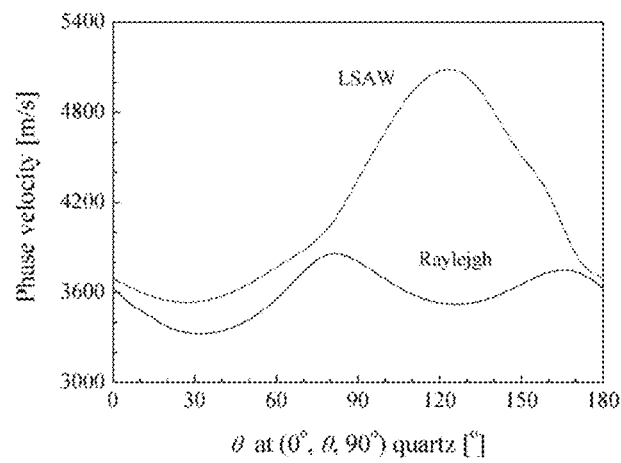
FIG. 8(b) (0°, θ, 90°) quartz
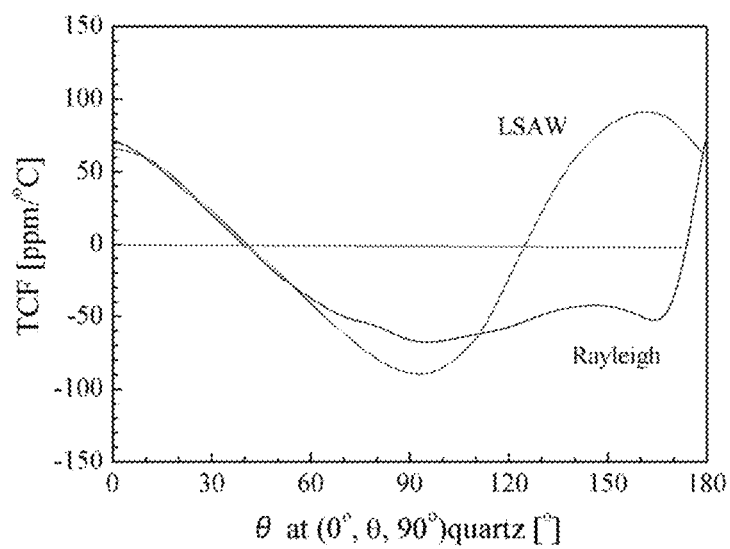
FIG. 8(c) (0°, θ, 90°) quartz
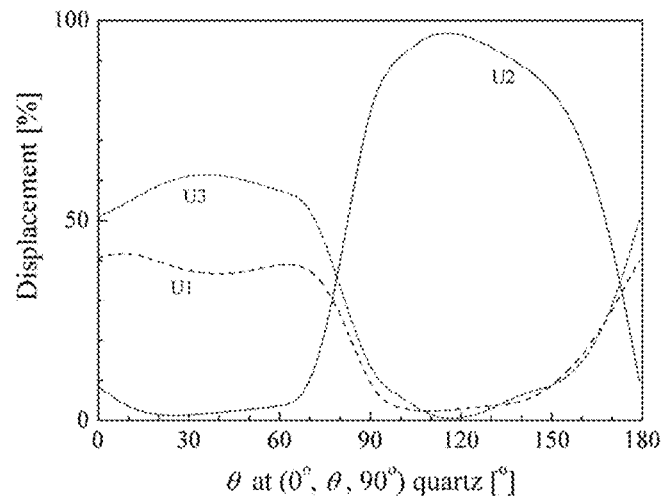

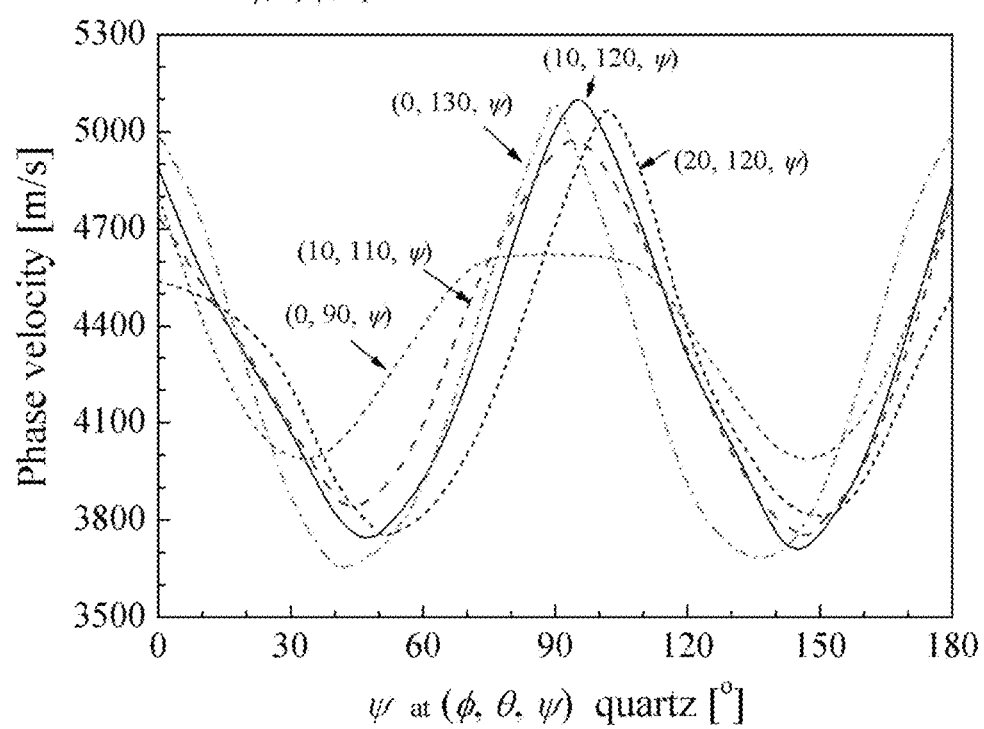

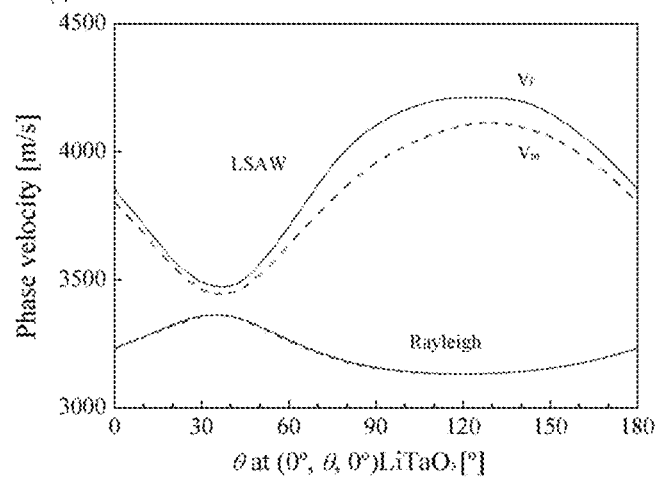
FIG. 10(a) (0°, θ, 0°) LT
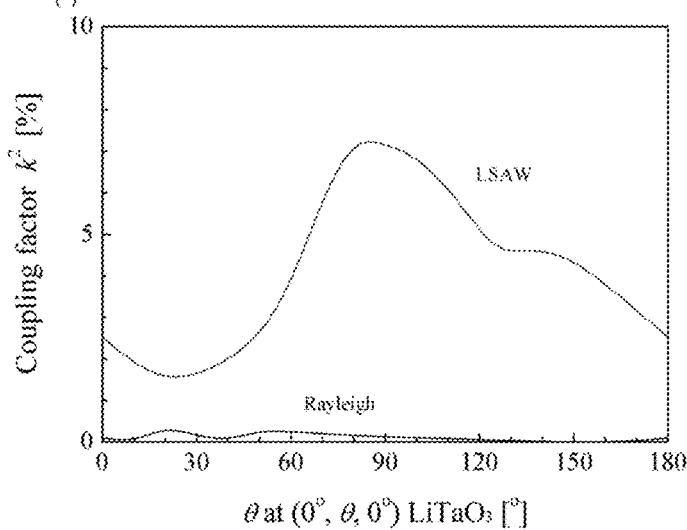
FIG. 10(b) (0°, θ, 0°) LT
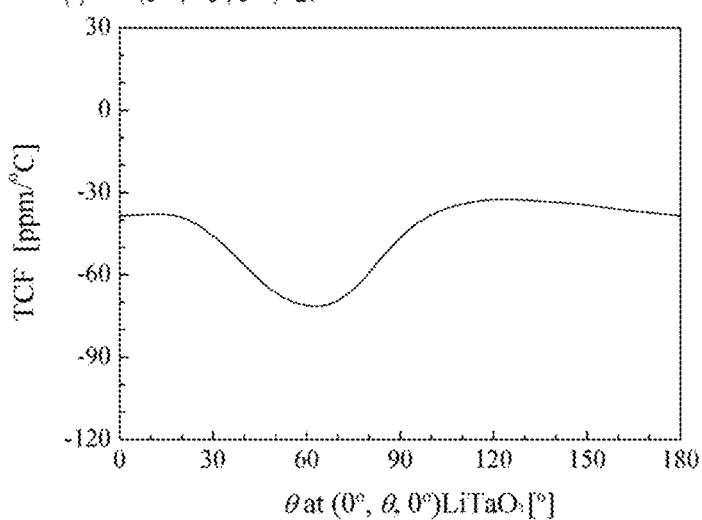
FIG. 10(c) (0°, θ, 0°) LT

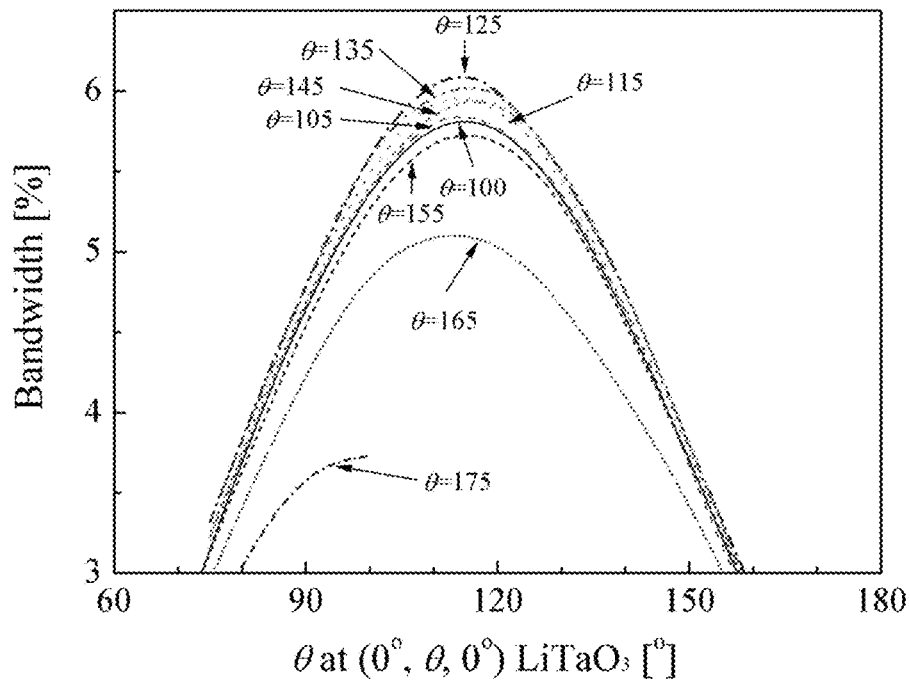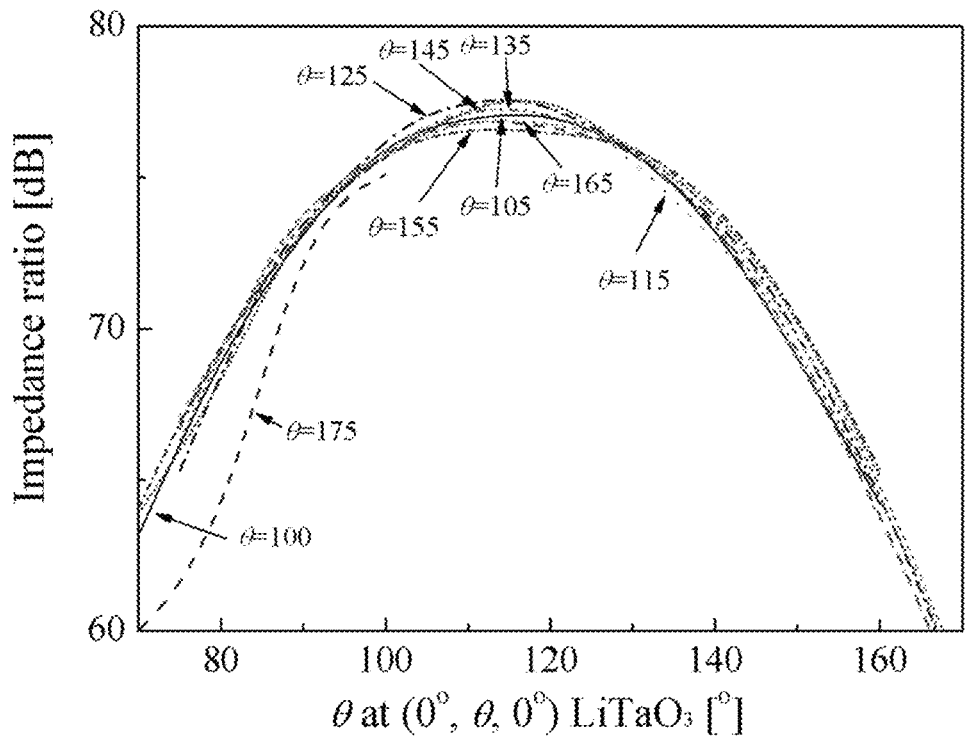

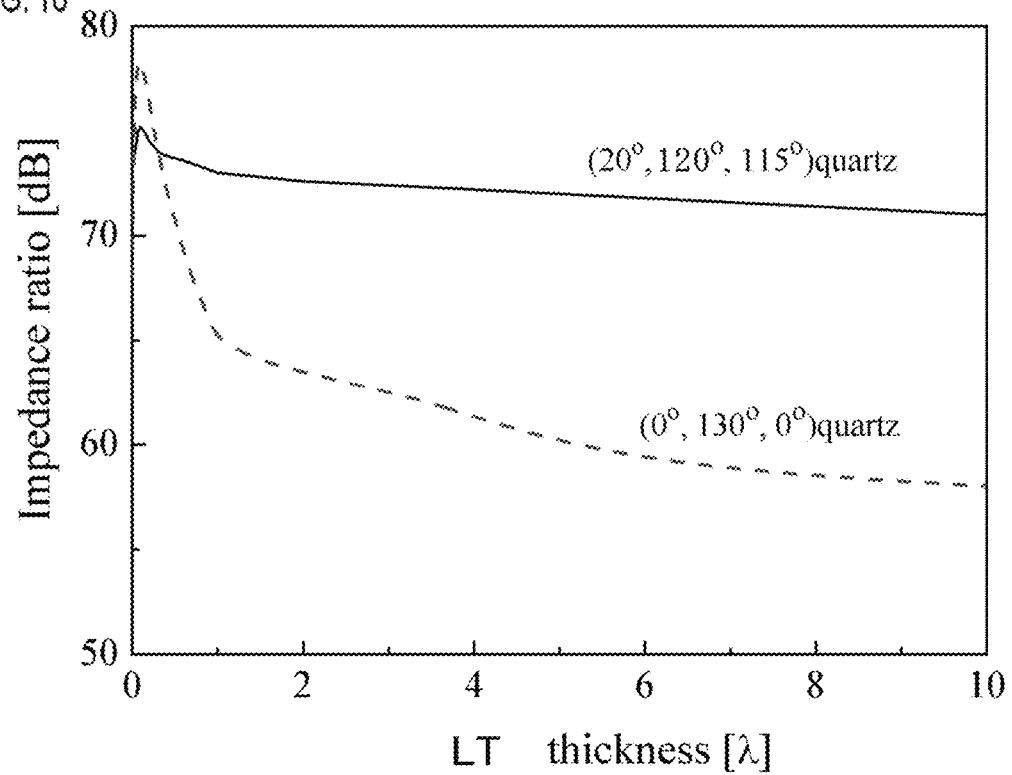

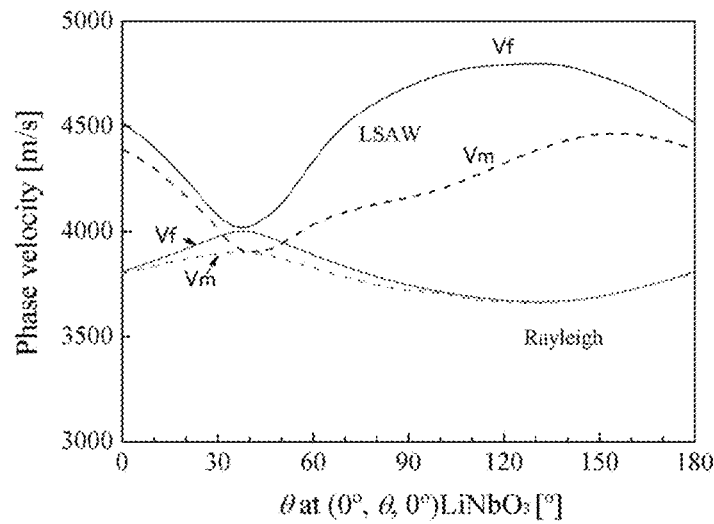
FIG. 20(a) (0°, θ, 0°) LN
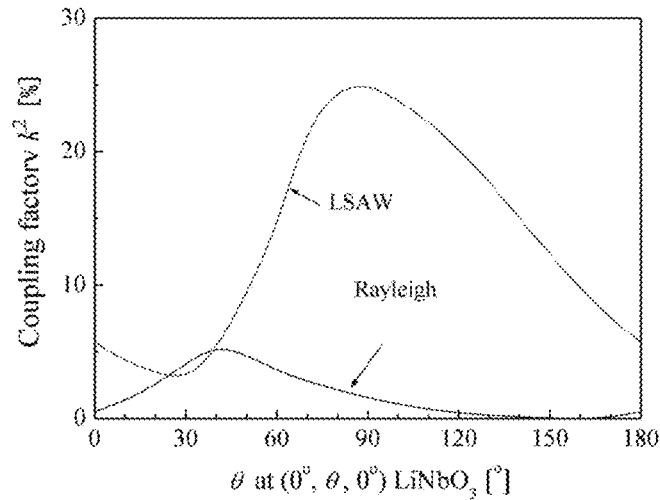
FIG. 20(b) (0°, θ, 0°) LN
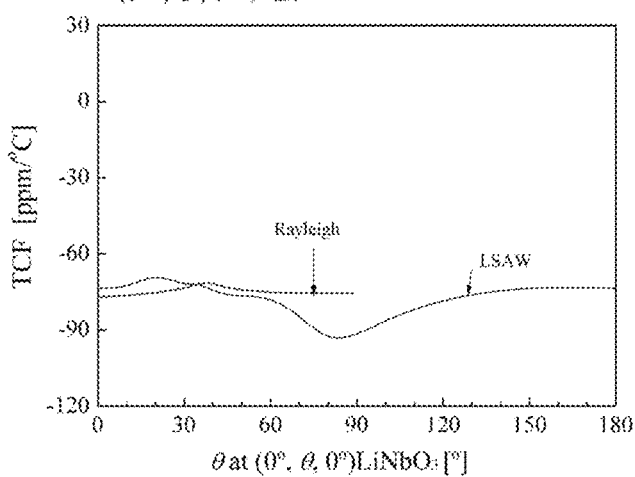
FIG. 20(c) (0°, θ, 0°) LN

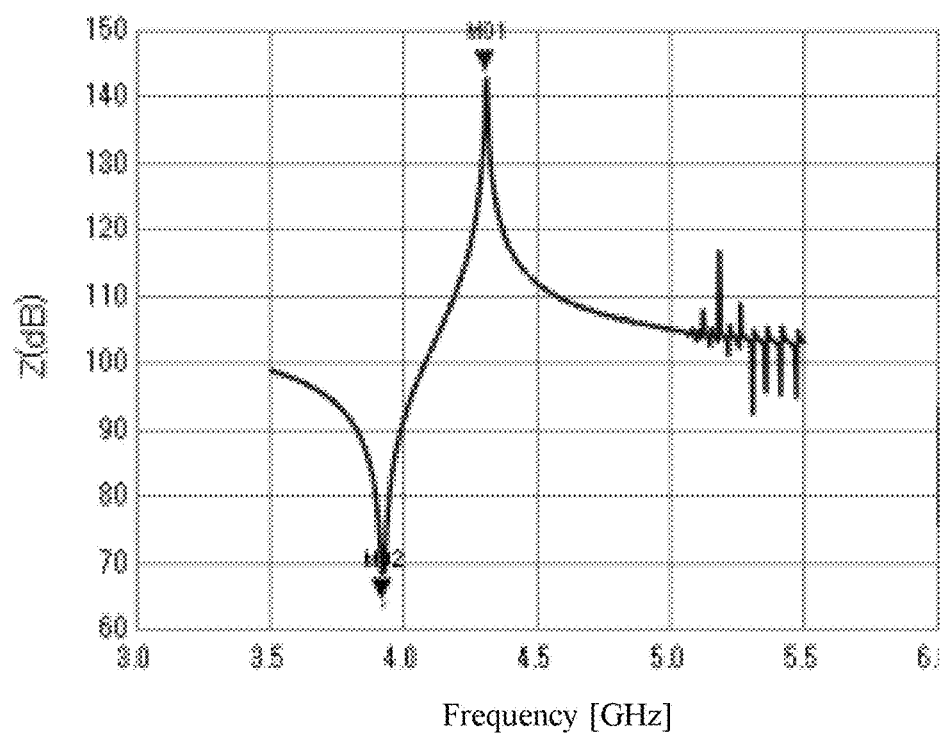
FIG. 21 (0°, 131°, 0°)LN／(0°, 115°, 90°)quartz

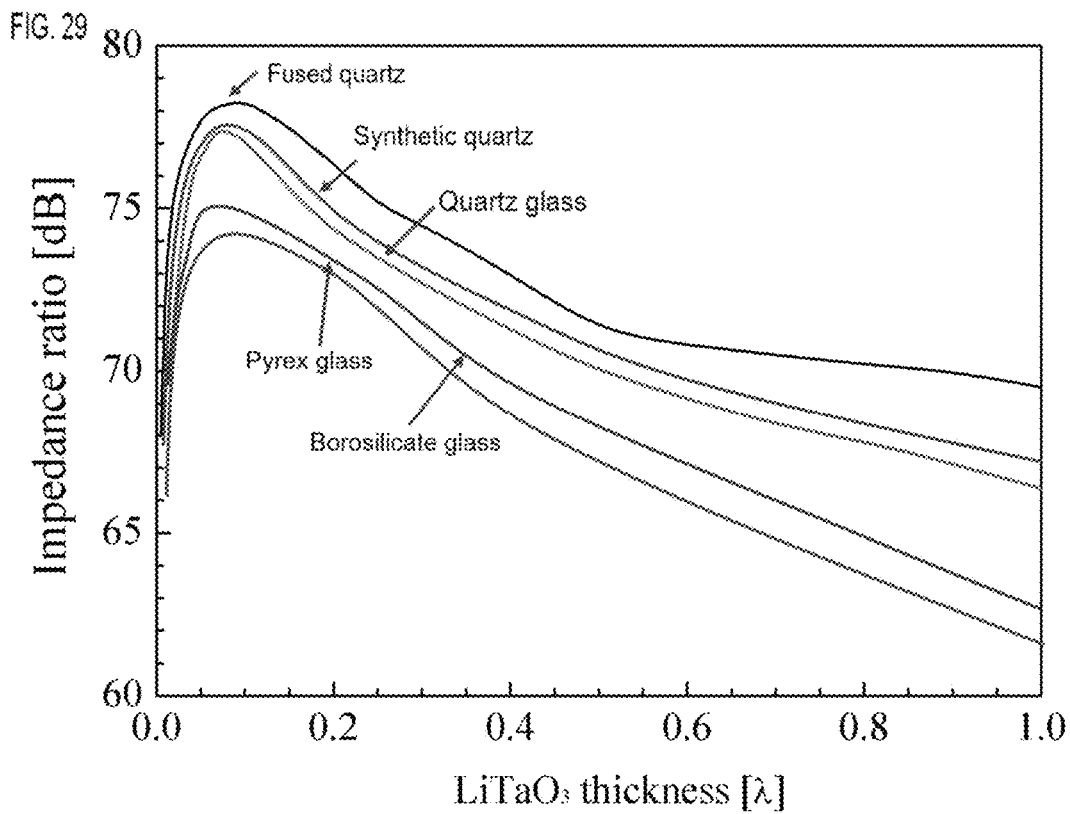
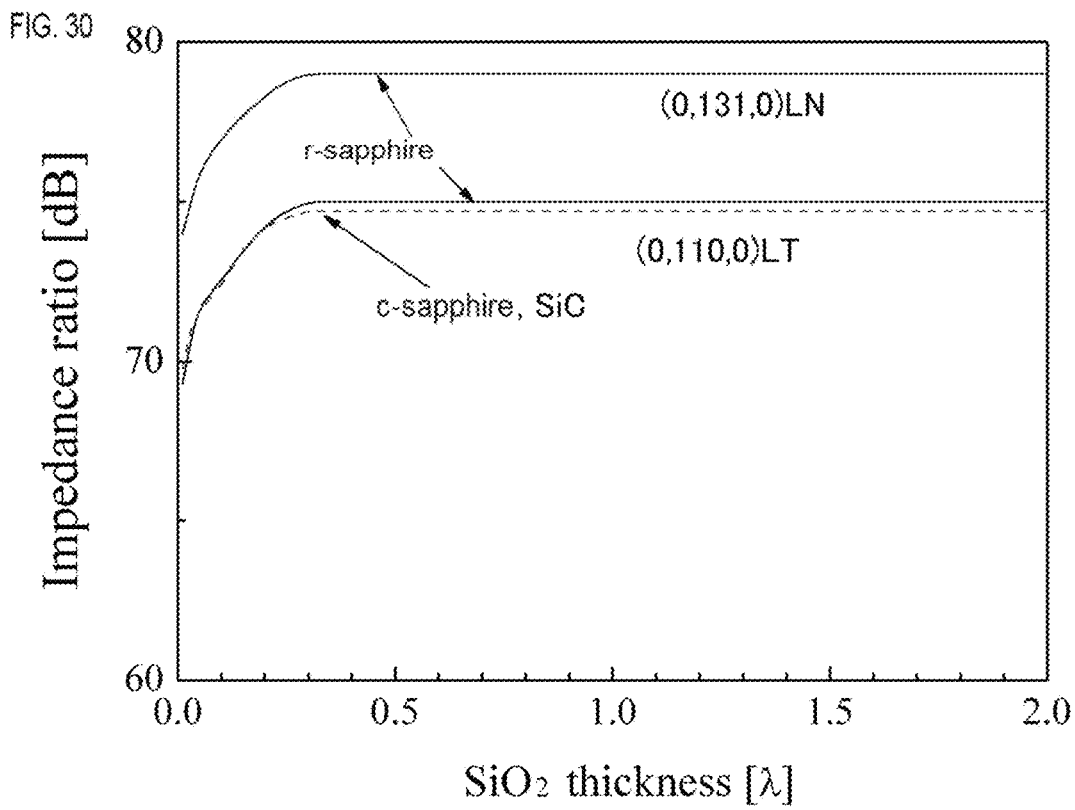

FIG. 31(a)  (0°, 110°, 0°)LT／(0°, 132.75°, 90°)quartz
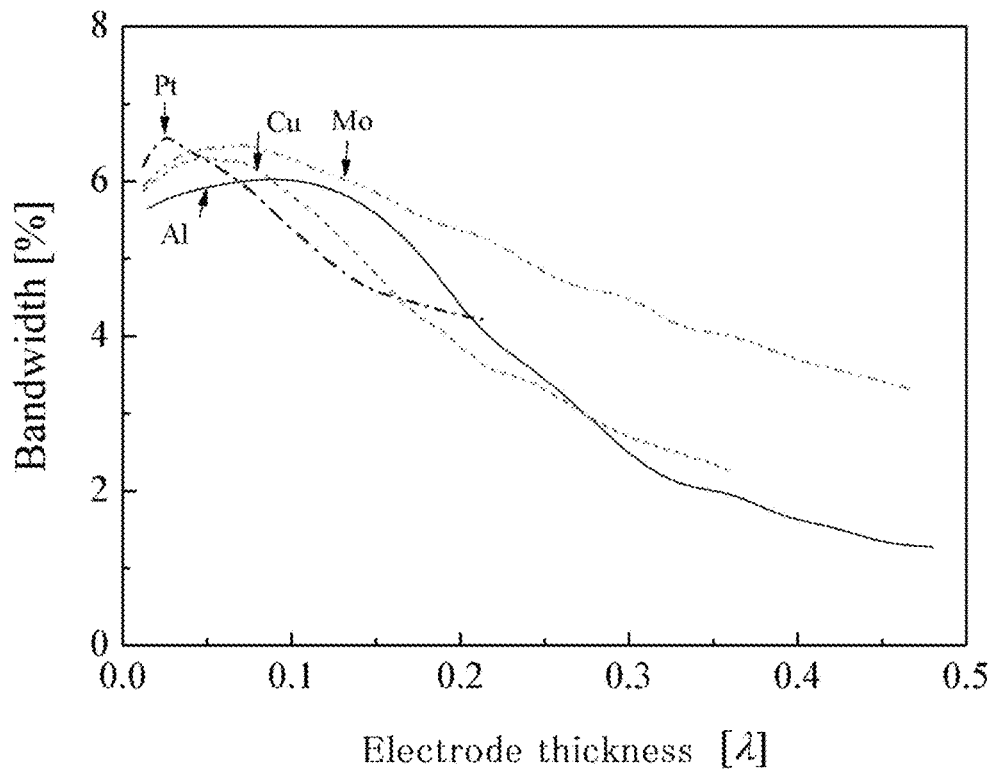
FIG. 31(b)  (0°, 110°, 0°)LT／(0°, 132.75°, 90°)quartz
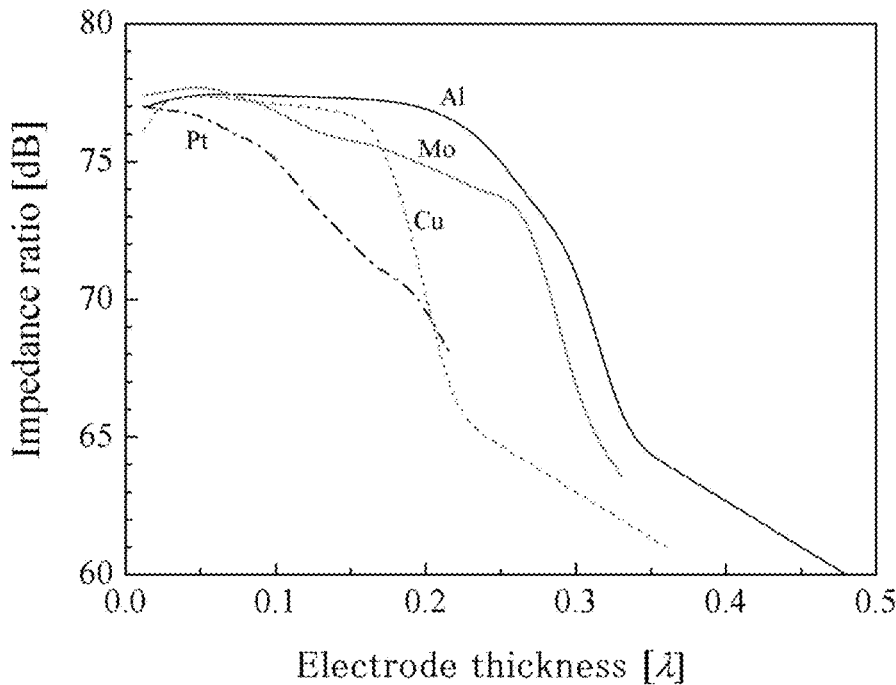

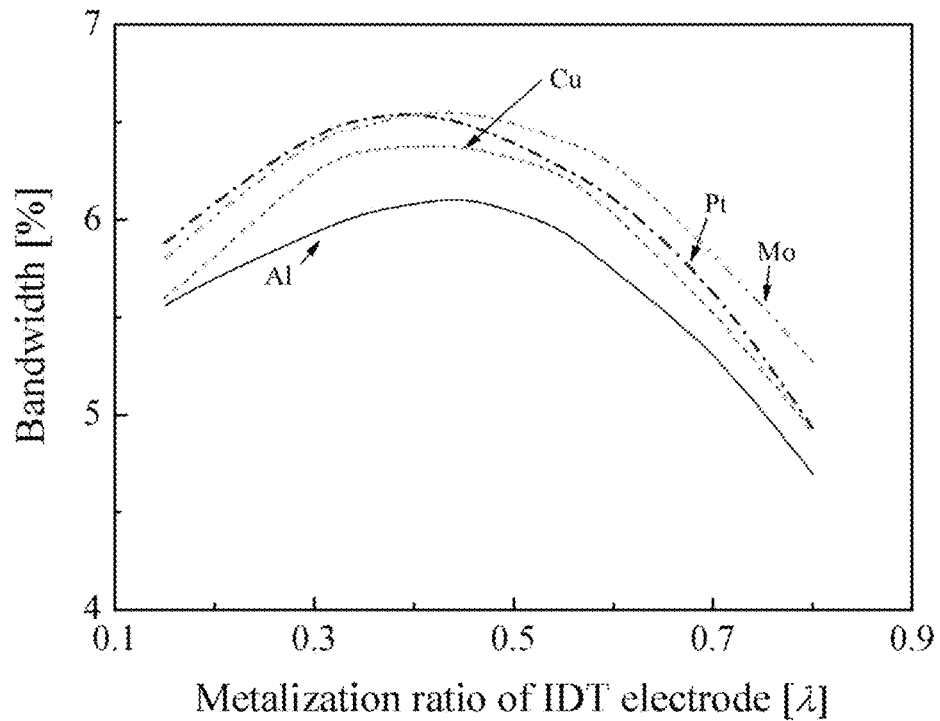
FIG. 32(a) (0°, 110°, 0°)LT/(0°, 132.75°, 90°)quartz
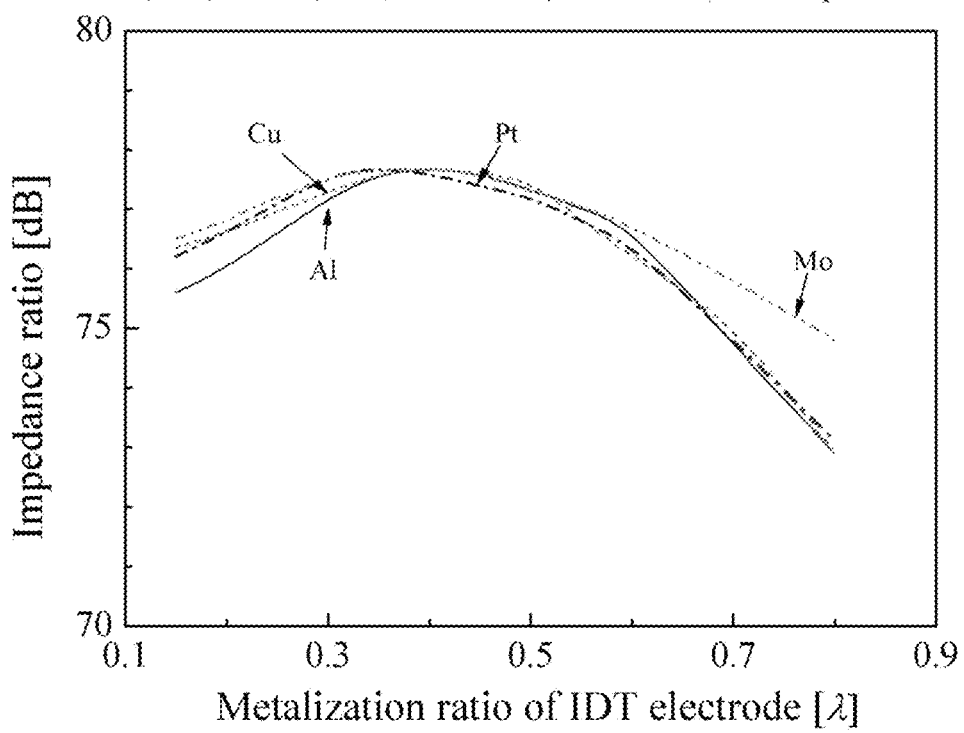
FIG. 32(b) (0°, 110°, 0°)LT/(0°, 132.75°, 90°)quartz

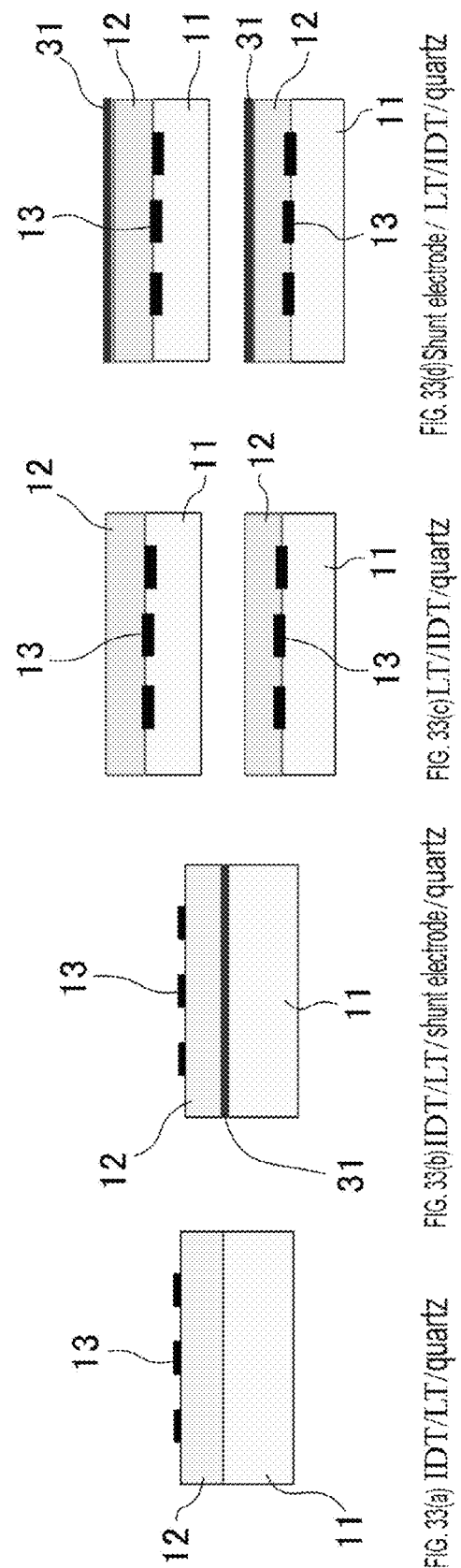

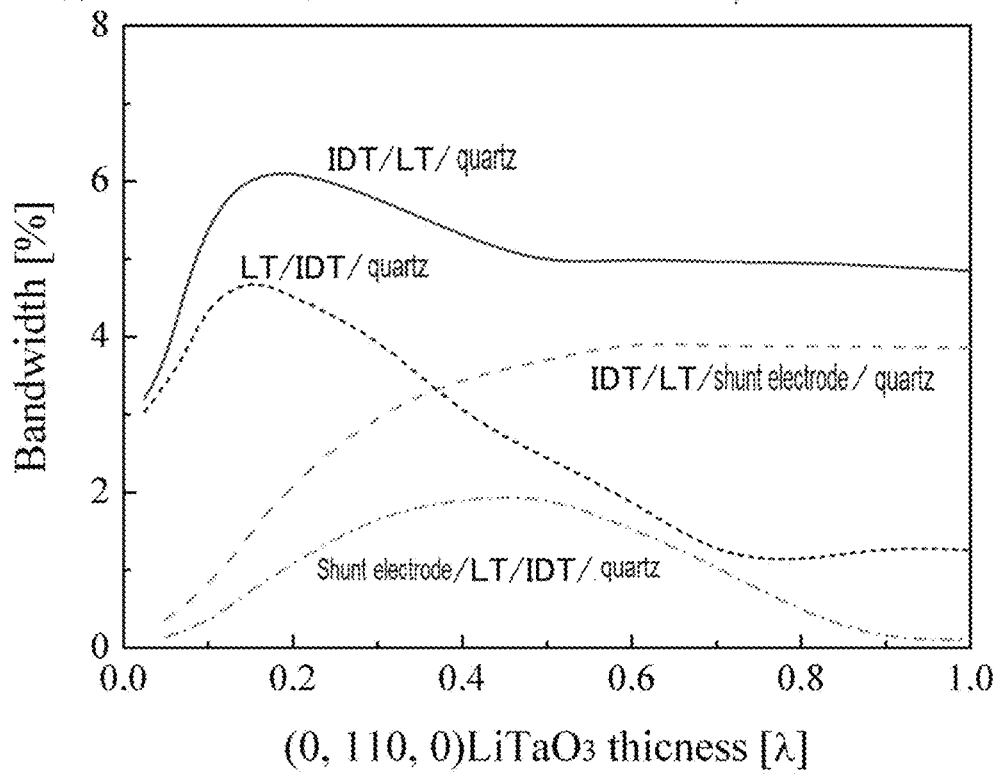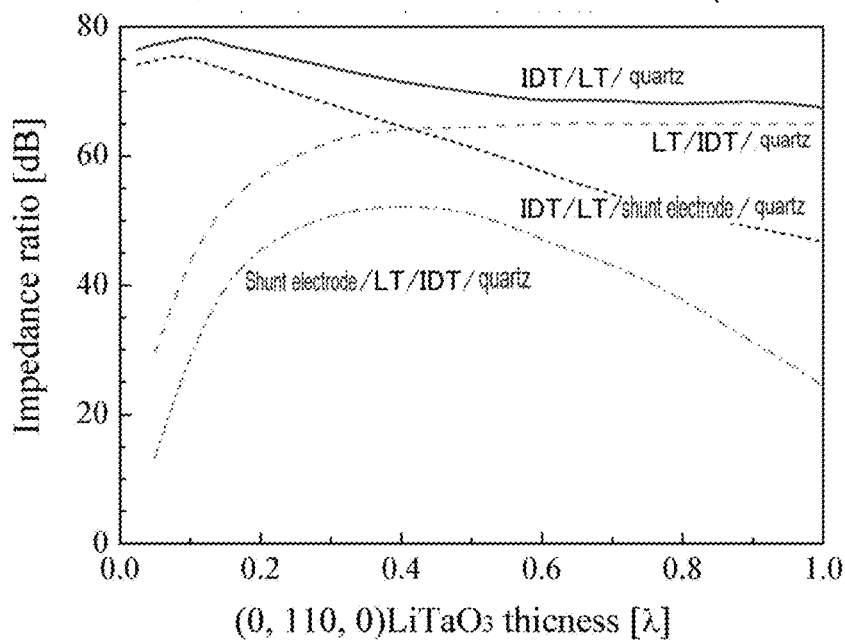

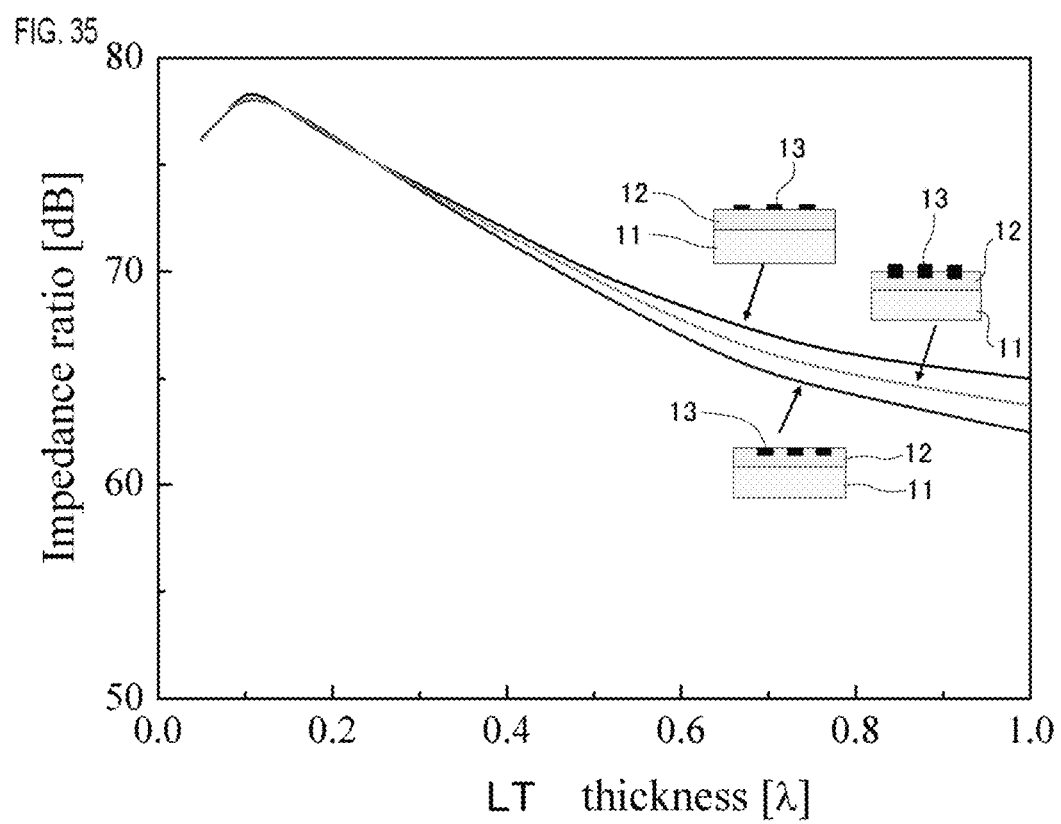

FIG. 36(a) (0°, 110°, 0°) LT/boundary film/(0°, 132.75°, 90°) quartz
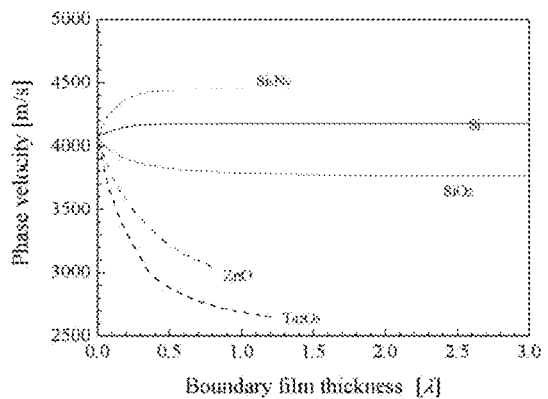
FIG. 36(b) (0°, 110°, 0°) LT/boundary film/(0°, 132.75°, 90°) quartz
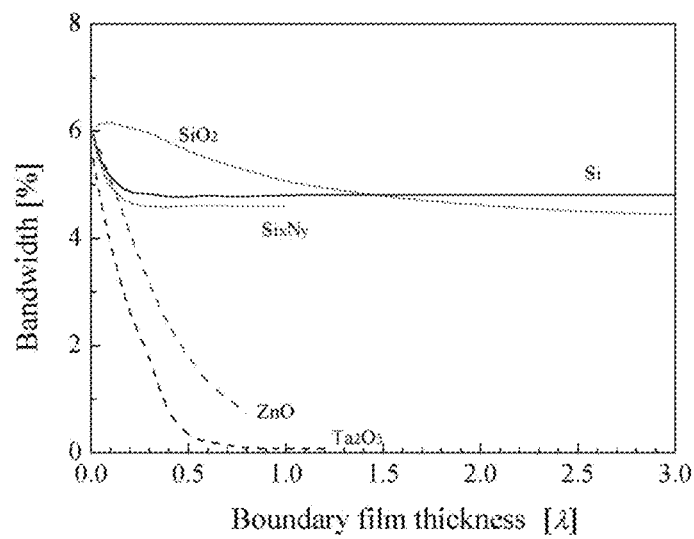
FIG. 36(c) (0°, 110°, 0°) LT/boundary film/(0°, 132.75°, 90°) quartz
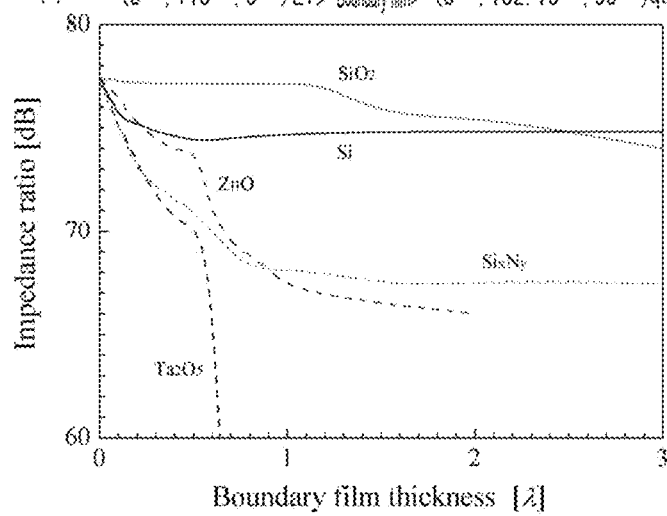

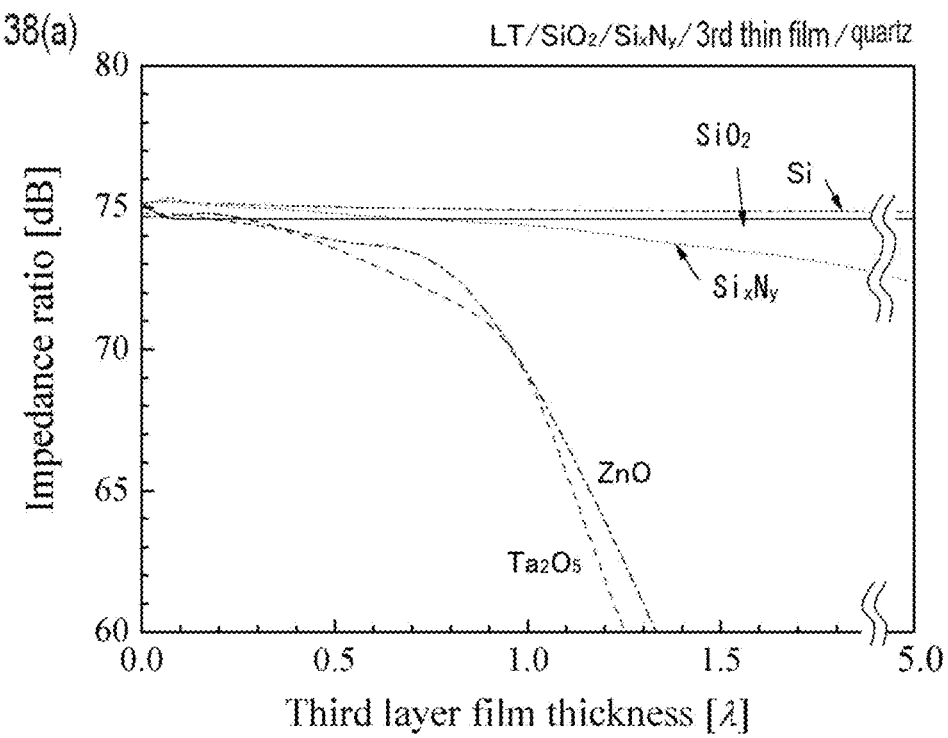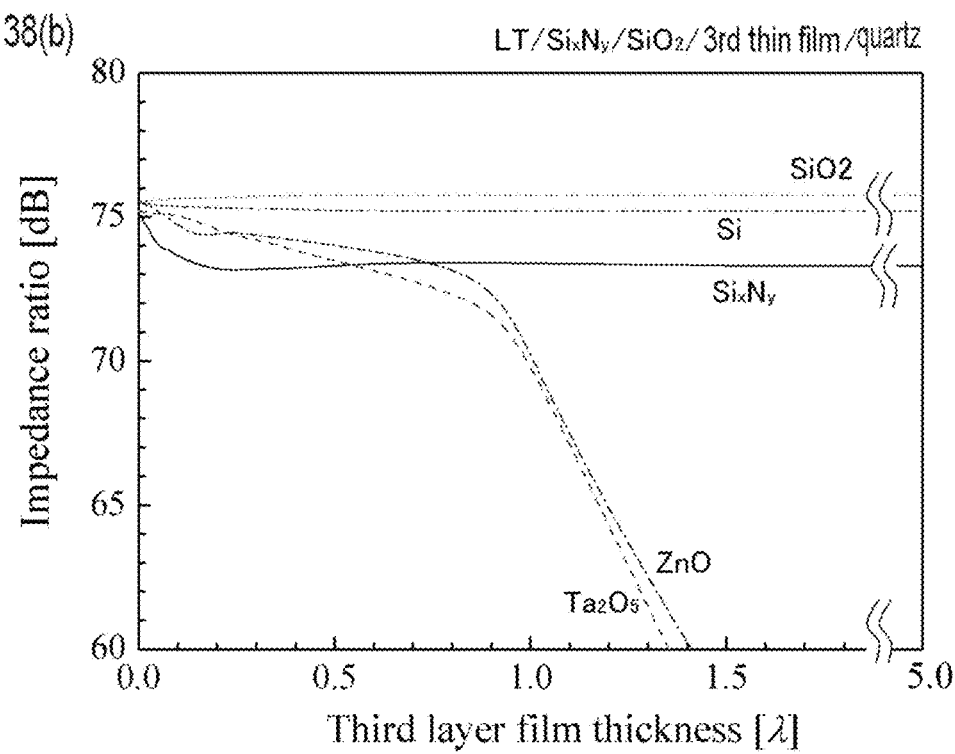

ACOUSTIC WAVE DEVICES

TECHNICAL FIELD

The present invention relates to an acoustic wave device.

BACKGROUND ART

In recent years, mobile phones and smartphones have become popular and as many bands as almost fifty have congested at 2.4 GHz or lower such that adjacent bands are very narrowly distanced. Accordingly, there is an intense need for filters and duplexers having steep frequency characteristics and better temperature characteristics in order for the adjacent band not to interfere with each other. Further, there is a need for resonators having greater impedance ratios and higher Qs to realize such filters and duplexers having steep frequency characteristics. Here, Q, which is a parameter indicating the steepness of a filter, is not only effective on the steepness but also on the insertion loss of the filter. The higher the Q becomes, the less the insertion loss may become and the battery consumption for mobile phones and smartphones may be reduced. Therefore, such filters are required to have better insertion loss, better temperature characteristics and greater steepness, and the resonators thereof are required to have higher Qs and greater impedance ratios. It is to be appreciated that the values of Qs are proportional to the impedance ratios and are inversely proportional to the bandwidths such that, in a case where the bandwidths are substantially the same, the Q and the impedance ratio are in an proportional relationship.

The bandwidth of a surface acoustic wave (SAW) filter depends on the electromechanical coupling coefficient (coupling factor) of a piezoelectric substrate used in the SAW filter. Accordingly, greater number of piezoelectric substrates, each of which is formed of an LT (LiTaO$_3$ crystal) or an LN (LiNbO$_3$ crystal) having a coupling factor required for the bandwidth of the filter, have been conventionally used. However, these substrates may have thermal coefficient of frequencies (TCFs) ranging from −40 ppm/° C. to −120 ppm/° C., which may not be regarded as favorable. It is to be appreciated that a theoretical formula for a thermal coefficient of frequency (TCF) can be defined as follows:

$$TCF = \frac{(V(35°\ C.)V(15°\ C.))}{20 \times (V(25°\ C.))} - \alpha \qquad [\text{Math. 1}]$$

where α=linear expansion coefficient
and V(T) is an excitation phase velocity. Further, an actual measurement may indicate TCF=(f(45° C.)−f(25° C.))/(20× f(25° C.)), where f(T) is a measured frequency, and a resonant frequency and/or anti-resonant frequency can be measured for a resonator whereas a center frequency can be measured for a filter. It is to be appreciated that, if a frequency is actually measured but does not linearly changed, then a maximum frequency variation within the measured temperature range can be divided by the measured temperature range to obtain a frequency variation per degree.

Thus, in order to obtain a required coupling factor and a better TCF, the present inventors and the like have developed a surface acoustic filter that is manufactured by firstly combining an LT/LN substrate having a negatives TCF with an SiO$_2$ thin film having a positive TCF to form a SiO$_2$ thin film/high-density electrode/LT or LN substrate structure and then removing protrusions on the SiO$_2$ thin film originated from the electrode to planarize the surface (for example, see Non-Patent Literature 1). This structure may result in a TCF of −10 ppm/° C., which is relatively better, and further a characteristic such as an impedance ratio and a Q that is the same as that of a single LT/LN substrate. The impedance ratio and the Q of this resonator may be around 60 dB and 800 respectively.

It is to be appreciated that a quartz substrate has a better thermal coefficient of frequency; however, its coupling factor, which indicates piezoelectric nature, can be smaller and would not satisfy the bandwidth requirement of the filter necessary to a smartphone or mobile phone. Further, according to a filter using a bulk wave of an MN (aluminum nitride) film, the Q of the resonator can be 2000, which may be steeper in the filter characteristic as compared with a SAW filter, whereas the thermal coefficient of frequency can be −30 ppm/° C., which may not be so favorable.

CITATION LIST

Non-Patent Literature

Non-Patent Literature 1: Michio Kadota, Takeshi Nakao, Kenji Nishiyama, Norio Taniguchi and Toshiyuki Fuyutsume, "Small Surface Acoustic Wave Duplexer Having Good Temperature Characteristics," Institute of Electronics, Information and Communication Engineers (IEICE) TRANSACTIONS A, 2013, Vol. J96-A, No. 6, pp. 301-308

SUMMARY OF INVENTION

Technical Problem

The acoustic wave filter as described in Non-Patent Literature 1 may result in a relatively better TCF; however, there have been problems that the amounts of the Q and impedance ratio of its resonator are similar to those of a single LT or LN substrate and the steepness of the frequency characteristic has been far from being sufficient because the SiO$_2$ thin film is a columnar structure polycrystalline film.

The present invention is made in view of such problems, and has an object to provide an acoustic wave device that has a better TCF and can improve the Q and impedance ratio of its resonator.

Solution to Problem

To achieve the object as described above, an acoustic wave device according to the present invention may be an acoustic wave device using a surface acoustic wave, the acoustic wave device including a substrate containing 70 mass % or greater of silicon dioxide (SiO$_2$), a piezoelectric thin film formed of LiTaO$_3$ or LiNbO$_3$ crystal and disposed on the substrate, and an interdigital transducer electrode disposed in contact with the piezoelectric thin film, in which the piezoelectric thin film may include a piezoelectric thin plate.

In an acoustic wave device according to the present invention, the substrate may preferably have a sheer wave phase velocity of a bulk wave ranging from 3,400 m/s to 4,800 m/s, which is close to the sheer wave velocity of LT or LN. Most of such substrates are isotropic and is not anisotropic in x-, y- and z-axes, whereas a quartz substrate that is a piezoelectric single crystal may be anisotropic and may have a different property. For this reason, when such a quartz substrate is used, it is preferable to configure the quartz substrate to have the phase velocity of the surface acoustic wave propagating along the quartz substrate greater than the phase velocity of the surface acoustic wave propagating along the piezoelectric thin film. Further, the difference between the phase velocities may preferably be 300 m/s or greater, and more preferably be 600 m/s or greater. Further, in an acoustic wave device according to the present invention, the surface acoustic wave may preferably be a leaky surface acoustic wave (LSAW). Still further, an SH (shear horizontal) component of the LSAW may preferably be 50% or greater, and more preferably be 65% or greater. Further, the surface acoustic wave may be an S wave having phase velocity of 4,500 m/s or greater. It is to be appreciated that whether the surface acoustic wave in use is a leaky surface acoustic wave or not can be theoretically determined by the Euler angles of the substrate.

A substrate containing 70 mass % or greater of silicon dioxide ($SiO_2$) may result in a positive TCF for a surface acoustic wave (SAW). Thus, in an acoustic wave device according to the present invention, disposing a piezoelectric thin film formed of $LiTaO_3$ (LT) or $LiNbO_3$ (LN) crystal having a negative TCF on a substrate having a positive TCF may allow for a better TCF close to zero ppm/° C. Further, configuring the piezoelectric thin film formed of LT or LN to have Euler angles to excite a leaky surface acoustic wave (LSAW) whereas configuring the substrate to have Euler angles for a phase velocity similar to or greater than the phase velocity enabled for the LSAW of LT or LN may allow an LSAW mode having no leaky component in the piezoelectric thin film to be used. Accordingly, an impedance ratio greater by 15 to 20 dB for example than the characteristic of an LT or LN single substrate can be obtained. Further, this impedance ratio may correspond to 6 times to 10 times in Q under the same bandwidths and thus may result in excellent steepness and insertion loss characteristics. Further, the coupling factor can be configured to be greater than that of the piezoelectric thin film itself, although the difference may be small.

The acoustic wave device according to the present invention may include a grounded shunt electrode and/or an insulating bonding film between the substrate and the piezoelectric thin film. In this case, the device may have a structure such as: an interdigital transducer electrode/piezoelectric thin film/substrate structure; an interdigital transducer electrode/piezoelectric thin film/bonding film/substrate structure; an interdigital transducer electrode/piezoelectric thin film/shunt electrode/substrate structure; an interdigital transducer electrode/piezoelectric thin film/shunt electrode/bonding film/substrate structure; or an interdigital transducer electrode/piezoelectric thin film/bonding film/shunt electrode/substrate structure. In this case, the device may achieve a better TCF and a higher Q and impedance ratio without losing its superior characteristics, even if including a shunt electrode or a bonding film. Especially when having a shunt electrode, the coupling factor can be increased and the propagation loss of the leaky surface acoustic wave can be reduced. It is to be appreciated that the bonding film may preferably have no sound absorption and be formed of a hard material. For example, the bonding film may be formed from an Si film or $SiO_2$ film.

In the acoustic wave device according to the present invention, the interdigital transducer electrode may be configured to have at least a lower portion embedded into the piezoelectric thin film and/or may be configured to have at least an upper portion protruding from the piezoelectric thin film. In this case, the device may have superior characteristics and achieve a higher impedance ratio even in any structure. Especially in a structure in which the entire portion or the lower portion of the interdigital transducer electrode is embedded in the piezoelectric thin film, the phase velocity may become faster and thus advantageous for higher frequencies. It is to be appreciated that, in this case, there may be an electrical shunt between the piezoelectric thin film and the substrate.

In an acoustic wave device according to the present invention, the substrate may preferably contain 80 mass % or greater of silicon dioxide ($SiO_2$), and more preferably of 99 mass % or greater and less than 100 mass %. The substrate may more preferably be a fused quartz containing 100 mass % of $SiO_2$ and far more preferably be formed of quartz substrate that is a piezoelectric single crystal. Further, the substrate may allow the propagating surface acoustic wave to have a phase velocity ranging from 3,400 m/s to 4,800 m/s. Further, the substrate may be formed of an isotropic substrate other than a quartz substrate, and the piezoelectric thin film may have a thickness of 0.001 mm or greater and less than 0.01 mm. Further, the substrate may be formed of a quartz substrate and allow the propagating surface acoustic wave to have a phase velocity of 4,500 m/s or greater, 4,800 m/s or greater, or 5,000 m/s or greater. Any one of these configurations may provide excellent characteristics and result in a better TCF, a higher Q, and an impedance ratio. It is to be appreciated that, since a quartz substrate have a positive TCF greater than that of an isotropic substrate, any thickness can be accepted in the piezoelectric thin film.

There is no dependence on a propagation direction of an acoustic wave in an isotropic substrate except for a quartz substrate, whereas, in a substrate using quartz that is anisotropic, the characteristics of the quartz substrate may vary depending on the orientation angle or propagation direction (Euler angles) and therefore it is important to choose appropriate Euler angles. Firstly, for an acoustic wave according to the present invention, it may be desirable to choose Euler angles such that the power flow angle (PFA) can be zero. This is because, if the Euler angles are greatly shifted from zero, an acoustic wave may propagate in a direction oblique with respect to an interdigital transducer electrode. Example Euler angles that allow the PFA to indicate approximately zero may include (0°±5°, 0°-180°, 40°±12°), (10°±5°, 0°-180°, 42°±8°), (20°±5°, 0°-180°, 50°±8°), (0°±5°, 0°-180°, 0°±5°), (10°±5°, 0°-180°, 0°±5°), (20°±5°, 0°-180°, 0°±5°), (0°±5°, 0°-180°, 90°±5°), (10°±5°, 0°-180°, 90°±5°), (20°±5°, 0°-180°, 90°±5°), and orientation angles equivalent thereto.

Further, in an acoustic wave device according to the present invention, the substrate may have Euler angles such as (0°±5°, 0°-125°, 0°±5°), (0°±5°, 0°-36°, 90°±5°), (0°±5°, 172°-180°, 90°±5°), (0°±5°, 120°-140°, 30°-49°), (0°±5°, 25°-105°, 0°±5°), (0°±5°, 0°-45°, 15°-35°), (0°±5°, 10°-20°, 60°-70°), (0°±5°, 90°-180°, 30°-45°), (0°±5°, 0°±5°, 85°-95°), (90°±5°, 90°±5°, 25°-31°), and (0°±5°, 90°±5°, −3° to 3°). Still further, the substrate may have Euler angles such as (20°±5°, 120°±10°, 115°±10°), (0°±5°, 90°±5°, 0°±10°), (0°±5°, 90°±5°, 75°±10°), (0°±5°, 0°±5°, 0°±10°), and (0°±5°, 0°±5°, 60°±10°). These cases may provide a better TCF.

Further, the following phase velocities, Euler angles, and film thicknesses may be preferable to obtain characteristics of higher Qs and impedance ratios. In an acoustic wave device according to the present invention, the substrate may have the acoustic wave propagating at a phase velocity of 4,500 m/s or greater and may have Euler angles of (0°±5°, 70°-165°, 0°±5°) or (0°±5°, 95°-155°, 90°±5°). Preferably, the substrate may have the acoustic wave propagating in a phase velocity of 4,800 m/s or greater and may have Euler angles of (0°±5°, 90°-150°, 0°±5°) or (0°±5°, 103°-140°, 90°±5°), and further may have the acoustic wave propagating in a phase velocity of 5,000 m/s or greater and may have Euler angles of (0°±5°, 100°-140°, 0°±5°) or (0°±5°, 110°-135°, 90°±5°).

Further, in an acoustic wave device according to the present invention, the substrate may have Euler angles of (0°±5°, 0°-132°, 0°±5°), (0°±5°, 0°-18°, 0°±5°), (0°±5°, 42°-65°, 0°±5°) or (0°±5°, 126°-180°, 0°±5°), which may provide a positive TCF for a Rayleigh wave or LSAW, and the piezoelectric thin film may be formed of $LiTaO_2$ crystal and have Euler angles of (0°±5°, 82°-148°, 0°±5°). In this case, the substrate may preferably have Euler angles of (0°±5°, 0°-12°, 0°±5°), (0°±5°, 44°-63°, 0°±5=), or (0°±5°, 135°-180°, 0°±5°). Further, the piezoelectric thin film may preferably have Euler angles of (0°±5°, 90°-140°, 0±5°). This combination may result in a particularly good TCF.

Further, in an acoustic wave device according to the present invention, the substrate may have Euler angles of (0°±5°, 0°-42°, 90°±5°), (0°±5°, 170°-190°, 90°±5°), (0°±5°, 0°-45°, 90°±5°), or (0°±5°, 123°-180°, 90°±5°), which may provide a positive TCF for a Rayleigh or an LSAW, and the piezoelectric thin film may be formed of $LiTaO_3$ crystal and may have Euler angles of (0°±5°, 80°-148°, 0°±5°). In this case, the substrate may preferably have Euler angles of (0°±5°, 0°-34°, 90°±5°), or (0°±5°, 126°-180°, 90°±5°). Further, the piezoelectric thin film may preferably have Euler angles of (0°±5°, 90°-140°, 0°±5°), more preferably of (0°±5°, 95°-143°, 0°±5°), and further more preferably of (0°±5°, 103°-125°, 0°±5°).

Further, in an acoustic wave device according to the present invention, the substrate may have Euler angles with a high phase velocity LSAW of (1°-39°, 100°-150°, 0°-20° or 70°-120° or 160°-180°), and the piezoelectric thin film may be formed of $LiTaO_3$ crystal and have Euler angles of (0°±5°, 80°-148°, 0°±5°). Still further, the substrate may have Euler angles with a high phase velocity fast shear of around 5,000 m/s of (20°±5°, 120°±10°, 115°±10°), (0°±5°, 90°±5°, 0°±10°), (0°±5°, 90°, 75°±10°), (0°±5°, 0°, 0°±10°), or (0°±5°, 0°, 60°±10°).

Further, in an acoustic wave device according to the present invention, the substrate may have Euler angles of (0°±5°, 0°-23°, 0°±5°), (0°±5°, 32°-69°, 0°±5°), (0°±5°, 118°-180°, 0°±5°), (0°±5°, 0°-62°, 90°±5°), (0°±5°, 118°-180°, 90°±5°), (0°±5°, 0°-72°, 30°-60°), or (0°±5°, 117°-180°, 30°-60°), and the piezoelectric thin film may be formed of $LiTaO_3$ crystal and have Euler angles of (0°±5°, 80°-148°, 0°±5°). In this case, the Euler angles of the substrate may preferably be (0°±5°, 0°-12°, 0°±5°), (0°±5°, 37°-66°, 0°±5°), (0°±5°, 132°-180°, 0°±5°), (0°±5°, 0°-50°, 90°±5°), (0°±5°, 126°-180°, 90°±5°), (0°±5°, 0°-17°, 30°-60°), (0°±5°, 35°-67°, 30°-60°), or (0°±5°, 123°-180°, 30°-60°).

Further, in an acoustic wave device according to the present invention, the piezoelectric thin film may be formed of $LiTaO_3$ crystal and have Euler angles of (90°±5°, 90°±5°, 33°-55°) or (90°±5°, 90°±5°, 125°-155°). Further, the piezoelectric thin film may be formed of $LiNbO_3$ crystal and have Euler angles of (90°±5°, 90°±5°, 38°-65°) or (90°±5°, 90°±5°, 118°-140°).

Further, in an acoustic wave device according to the present invention, the piezoelectric thin film may be formed of a $LiTaO_3$ crystal and have a thickness between 0.001 times and 2 times the wave length of the acoustic wave. In this case, the thickness of the piezoelectric thin film may preferably be between 0.01 times and 0.6 times the wave length of the acoustic wave, more preferably be between 0.02 times and 0.6 times thereof, far more preferably be between 0.03 times and 0.4 times thereof, or still far more preferably be between 0.03 times to 0.3 times thereof.

Further, in an acoustic wave device according to the present invention, the substrate may have Euler angles of (0°±5°, 0°-132°, 0°±5°), (0°±5°, 0°-18°, 0°±5°), (0°±5°, 42°-65°, 0°±5°), or (0°±5°, 126°-180°, 0°±5°), which may provide a positive TCF for a Rayleigh wave or LSAW, and the piezoelectric thin film may be formed of $LiNbO_3$ crystal and have Euler angles of (0°±5°, 75°-165°, 0°±5°), and preferably have Euler angles of (0°±5°, 100°-160°, 0°±5°). In this case, the substrate may preferably have Euler angles of (0°±5°, 0°-12°, 0°±5°), (0°±5°, 44°-63°, 0°±5°), or (0°±5°, 135°-180°, 0°±5°). Further, in this case, the piezoelectric thin film may preferably have a thickness between 0.001 times and 2 times the wavelength of the surface acoustic wave, more preferably between 0.01 times and 0.6 times, far more preferably between 0.012 times and 0.6 times, still far more preferably between 0.02 times and 0.5 times, or yet still far more preferably between 0.03 times and 0.33 times.

Further, in an acoustic wave device according to the present invention, the substrate may have Euler angles of (0°±5°, 0°-42°, 90°±5°), (0°±5°, 90°-155°, 90°±5°), (0°±5°, 0°-45°, 90°±5°), or (0°±5°, 123°-180°, 90°±5°), which may provide a positive TCF for a Rayleigh wave or an LSAW, and the piezoelectric thin film may be formed of $LiNbO_3$ crystal and may have Euler angles of (0°±5°, 70°-170°, 0°±5°). In this case, the substrate may preferably have Euler angles of (0°±5°, 0°-34°, 90°±5°) or (0°±°, 126°-180°, 90°±5°). Further, in this case, the piezoelectric thin film may preferably have a thickness between 0.001 times and 2 times the wavelength of the surface acoustic wave, more preferably between 0.01 and 0.5 times, far more preferably between 0.02 and 0.33 times, still far more preferably between 0.06 times and 0.3 times.

Further, in an acoustic wave device according to the present invention, the substrate may have Euler angles of (1°-39°, 100°-150°, 0°-20° or 70°-120° or 160°-180°), and the piezoelectric thin film may be formed of $LiNbO_3$ crystal and have Euler angles of (0°±5°, 95°-160°, 0°±5°). Further, in an acoustic wave device according to the present invention, the substrate may have Euler angles of (1°-39°, 70°-150°, 0°-20° or 70°-120° or 160°-180°), and the piezoelectric thin film may be formed of $LiNbO_3$ crystal and have Euler angles of (0°±5°, 25°-51°, 0°±5°).

Further, in an acoustic wave device according to the present invention, the substrate may have Euler angles of (0°±5°, 90°-178°, 0°±5°) or (0°±5°, 80°-160°, 90°±5°), and the piezoelectric thin film may be formed of $LiNbO_3$ crystal and have Euler angles for exciting a Rayleigh wave of (0°±5°, 35°-70°, 0°±5°), preferably (0°±5°, 45°-63°, 0°±5°), or more preferably (0°±5°, 48°-60°, 0°±5°). Further, in this case, the substrate providing a positive TCF for an LSAW and a Rayleigh wave may preferably have Euler angles of (0°±5°, 90°-178°, 0°±5°) or (0°±5°, 125°-160°, 90°±5°).

Further, in an acoustic wave device according to the present invention, the substrate may have Euler angles of (0°±5°, 0°-16°, 0°±5°), (0°±5°, 42°-64°, 0°±5°), (0°±5°, 138°-180°, 0°±5°), (0°±5°, 0°-30°, 90°±5°), (0°±5°, 130°-180°, 90°±5°), (0°±5°, 0°-28°, 30°-60°), (0°±5°, 42°-70°, 30°-60°), or (0°±5°, 132°-180°, 30°-60°), and the piezoelectric thin film may be formed of $LiNbO_3$ crystal and have Euler angles of (0°±5°, 75°-165°, 0°±5°), or more preferably (0°±5°, 90°-160°, 0°±5°). In this case, the Euler angles of the substrate may more preferably be (0°±5°, 43°-61°, 0°±5°), (0°±5°, 147°-180°, 0°±5°), (0°±5°, 0°-15°, 90°±5°), (0°±5°, 134°-180°, 90°±5°), (0°±5°, 0°-23°, 30°-60°), (0°±5°, 43°-67°, 30°-60°), or (0°±5°, 137°-180°, 30°-60°).

Further, in an acoustic wave device according to the present invention, the substrate may have Euler angles of (0°±5°, 32°-118°, 0°±5°), (0°±5°, 0°-30°, 90°±5°), (0°±5°, 173°-180°, 90°±5°), or (0°±5°, 0°-142°, 30°-60°), and the piezoelectric thin film may be formed of $LiNbO_3$ crystal and have Euler angles of (0°±5°, 35°-70°, 0°±5°) or preferably (0°±5°, 45°-63°, 0°±5°). In this case, the Euler angles of the substrate may preferably be (0°±5°, 40°-102°, 0°±5°), (0°±5°, 0°-17°, 90°±5°), (0°±5°, 175°-180°, 90°±5°) or (0°±5°, 13°-130°, 30°-60°).

Further, in an acoustic wave device according to the present invention, a surface acoustic wave to be used may be either in a basic or 0-th mode or a higher order mode. In a case where a higher order mode is used, a piezoelectric thin film may preferably have a thickness between 0.35 times and 9.3 times the wavelength of a surface acoustic wave. Further, in a case where a shunt electrode is provided between a substrate and a piezoelectric thin film, the piezoelectric thin film may have a thickness between 0.5 times and 9 times the wavelength of a surface acoustic wave. In these cases, a higher impedance ratio can be obtained.

Here, Euler angles ($\varphi$, $\theta$, $\psi$) are in right-handed system, and represent a cut surface of the substrate or the piezoelectric thin film and a propagation direction of the surface acoustic wave. In other words, for crystal axes X, Y and Z of crystal or LT or LN forming the substrate, an X'-axis can be obtained by $\varphi$-rotating the X-axis in counterclockwise about the Z-axis as a rotation axis. Next, a Z'-axis can be obtained by $\theta$-rotating the Z-axis in counterclockwise about the X'-axis as a rotation angle. Then, the Z'-axis is defined as a normal line and a plane including the X'-axis is defined as a cut surface of the substrate or the piezoelectric thin film. Further, a direction obtained by $\psi$-rotating the X'-axis in counterclockwise about the Z'-axis as a rotation axis is defined as a propagation direction of a surface acoustic wave. Further, these rotations result in the movement of the Y-axis and provide an axis defined as a Y'-axis perpendicular to the X'-axis and the Z'-axis.

According to these definitions of the Euler angles, a 40°-rotation-Y-plate-X-direction propagation can be expressed as Euler angles of (0°, 130°, 0°) and a 40°-rotation-Y-plate-90°-X-direction propagation can be expressed as Euler angles of (0°, 130°, 90°), for example.

It is to be appreciated that, in an acoustic wave device according to the present invention, the substrate and the piezoelectric thin film may not only have the Euler angles described above but also have crystallographically equivalent Euler angles. Even in this case, a better TCF and a characteristic of higher Q and impedance ratio can be obtained. Further, when the substrate or the piezoelectric thin film is cut out at desired Euler angles, an error of approximately ±0.5° at a maximum may be included for each component of the Euler angles. The shape of an IDT may include an error of approximately ±3° for the propagation direction $\psi$. The characteristics of the acoustic wave include substantially no characteristic difference caused by approximately ±5° shift for $\varphi$ and $\psi$ components of Euler angles ($\varphi$, $\theta$, $\psi$).

Advantageous Effects of Invention

According to the present invention, it may be possible to provide an acoustic wave device that has a better TCF and enables a resonator to have a Q and impedance ratio.

BRIEF DESCRIPTION OF DRAWINGS

Unless otherwise stated, an Al-IDT may refer to an interdigital transducer electrode including an aluminum electrode having a thickness of 0.08 wavelength. In the figures:

FIGS. 1(a), 1(b) and 1(c) are perspective views illustrating a conventional acoustic wave device having Al-IDT/piezoelectric substrate, an acoustic wave device according to an embodiment of the present invention, and an alternative example having a bonding film of the acoustic wave device of the present invention, respectively;

FIGS. 2(a) and 2(b) are graphs illustrating frequency characteristics of impedance (Z) of Al-IDT/(0°, 110°, 0°) LT substrate of a conventional acoustic wave resonator, and Al-IDT/(0°, 132°, 0°) LT substrate of a conventional acoustic wave resonator, respectively. In the graphs, frequencies for minimum Z and maximum Z are referred to as a resonance frequency (fr) and an anti-resonance respectively (fa) respectively, and the corresponding Zs are referred to as Zr and Za respectively. The bandwidth is expressed as (fa−fr)/fr and the impedance ratio is expressed as 20×Log (Za/Zr);

FIGS. 3(a) and 3(b) are graphs illustrating frequency characteristics of impedance (Z) of an acoustic wave resonator having a structure of Al-IDT/(0°, 110°, 0°) LT thin film (thickness of 0.15 wavelength)/(0°, 130°, 90°) quartz substrate, and an acoustic wave resonator having a structure of Al-IDT/(0°, 120°, 0°) LT thin film (thickness of 0.15 wavelength)/(0°, 130°, 0°) quartz substrate, respectively;

FIGS. 4(a) and 4(b) are graphs illustrating frequency characteristics of impedance (Z) of an acoustic wave resonator having a structure of Al-IDT/(0°, 110°, 0°) LT thin film (thickness of 0.15 wavelength)/(0°, 130°, 30°) quartz substrate, and an acoustic wave resonator having a structure of Al-IDT/(0°, 110°, 0°) LT thin film (thickness of 0.15 wavelength)/(0°, 130°, 60°) quartz substrate, respectively;

FIG. 5 is a graph illustrating that Rayleigh wave and LSAW phase velocities can depend on a propagation direction $\psi$ at a (0°, 130°, $\psi$) quartz substrate;

FIGS. 6(a) and 6(b) are graphs illustrating frequency characteristics of impedance (Z) of an acoustic wave resonator having a structure of Al-IDT/(0°, 132°, 0°) LT thin film/(110) Si substrate, and an acoustic wave resonator having a structure of Al-IDT/(0°, 132°, 0°) LT thin film/c-sapphire substrate, respectively;

FIGS. 7(a), 7(b) and 7(c) are graphs illustrating that Rayleigh wave and LSAW phase velocities, Rayleigh wave and LSAW TCFs, and displacement ratios between LSAW longitudinal wave displacement component U1, SH component U2 and shear vertical (SV) component U3 on a substrate surface, respectively, can depend on $\theta$ at a (0°, $\theta$, 0°) quartz substrate;

FIGS. 8(a), 8(b) and 8(c) are graphs illustrating that Rayleigh wave and LSAW phase velocities, Rayleigh wave and LSAW TCFs, and displacement ratios between LSAW longitudinal wave displacement component U1, SH component U2 and shear vertical (SV) component U3 on a substrate surface, respectively, can depend on $\theta$ at a (0°, $\theta$, 90°) quartz substrate;

FIG. 9 is a graph illustrating that phase velocities for various φs and θs can depend on ψ at a (φ, θ, ψ) quartz substrate;

FIGS. 10(a), 10(b) and 10(c) are graphs illustrating that Rayleigh wave and LSAW phase velocities (solid line ($v_f$) and dashed line ($v_m$) in the graph correspond to phase velocities in a case where the LT substrate surface is electrically open and a case where the LT substrate is short-circuited, respectively), Rayleigh wave and LSAW electromechanical coupling coefficients (coupling factors), and an LSAW TCF, respectively, can depend on θ at (0°, θ, 0°) LT substrate;

FIGS. 14(a) and 14(b) are graphs illustrating that a bandwidth and an impedance ratio respectively of an acoustic wave resonator having a structure of Al-IDT/(0°, θ, 0°) LT thin film (0.15 wavelength thickness)/(0°, 100°-175°, 90°) quartz substrate can depend on θ (θ indicated in each graph corresponds to θ of quartz substrate);

FIG. 18 is a graph illustrating that impedance ratios of acoustic wave resonators having structures of Al-IDT/(0°, 110°, 0°) LT thin film/(20°, 120°, 115°) quartz substrate and Al-IDT/(0°, 110°, 0°) LT thin film/(0°, 130°, 0°) quartz substrate can depend on the LT film thickness;

FIGS. 20(a), 20(b) and 20(c) are graphs illustrating that Rayleigh wave and LSAW phase velocities when the surface of the (0°, θ, 0°) LN substrate is electrically open ($V_f$) and short-circuited ($V_m$), Rayleigh wave and LSAW electromechanical coupling coefficients (coupling factors), and Rayleigh wave and LSAW TCFs, respectively, can depend on θ;

FIG. 21 is a graph illustrating a frequency characteristic of impedance (Z) of an acoustic wave resonator having a structure of Al-IDT/(0°, 131°, 0°) LN thin film (0.15 wavelength thickness)/(0°, 115°, 90°) quartz substrate;

FIG. 29 is a graph illustrating that impedance ratios of acoustic wave resonators having structures of Al-IDT/(0°, 110°, 0°) LT thin film (0.15 wavelength thickness)/various substrates can depend on the LT film thickness.

FIG. 30 is a graph illustrating that impedance ratios of acoustic wave resonators having structures of Al-IDT/(0°, 110°, 0°) LT thin film/SiO$_2$ film/high-phase-velocity substrate and Al-IDT/(0°, 131°, 0°) LN thin film/SiO$_2$ film/high-phase-velocity substrate can depend on the SiO$_2$ film thickness;

FIGS. 31(a) and 31(b) are graphs illustrating that a bandwidth and an impedance ratio respectively of acoustic wave resonators having structures of various IDTs/(0°, 110°, 0°) LT thin film (0.15 wavelength thickness)/(0°, 132.75°, 90°) quartz substrates can depend on the thickness of the interdigital transducer electrodes (electrode thickness) made of various material;

FIGS. 32(a) and 32(b) are graphs illustrating that a bandwidth and an impedance ratio respectively of acoustic wave resonators having structures of various IDTs/(0°, 110°, 0°) LT thin film (0.15 wavelength thickness)/(0°, 132.75°, 90°) quartz substrates can depend on a metalization ratio of interdigital transducer electrodes made of various materials (metalization ratio=2×electrode width/wavelength);

FIGS. 33(a), 33(b), 33(c) and 33(d) are elevation views of acoustic wave devices having an IDT/piezoelectric thin film/substrate structure, an IDT/piezoelectric thin film/shunt electrode/substrate structure, a piezoelectric thin film/IDT/substrate structure (upper portion illustrates the IDT embedded in the substrate, and lower portion illustrates the IDT embedded in the piezoelectric thin film), and a shunt electrode/piezoelectric thin film/IDT/substrate structure (upper portion illustrates the IDT embedded in the substrate, and lower portion illustrates the IDT embedded in the piezoelectric thin film), respectively;

FIGS. 34(a) and 34(b) are graphs illustrating that a bandwidth and an impedance ratio respectively of an acoustic wave resonator including each structure illustrated in FIGS. 33(a) to 33(d) having a (0°, 110°, 0°) LT thin film and a (0°, 132.75°, 90°) quartz substrate can depend on the LT film thickness;

FIG. 35 is a graph illustrating that impedance ratios of acoustic wave resonators including a (0°, 110°, 0°) LT thin film and a (0°, 132.75°, 90°) quartz substrate and having a structure of all or a part of Al-IDT embedded in the LT thin film and a structure of none of Al-IDT embedded in the LT thin film can depend on the LT film thickness;

FIGS. 36(a), 36(b) and 36(c) are graphs illustrating that a phase velocity, a bandwidth and an impedance ratio respectively of an acoustic wave resonator having a structure of Al-IDT/(0°, 110°, 0°) LT thin film (0.15 wavelength thickness)/boundary film/(0°, 132.75°, 90°) quartz substrate can depend on the boundary film thickness;

FIGS. 38(a) and 38(b) are graphs illustrating that impedance ratios of acoustic wave resonators having structures of Al-IDT/(0°, 110°, 0°) LT thin film (0.15 wavelength thickness)/SiO$_2$/Si$_x$N$_y$/third layer of boundary film/(0°, 132.75°, 90°) quartz substrate, and Al-IDT/(0°, 110°, 0°) LT thin film (0.15 wavelength thickness)/Si$_x$N$_y$/SiO$_2$/third layer of boundary film/(0°, 132.75°, 90°) quartz substrate, in which the third layer of boundary film (third layer film) is made of various materials, can depend on the thickness of the third layer film;

DESCRIPTION OF EMBODIMENTS

Figure 11A:
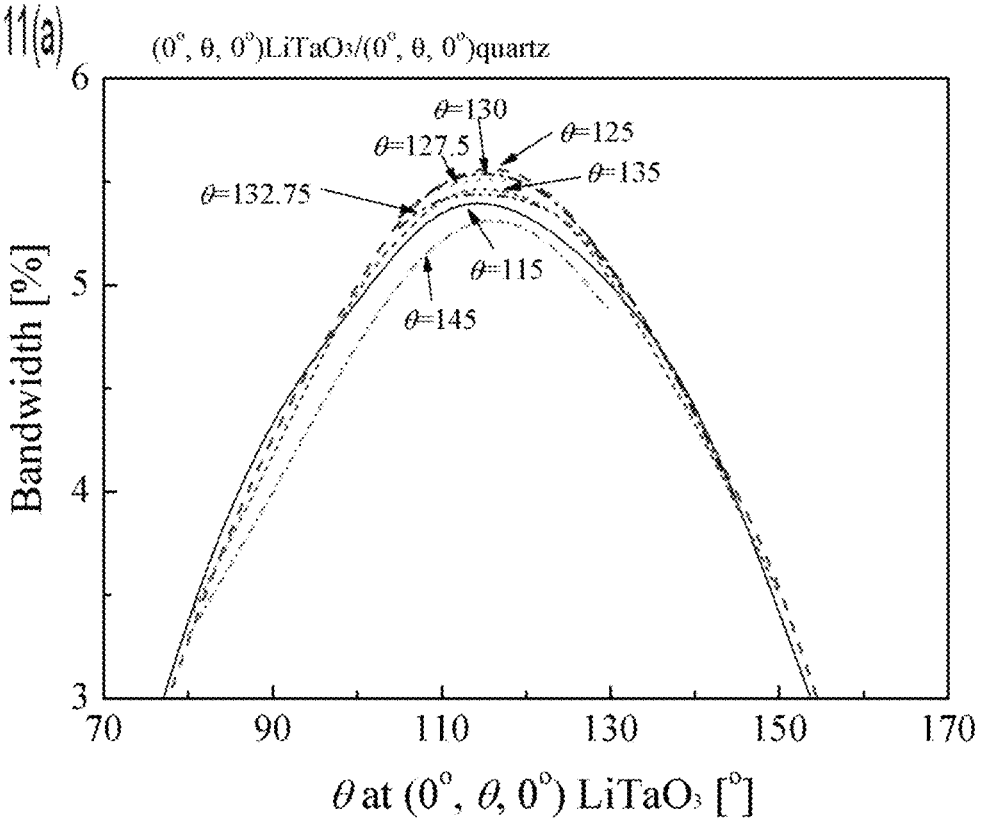
FIGS. 11(a) and 11(b) are graphs illustrating that a bandwidth and an impedance ratio respectively of an acoustic wave resonator having a structure of Al-IDT/(0°, θ, 0°) LT thin film (0.15 wavelength thickness)/(0°, 115°-145°, 0°) quartz substrate can depend on θ (θ indicated in each graph corresponds to θ of quartz substrate)

Referring to the drawings, embodiments of the present invention will be described below. FIGS. 1 to 43 illustrate acoustic wave devices according to embodiments of the present invention. As illustrated in FIG. 1(b), an acoustic wave device 10 according to an embodiment of the present invention includes a substrate 11, a piezoelectric thin film 12 disposed on the substrate 11, and an interdigital transducer (IDT) electrode 13 disposed on the piezoelectric thin film 12.

The substrate 11 contains 70 mass % or greater of $SiO_2$. The substrate 11 is formed, for example, of quartz, Pyrex (registered trademark) glass, fused quartz, borosilicate glass, synthetic quartz, quartz glass or the like. The piezoelectric thin film 12 is formed of $LiTaO_3$ crystal (LT) or $LiNbO_3$ crystal (LN). Further, in the case of an acoustic wave resonator, reflectors 14 formed of multiple electrode fingers can be disposed to sandwich the interdigital transducer electrode 13.

The interdigital transducer (IDT) electrode 13 includes a pair of electrode fingers 21, each of which includes a bus bar and a plurality of electrode fingers 21 connected to the bus bar and extending perpendicular to the length direction of the bus bar. Each IDT 13 includes the plurality of electrode fingers 21 arranged to alternate (interdigitate) with each other. Each IDT 13 has an approximately constant pitch between the electrode fingers 21. In a case where the number of the electrode fingers 21 is m, $(m-1)/2=N$ can be referred to as a pair number. When the length between the (center of) adjacent electrode fingers 21 is defined as l, $2l=\lambda$ can be one period and correspond to the wavelength of an acoustic wave excited by the acoustic wave device.

Each reflector 14 is arranged along the propagation direction of a surface acoustic wave and is spaced apart from the interdigital transducer electrode 13 to sandwich the interdigital transducer electrode 13 from both sides. Each reflector 14 includes a pair of bus bars and a plurality of electrode fingers bridged and extending between the bus bars. Each reflector 14 has approximately same pitch of respective electrode fingers as each electrode finger pitch of the interdigital transducer electrode 13 and the pitch is maintained constant.

It is to be appreciated that FIG. 1(a) illustrates a conventional acoustic wave device 50 for comparison. As illustrated in FIG. 1(a), the conventional acoustic wave 50 has a structure in which an interdigital transducer electrode (IDT) 52 is formed on a piezoelectric substrate 51 that is made of LT or LN. Further, a pair of reflectors 53 is provided to sandwich the interdigital transducer electrode 52.

It is to be appreciated that Euler angles ($\varphi$, $\theta$, $\psi$) can be represented merely as ($\varphi$, $\theta$, $\psi$) below. Further, the thickness of the piezoelectric thin film 12 or the interdigital transducer electrodes 13 and 52 can be represented as magnification of the wavelength $\lambda$ of an acoustic wave device to be used. Further, unless stated otherwise, a quartz substrate 11 is used as the substrate 11. Further, the Euler angles of the substrate 11 or piezoelectric thin film 12 indicated below can be crystallographically equivalent Euler angles.

[Specific Examples of Characteristics of Respective LT, LN and Quartz Substrates]

FIGS. 2(a) and 2(b) illustrate frequency characteristics of impedance (Z) obtained by a SAW resonator that is manufactured based on the conventional acoustic wave device illustrated in FIG. 1(a), in which an interdigital transducer electrode 52 made of Al and having a thickness of 0.08 wavelength is formed on a piezoelectric substrate 51 having a (0°, 110°, 0°) LT substrate and a piezoelectric substrate 51 having a (0°, 132°, 0°) LT substrate, respectively.

As illustrated in FIG. 2(a), there are greater ripples between a resonant frequency fa and an anti-resonant frequency fa when the (0°, 110°, 0°) LT substrate is used. The bandwidth BW between fr and fa (BW=(fa−fr)/fr) was 5.2% and the ratio between the resonant impedance and the anti-resonant impedance (Z ratio) was 53 dB. Further, as illustrated in FIG. 2(b), the ripples between fr and fa were reduced in the (0°, 132°, 0°) LT substrate. The BW was 3.8% and the impedance ratio was 63 dB.

FIGS. 3(a) and 3(b) illustrate frequency characteristics of impedance (Z) obtained by combining an LT piezoelectric thin film 12 with a quartz substrate 11 in the acoustic wave device 10 illustrated in FIG. 1(b), in which an interdigital transducer electrode 13 made of Al and having a thickness of 0.08 wavelength is formed on a (0°, 110°, 0°) LT thin film 12 (0.15 wavelength thickness)/(0°, 130°, 90°) quartz substrate 11 structure and a (0°, 120°, 0°) LT thin film 12 (0.15 wavelength thickness)/(0°, 130°, 0°) quartz substrate 11 structure, respectively.

As illustrated in FIG. 3(a), there is no ripple even though the Euler angles of LT are the same as those of FIG. 2(a) in the case of (0°, 110°, 0°) LT thin film 12 (0.15 wavelength thickness)/(0°, 130°, 90°) quartz substrate 11, and thus substantial improvement has been achieved. Specifically, the bandwidth (BW) is 6.1%, which is broader by approximately 20%, and the impedance ratio is 77.5 dB, which is greater by 24.5 dB. Such an increase of the impedance ratio corresponds to 10 times or greater Q. Further, as illustrated in FIG. 3(b), the BW is 5.5% and the impedance ratio is 77.0 dB, in which the BW has become broader and the impedance ratio has been substantially improved such as of 15 dB as compared with those of FIG. 2(b) in the (0°, 120°, 0°) LT thin film 12 (0.15 wavelength thickness)/(0°, 130°, 0°) quartz substrate 11 structure. These increases of the impedance ratio correspond to 10 times or greater Q. As a result, it can be said that using the quartz substrate 11 may provide extremely excellent characteristics of the steepness and insertion loss as compared with the case of a single LT substrate alone. Further, the coupling factor can be increased although the difference might be small.

It is to be appreciated that the (0°, 130°, 90°) quartz substrate 11 or the (0°, 130°, 0°) quartz substrate 11 may excite an LSAW and a Rayleigh wave both (see FIGS. 5, 7 and 8); however, the characteristics of FIG. 3 were obtained using an LSAW. When using the Rayleigh wave, no response or only a small response was confirmed in the SAW.

FIGS. 4(a) and 4(b) illustrate frequency characteristics of impedance (Z) obtained by forming an interdigital transducer electrode 13 made of Al and having a thickness of 0.08 wavelength on a (0°, 110°, 0°) LT thin film 12 (0.15 wavelength thickness)/(0°, 130°, 30°) quartz substrate 11 structure and a (0°, 110°, 0°) LT thin film 12 (0.15 wavelength thickness)/(0°, 130°, 60°) quartz substrate 11 structure, respectively. As can be seen in FIGS. 4(a) and 4(b) both, there are greater ripples within the bandwidth and no better characteristic can be obtained. However, when the $\psi$ of quartz is 85°, 95°, −5° and 5°, characteristics similar to those found in FIGS. 3(a) and 3(b) can be obtained. As above, greater ripples may occur depending on the Al thickness and Euler angles and therefore how the Al thickness and Euler angles should be chosen may be important.

FIG. 5 illustrate that Rayleigh wave and LSAW phase velocities can depend on a propagation direction $\psi$ at a (0°, 130°, $\psi$) quartz substrate 11. As seen in FIG. 5, the LSAW phase velocities at the quartz substrate 11 when $\psi=0°$ and 90° are as high as approximately 5,000 m/s, whereas the LSAW phase velocities at $\psi=30°$ and 60° are as low as approximately 3,800 m/s. It is to be appreciated that a power flow angle (PFA)=0 can be obtained when the tangent $\delta V/\delta w$ of a phase velocity V against a propagation direction $\psi$ is zero. The PFA=0 at $\psi=0°$, 35° and 90° by the Rayleigh wave of FIG. 5 and in the vicinity of $\psi=0°$, 42° and 90° by a leaky surface acoustic wave.

As illustrated in FIGS. 3 to 5, the LSAW phase velocity by the used LT thin film 12 is 4100 m/s, whereas, when the (0°, 130°, 30°) and (0°, 130°, 60°) quartz substrates 11 are used with the LSAW phase velocity as low as 3,800 m/s, no better characteristic can be obtained at the Al thickness of 0.08 wavelength. In contrast, a better characteristic can be obtained when the (0°, 130°, 0°) and (0°, 130°, 90°) quartz substrates 11 are used with the LSAW phase velocity as high as 5,000 m/s. Further, as illustrated in FIGS. 2 and 3, the (0°, 110°, 0°) LT substrate, which may have a greater leaky component, may provide a greater improvement of the characteristics as compared with the (0°, 132°, 0°) LT substrate. As a result, a measure reason for characteristic improvement is thought to be that a leaky component of the LSAW of the LT thin film 12 becomes zero by bonding the quartz substrate 11 that allows the LSAW to be higher than that of the LT thin film 12.

FIGS. 6(a) and 6(b) illustrate frequency characteristics of impedance (Z) obtained in SAW resonators in which a (0°, 132°, 0°) LT thin film (0.15 wavelength thickness) is bonded on a (110) surface (001) direction propagation Si substrate and a c-sapphire substrate having a higher phase velocity respectively and then an interdigital transducer electrode made of Al and having a thickness of 0.08 wavelength is formed thereon. As illustrated in FIG. 6(a), the BW was 4.4% and the impedance ratio was 69 dB when the Si substrate was used. Also, as illustrated in FIG. 6(b), the BW was 5.7% and the impedance ratio was 68 dB when the sapphire substrate was used.

The characteristics illustrated in FIGS. 6(a) and 6(b) indicate that the BW is broader and the impedance ratio is better from 5 to 6 dB as compared with those characteristics of the SAW resonator of a single LT substrate in FIG. 2(b); however, those of the LT thin film 12/quartz substrate 11 structure illustrated in FIG. 3 are far better. Not only a Rayleigh wave but also an LSAW is excited using a piezoelectric substrate of quartz, LT, LN and the like, whereas only a Rayleigh wave of the SAW modes can be excited using the Si substrate or the sapphire substrate, which has no piezoelectricity. Accordingly, the reason why better characteristics can be obtained using the quartz substrate 11 rather than using the Si substrate or the sapphire substrate is thought to be that, in contrast to the quartz substrate 11 in use using the same LSAW as the LT thin film 12, the Si substrate or the sapphire substrate has a higher shear wave velocity of a bulk wave than the LT thin film and uses a Rayleigh wave different from the LSAW of the LT thin film in use.

As a result, better characteristics can be obtained by using as a base substrate a substrate having a higher phase velocity that is close to the shear wave velocity of the bulk wave and includes primarily an SH component than the shear wave phase velocity and bonding the base substrate on the piezoelectric thin film 12 of LT, LN and the like to be used. The greater the LSAW velocity difference between the piezoelectric thin film 12 and the substrate, the more preferable. For example, the difference is preferably be 300 m/s or greater and more preferably 600 m/s or greater.

FIGS. 7(a) and 7(b) illustrate θ-dependence of phase velocities and TCFs respectively for Rayleigh wave and LSAW of a (0°, θ, 0°) quartz substrate 11. Further, FIG. 7(c) illustrates displacement ratios on the substrate surface between a displacement component U1, an SH component U2 and an SV component U3 of the longitudinal wave of LSAW. As illustrated in FIG. 7(a), higher phase velocities of 4,500 m/s or greater, 4,800 m/s or greater, and 5,000 m/s or greater can be obtained at θ=70°-165°, 0=90°-150°, and θ=100°-140° respectively. Further, as illustrated in FIG. 7(b), the TCFs are positive at θ=0°-132° for Rayleigh wave, and positive at θ=0°-18°, 43°-66°, and 132°-180° for LSAW.

The quartz substrate 11 having Euler angles that allow the Rayleigh wave or LSAW to have positive TCFs is preferably combined with LT and LN having negative TCFs for LSAW such that better TCFs close to zero ppm/° C. can be obtained. More preferably, better TCFs can be obtained in the combination with the quartz substrate 11 having TCFs of +5 ppm/° C. at θ=0°-130° for Rayleigh wave or at θ=0°-16°, 44°-65°, and 135°-180° for LSAW. Further, as illustrated in FIG. 7(c), the SH component (U2 component) is found to increase such as in 50% or greater at θ=70°-165° in which the LSAW phase velocity is greater.

FIGS. 8(a) and 8(b) illustrate θ-dependence of phase velocities and TCFs respectively for Rayleigh wave and LSAW of a (0°, θ, 90°) quartz substrate 11. Further, FIG. 8(c) illustrates displacement ratios on the substrate surface between a displacement component U1, an SH component U2 and an SV component U3 of the longitudinal wave of LSAW. As illustrated in FIG. 8(a), higher phase velocities of 4,500 m/s or greater, 4,800 m/s or greater, and 5,000 m/s or greater are obtained at θ=90°-150°, 0=103°-143°, and θ=110°-135° respectively. Further, as illustrated in FIG. 8(b), the TCFs are positive at θ=0°-42° and 170°-180° for Rayleigh wave, and positive at θ=0°-41° and 123°-180° for LSAW. The quartz substrate 11 having Euler angles that allow the Rayleigh wave or LSAW to have positive TCFs is preferably combined with LT and LN having negative TCFs for LSAW such that better TCFs close to zero ppm/° C. can be obtained. More preferably, better TCFs can be obtained in the combination with the quartz substrate 11 having TCFs of +5 ppm/° C. at θ=0°-39° and 172°-180° for Rayleigh wave or at θ=0°-39° and 126°-180° for LSAW. Further, as illustrated in FIG. 8(c), the SH component (U2 component) is found to increase such as in 65% or greater at θ=85°-165° in which the LSAW phase velocity is greater.

FIG. 9 illustrates phase velocities of quartz substrates 11 having various Euler angles. According to the quartz substrates 11 having Euler angles as indicated in FIG. 9, higher phase velocities such as 4,500 m/s or greater can be obtained at ψ=0°-20°, 70°-120°, and 160°-180°. Further, although not illustrated, LSAWs having higher phase velocities can be obtained by Euler angles of (1°-39°, 100°-150°, 0°-20°), (1°-39°, 100°-150°, 70°-120°), and (1°-39°, 100°-150°, 160°-180°).

Acoustic wave devices may preferably use a substrate having a direction close to zero in a power flow angle (a propagation direction having zero at a tangential line in the LSAW propagation direction) in order to prevent the LSAW from obliquely propagating. According to the quartz substrates 11 having Euler angles as indicated in FIG. 9, directions close to zero in the power flow angle are at (0°±5°, θ, 35°±8°), (10°±5°, θ, 42°±8°), (20°±5°, θ, 50°±8°), (0°±5°, θ, 0°±5°), (10°±5°, θ, 0°±5°), (20°±5°, θ, 0°±5°), (0°±5°, θ, 90°±5°), (10°±5°, θ, 90°±5°), and (20°±5°, θ, 90°±5°) and the substrates having these Euler angles may preferably be used.

[Specific Examples of Acoustic Wave Devices Having a Structure of LT Thin Film/Quartz Substrate]

FIGS. 10(a) and 10(b) illustrate θ-dependence of phase velocities and electromechanical coupling coefficients (coupling factors) respectively for a Rayleigh wave and an LSAW of a (0°, θ, 0°) LT substrate. Also, FIG. 10(c) illustrates θ-dependence of TCFs for the (0°, θ, 0°) LT substrate. As illustrated in FIGS. 10(a) and 10(b), an LSAW at θ=120°-146° having a small leaky component and a coupling factor of 4% or greater is generally used in an LT substrate. In this case, the phase velocity Vm (phase velocity when the substrate surface is electrically short-circuited)

ranges from 4,000 to 4,100 m/s. However, the bandwidth of the filter depends on the coupling factor of the substrate in use and thus the coupling factor needs to be chosen to satisfy the desirable bandwidth. According to an acoustic wave device 10 of an embodiment of the present invention, the LT is used with a substrate disposed below the LT and having a phase velocity similar to or higher than that of the LT such that a leaky component can be reduced, and thus better characteristics can be obtained using θ=65°-148° allowing for a greater coupling factor and then using a quartz substrate 11 having a phase velocity of around 3,700 to 4,100 m/s or a higher phase velocity.

Further, as illustrated in FIG. 10(c), any TCF for LSAW of the LT substrate is negative and ranges between −30 and −70 ppm/° C. Although the TCFs for LSAW at θ=120°-146° used by a single LT substrate is approximately −33 ppm/° C., combining the LT substrate with a quartz substrate 11 having a positive TCF for Rayleigh wave or LSAW, i.e., a (0°, 0°-130°, 0°) substrate for Rayleigh wave and a (0°, 132°-180°, 0°) substrate for LSAW as illustrated in FIG. 7, as well as (0°, 0°-39°, 90°) and (0°, 172°-180°) substrates for Rayleigh wave and (0°, 0°-41°, 90°) and (0°, 123°-180°, 90°) substrates for LSAW as illustrated in FIG. 8, may result in better TCFs such as ⅓ or less of the TCF of the single LT substrate.

Figure 11B:
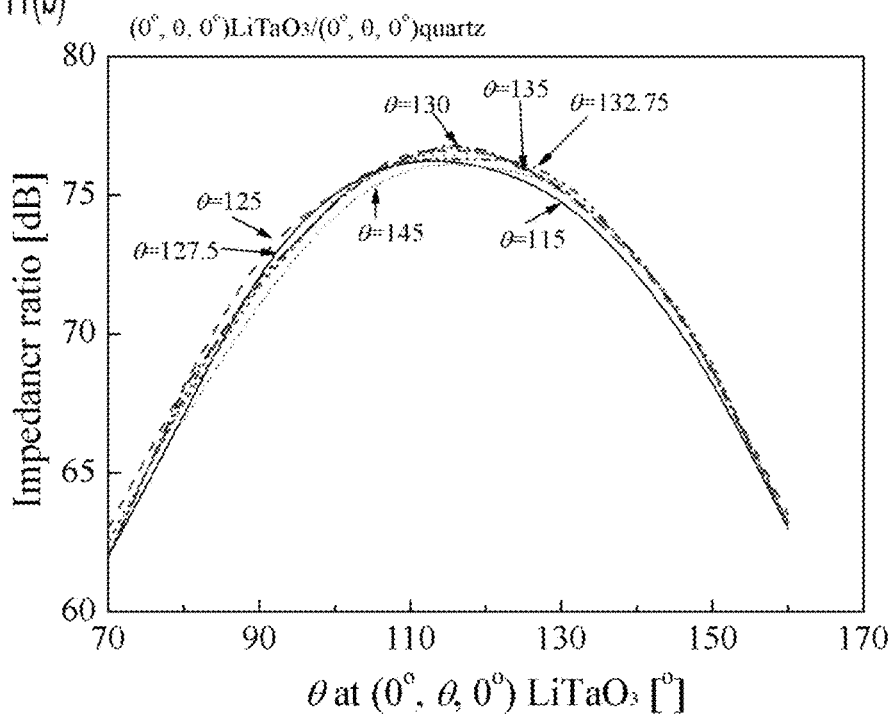

FIGS. 11(a) and 11(b) illustrate θ-dependence at LT of resonator bandwidths and impedance ratios respectively, obtained by an acoustic wave device 10 in which an interdigital transducer electrode 13 made of Al and having a thickness of 0.08 wavelength is formed on a (0°, θ, 0°) LT thin film 12 (0.15 wavelength thickness)/(0°, 115°-145°, 0°) quartz substrate 11 structure. It is to be appreciated that θ indicated in the graphs of FIGS. 11(a) and 11(b) corresponds to θ of the quartz substrate 11. As illustrated in FIG. 11(a), the bandwidth of 3.5% is obtained at θ=82°-148° in LT. Further, as illustrated in FIG. 11(b), impedance ratios of 70 dB or greater, 73 dB or greater, and 75 dB or greater are obtained at θ=85°-148° in LT, θ=90°-140° in LT, and θ=95°-135° in LT, respectively.

Figure 12A:
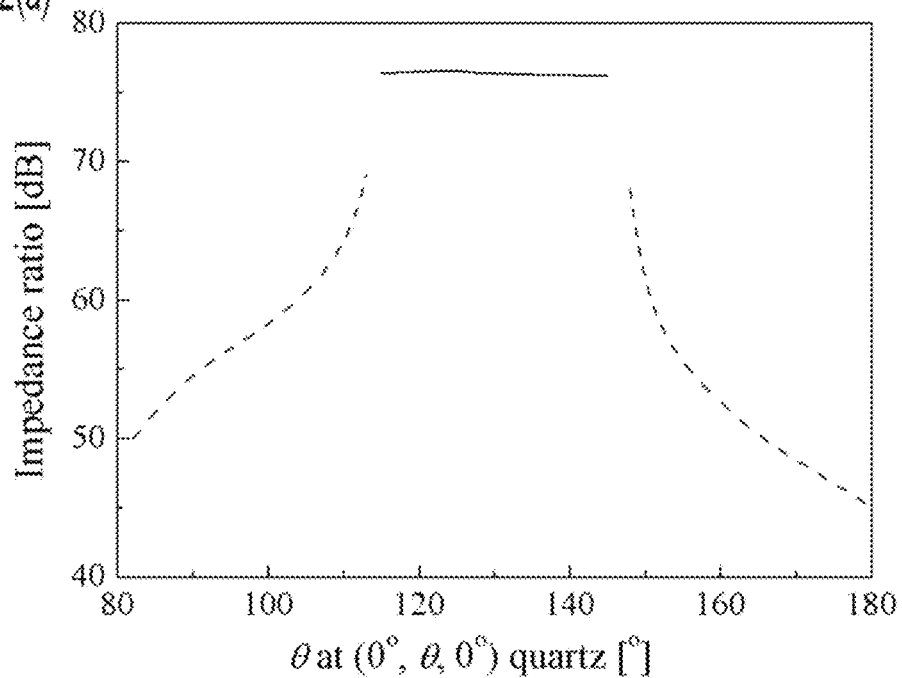
FIGS. 12(a) and 12(b) are graphs illustrating that impedance ratios when the Al thickness is 0.08 wavelength and when the Al thickness is 0.2 wavelength, respectively, at an acoustic wave resonator having a structure of Al-IDT/(0°, 110°, 0°) LT thin film (0.15 wavelength thickness)/(0°, θ, 0°) quartz substrate can depend on θ (solid line indicates a characteristic without a ripple and dashed line indicates a characteristic with a ripple between the resonant and anti-resonant frequencies)
Figure 12B:
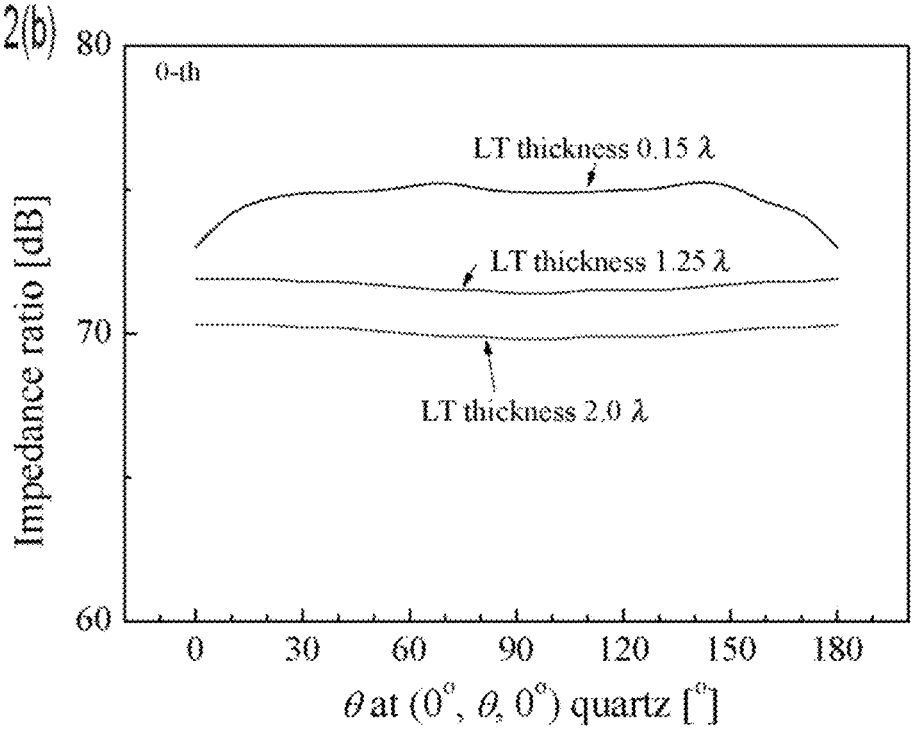

FIGS. 12(a) and 12(b) illustrate θ-dependence at quartz of impedance ratios obtained by acoustic wave devices 10 in which an interdigital transducer electrode 13 made of Al is formed on a (0°, 110°, 0°) LT thin film 12 (0.15 wavelength thickness)/(0°, θ, 0°) quartz substrate 11 structure when the Al thickness is 0.08 wavelength (FIG. 12(a)) and when the Al thickness of 0.2 wavelength (FIG. 12(b)) respectively. In FIG. 12(a), a solid line indicates a characteristic without a ripple and dashed lines indicate characteristics with a ripple within a bandwidth between fr and fa of the resonator. Better impedance ratios can be obtained at (0°, 115°-145°, 0°) in quartz, whereas a ripple can be observed at other angles. However, almost no ripple is observed in FIG. 12(b) and greater impedance can be obtained at any orientation angle. Accordingly, the θ-dependence of impedance ratio can vary due to the Al electrode thickness. It is to be appreciated that, although not illustrated, a characteristic close to that of the Al electrode thickness of 0.2 wavelength can be obtained by the Al electrode thickness of 0.08 wavelength or greater. In view of the range enabling the LSAW of quartz to be positive as illustrated in FIG. 7(b) when the Al electrode has a thickness of 0.08 wavelength, the quartz substrate 11 may be preferably at (0°, 132°-145°, 0°), and more preferably at (0°, 135°-145°, 0°). In this case, combining the LT thin film 12 having a negative TCF with the quartz substrate 11 having a positive TCF may substantially improve the TCF of the acoustic wave device 10. Especially when the quartz substrate 11 is at (0°, 135°-145°, 0°), a better TCF can be obtained.

Figure 13A:
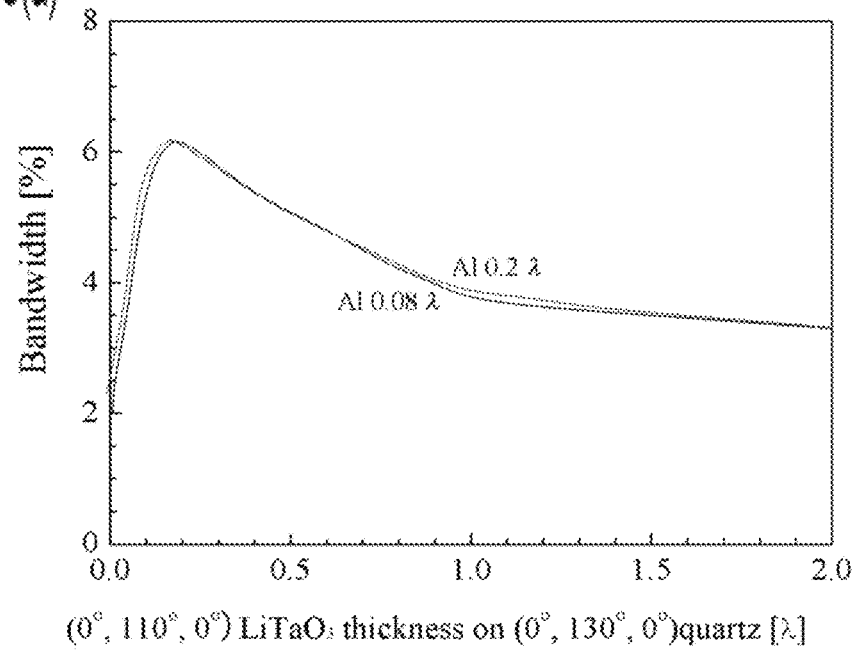
FIGS. 13(a) and 13(b) are graphs illustrating that a bandwidths and an impedance ratio respectively of an acoustic wave resonator having Al-IDT/(0°, 110°, 0°) LT thin film (0.15 wavelength thickness)/(0°, 130°, 0°) quartz substrate can depend on the LT film thickness when the Al thickness is 0.08 wavelength and 0.2 wavelength.
Figure 13B:
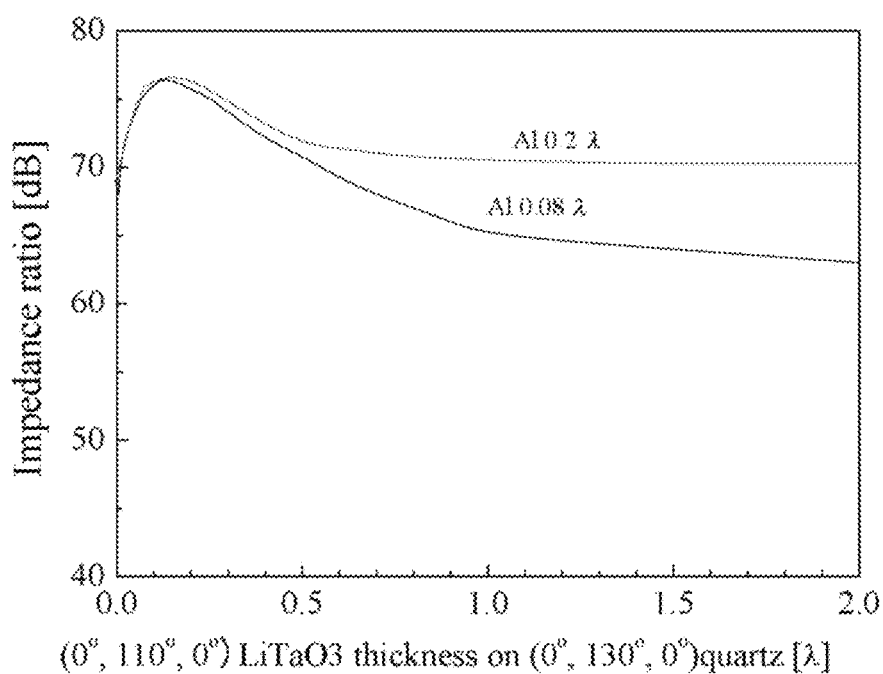

FIGS. 13(a) and 13(b) illustrate that acoustic wave resonator bandwidths and impedance ratios respectively can depend on LT film thicknesses, for acoustic wave devices 10 in which an interdigital transducer electrode 13 made of Al and having thicknesses of 0.08 wavelength and 0.2 wavelength on a (0°, 110°, 0°) LT thin film 12/(0°, 130°, 0°) quartz substrate 11 structure. As illustrated in FIG. 13(a), bandwidths of 3% or greater are obtained at the LT film thickness of 0.02 wavelength to 2 wavelength. Further, as illustrated in FIG. 13(b), impedance ratios of 70 dB or greater, 73 dB or greater, and 75 dB are obtained when the Al thickness is 0.08 wavelength at the LT film thicknesses of 0.01 to 0.6 wavelength, 0.02 to 0.4 wavelength, and 0.03 to 0.3 wavelength, respectively. On the other hand, when the Al thickness is 0.2 wavelength, impedance ratios of 70 dB, 73 dB or greater, and 75 dB can be obtained at the LT film thicknesses of 2 wavelength or less, 0.02 to 0.043 wavelength, and 0.03 to 0.33 wavelength, respectively. It is to be appreciated that values when the Al thickness is 0.1 to 0.3 wavelength are approximately the same values as the Al thickness of 2 wavelength.

FIGS. 14(a) and 14(b) illustrate that acoustic wave resonator bandwidths and impedance ratios respectively can depend on θ at LT, for an acoustic wave device 10 in which an interdigital transducer electrode 13 made of Al and having a thickness of 0.08 wavelength is formed on a (0°, θ, 0°) LT thin film 12 (0.15 wavelength thickness)/(0°, 100°-175°, 90°) quartz substrate 11. It is to be appreciated that θ indicated in the graphs of FIGS. 14(a) and 14(b) corresponds to θ of the quartz substrate 11. As illustrated in FIG. 14(a), a bandwidth of 3.5% is obtained at θ=75°-155° in LT, except for the cases of 0=165° and θ=175° in the quartz substrate 11. Further, as illustrated in FIG. 14(b), impedance ratios of 70 dB or greater, 73 dB or greater, 75 dB or greater, and approximately 77 dB are obtained at θ=80°-152° in LT, θ=90°-140°, 0=95°-135°, and θ=103°-125° in LT, respectively.

Figure 15A:
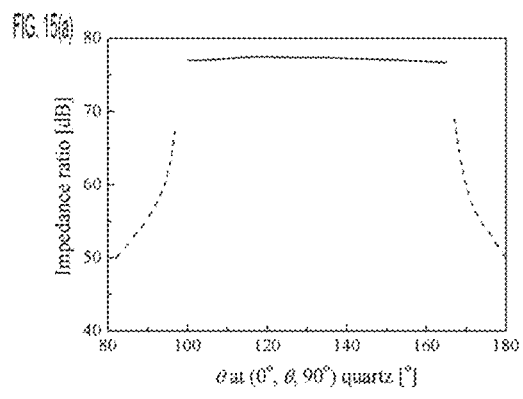
FIGS. 15(a) and 15(b) are graphs illustrating that impedance ratios of an acoustic wave resonator having a structure of Al-IDT/(0°, 110°, 0°) LT thin film/(0°, θ, 90°) quartz substrate when the LT thickness is 0.15 wave length and the Al thickness is 0.08 wavelength (FIG. 15(a)) and when the LT thickness is 0.15 wave length and the Al thickness is 0.1 wavelength and the LT thickness is 1.25 wavelength and 2 wavelength and the Al thickness is 0.2 wavelength (FIG. 15(b)) can depend on θ (solid line indicates a characteristic without a ripple and dashed line indicates a characteristic with a ripple between the resonant and anti-resonant frequencies)
Figure 15B:
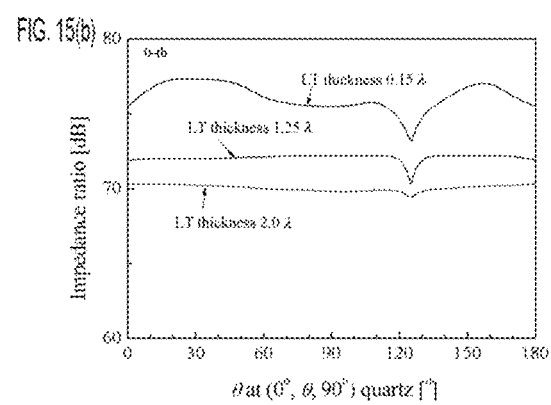

FIG. 15(a) illustrates that acoustic wave resonator impedance ratios can depend on θ at a quartz substrate 11, for an acoustic wave device 10 in which an interdigital transducer electrode 13 made of Al and having a thickness of 0.08 wavelength is formed on a (0°, 120°, 0°) LT thin film 12 (0.15 wavelength thickness)/(0°, θ, 90°) quartz substrate 11 structure. In the figure, a solid line indicates a characteristic without a ripple and dashed lines indicate characteristics with a ripple within a bandwidth of the resonator. On the other hand, FIG. 15(b) illustrates a relationship between the impedance ratios and Euler angles when the LT thickness is 0.15 wavelength and the Al thickness is 0.1 wavelength, and the LT thickness is 1.25 wavelength and 2 wavelength and the Al thickness is 0.2 wavelength.

In the FIG. 15(a) of the Al thickness of 0.08 wavelength, a better impedance ratio is obtained at (0°, 100°-165°, 90°) quartz. In view of FIG. 8(b), the Euler angles of the quartz substrate 11 that allows the quartz Rayleigh wave or LSAW to have a positive TCF is preferably (0°, 123°-165°, 90°±5°) in the vicinity of the Al thickness of 0.08 wavelength, more preferably the Euler angles (0°, 126°-165°, 90°±5°) of quartz that allows the TCF to be +5 ppm/° C. or greater, and far more preferably (0°, 127°-165°, 90°±5°) that allows the TCF to be +7 ppm/° C. or greater. In this case, combining the LT thin film 12 having a negative TCF with the quartz substrate 11 having a positive TCF may substantially improve the TCF of the acoustic wave device 10. Especially when the quartz substrate 11 is at (0°, 127°-165°, 0°), a better TCF can be obtained.

Figure 15C:
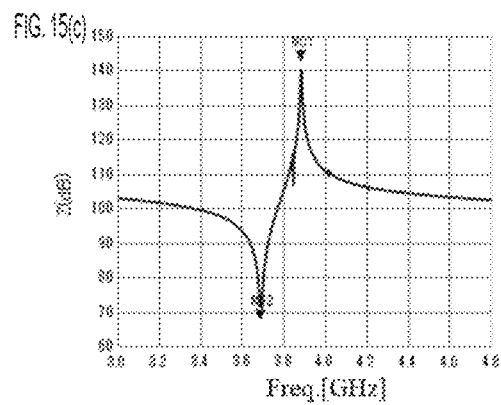
FIG. 15(c) is a graph illustrating a frequency characteristic of impedance (Z) when θ=125.25° at the quartz substrate in FIG. 15(b)

FIG. 15(c) illustrates frequency characteristics of a (0°, 120°, 0°) LT thin film 12 (0.15 wavelength thickness)/(0°, 125.25°, 90°) quartz substrate 11 structure when the Al thickness is 0.1 wavelength. In this quartz orientation angle, a ripple occurs within the bandwidth at a specific Al thickness, such that the impedance ratio of FIG. 15(b) is smaller than the other orientation angle. Especially, because the combination with a (0°, 126°, 0°) LT thin film 12 may easily cause a greater ripple, avoiding the combination of the (0°, 126°, 0°) LT thin film 12 with the (0°, 125.25°, 90°) quartz substrate 11 may be desired.

Figure 16A:
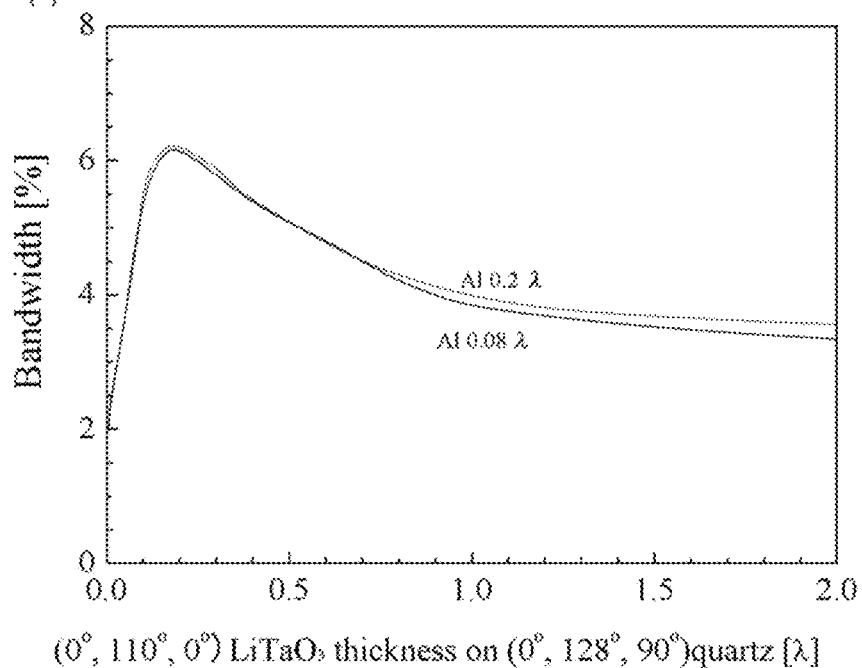
FIGS. 16(a) and 16(b) are graphs illustrating that a bandwidths and an impedance ratio respectively of an acoustic wave resonator having a structure of Al-IDT/(0°, 110°, 0°) LT thin film/(0°, 128°, 90°) quartz substrate can depend on the LT film thickness when the Al thickness is 0.08 wavelength and 0.2 wavelength.
Figure 16B:
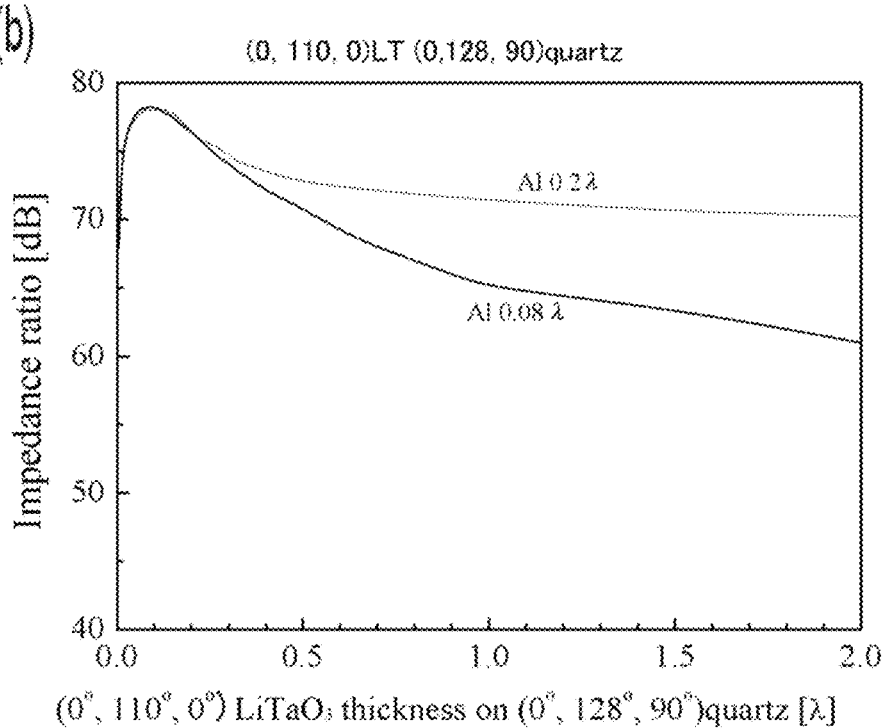

FIGS. 16(a) and 16(b) illustrate that acoustic wave resonator bandwidths and impedance ratios respectively can depend on LT film thicknesses, for acoustic wave devices 10 in which interdigital transducer electrodes 13 made of Al and having thicknesses of 0.08 wavelength and 0.2 wavelength on a (0°, 110°, 0°) LT thin film 12/(0°, 128°, 90°) quartz substrate 11 structure. As illustrated in FIG. 16(a), substantially the same characteristics as those of FIG. 13(a) is obtained and a bandwidth of 3% or greater can be obtained at the LT film thickness of 0.04 wavelength or greater and 2 wavelength of less. Further, as illustrated in FIG. 16(b), substantially the same characteristics as those of FIG. 13(b) can be obtained and impedance ratios of 70 dB or greater, 73 dB or greater, and 75 dB or greater can be obtained when the Al thickness is 0.08 wavelength at the LT film thicknesses of 0.01 to 0.6 wavelength, 0.02 to 0.4 wavelength, and 0.03 to 0.3 wavelength, respectively. On the other hand, when the Al thickness is 2 wavelength, impedance ratios of 70 dB, 73 dB or greater, and 75 dB or greater can be obtained at the LT film thicknesses of 2 wavelength or less, 0.02 to 0.043 wavelength, and 0.03 to 0.33 wavelength, respectively. It is to be appreciated that the values when the Al thickness is 0.1 wavelength or less are similar to those of 0.08 wavelength and the values when the Al thickness ranges from 0.1 to 0.3 wavelength are substantially the same as those of the Al thickness of 0.2 wavelength.

Figure 17A:
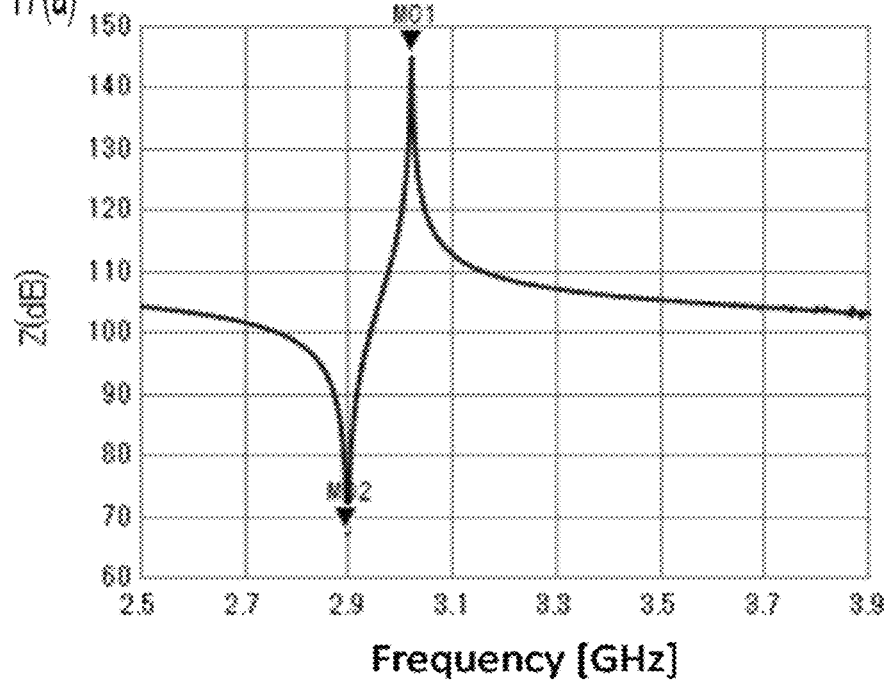
FIG. 17(a) is a graph illustrating that a frequency characteristic of impedance (Z) of an acoustic wave resonator having a structure of Al-IDT/(0°, 110°, 0°) LT thin film (0.15 wavelength thickness)/(0°, 45°, 0°) quartz substrate can depend on the LT film thickness.
Figure 17B:
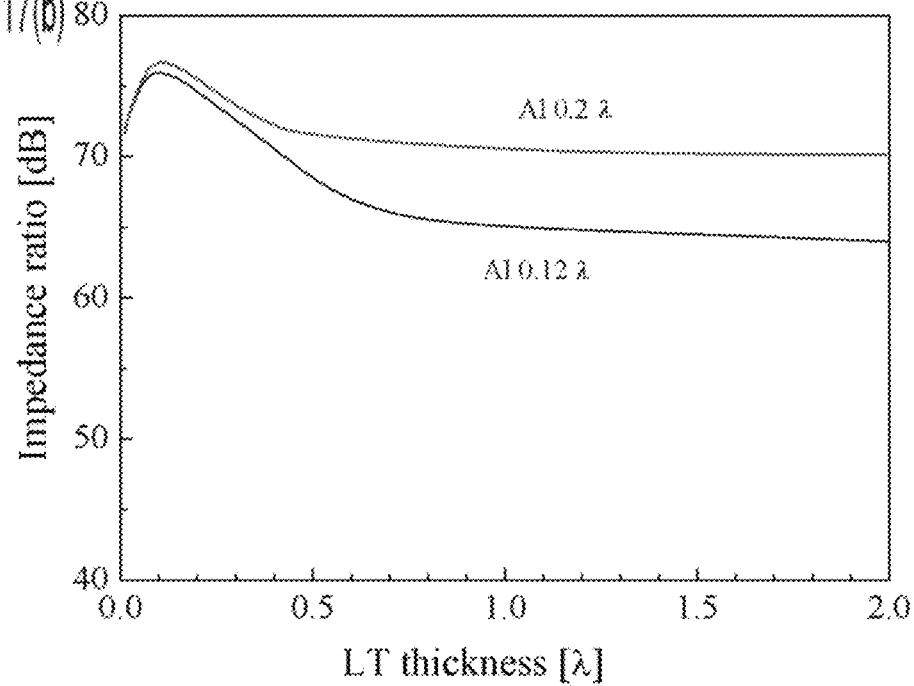
FIG. 17(b) is a graph illustrating that impedance ratios when the Al thickness is 0.12 wavelength and 0.2 wavelength can depend on the LT film thickness.

FIGS. 17(a) and 17(b) illustrate that frequency characteristics of impedance (Z) and impedance ratios respectively depend on LT film thicknesses when the LT thin film 12 has a thickness of 0.15 wavelength, by acoustic wave devices 10 in which interdigital transducer electrodes 13 made of Al and having thicknesses of 0.12 wavelength and 0.2 wavelength are formed on a (0°, 110°, 0°) LT thin film 12/(0°, 45°, 0°) quartz substrate 11 structure. Here, the (0°, 45°, 0°) quartz substrate 11 in use has a positive TCF of Rayleigh wave of 25 ppm/° C., a Rayleigh wave phase velocity of 3270 m/s, and an LSAW phase velocity of 3950 m/s. As illustrated in FIG. 17(a), the frequency is as low as 3 GHz; however, a better impedance ratio of 75 dB is obtained. Further, as illustrated in FIG. 17(b), impedance ratios of 70 dB or greater can be obtained at the LT film thickness of 0.43 wavelength. As above, slightly increased Al electrode thickness may result in better characteristics even by a substrate having a slow LSAW phase velocity.

FIG. 18 illustrates that impedance ratios can depend on LT film thicknesses, for acoustic wave devices 10 in which an interdigital transducer electrode 13 made of Al and having a thickness of 0.08 wavelength is formed on a (0°, 110°, 0°) LT thin film 12/(20°, 120°, 115°) quartz substrate 11 structure, and a (0°, 110°, 0°) LT thin film 12/(0°, 130°, 0°) quartz substrate 11 structure. Here, the (20°, 120°, 115°) quartz substrate 11 in use has an orientation angle for exciting an S wave (fast shear wave) having a high phase velocity around 5,000 m/s, and the (0°, 130°, 0°) quartz substrate 11 has an orientation angle for exciting a LSAW having a high phase velocity. As illustrated in FIG. 18, the (0°, 130°, 0°) quartz substrate 11 allows for an impedance ratio of 70 dB or greater only when the LT thickness is 0.8 wavelength or less, whereas the (20°, 120°, 115°) quartz substrate 11 having a high phase velocity S wave allows for an impedance ratio of 72 dB even by the LT thickness of 10 wavelength and, although not illustrated, an impedance ratio of 70 dB can be obtained even by the LT thickness of 20 wavelength. Such Euler angles of a high phase velocity S wave are (20°±5°, 120°±10°, 115°±10°), (0°±5°, 90°±5°, 0°±10°), (0°±5°, 90°, 75°±10°), (0°±5°, 0°, 0°±10°, or (0°±5°, 0°, 60°±10°, for example.

Figure 19A:
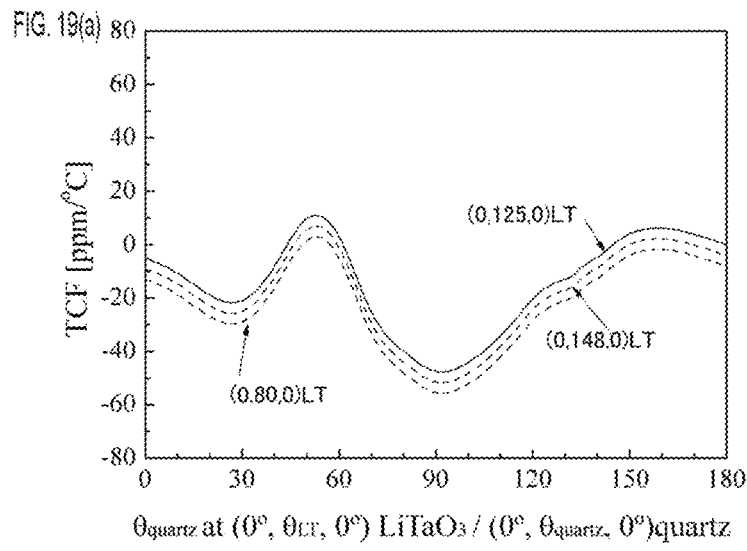
FIGS. 19(a), 19(b) and 19(c) are graphs illustrating that a (0°, $\theta_{LT}$, 0°) LT thin film (0.15 wavelength thickness)/(0°, $\theta_{quartz}$, 0°) quartz substrate substrate structure, a (0°, $\theta_{LT}$, 0°) LT thin film (0.15 wavelength thickness)/(0°, $\theta_{quartz}$, 90°) quartz substrate structure, and a (0°, $\theta_{LT}$, 0°) LT thin film (0.15 wavelength thickness)/(0°, $\theta_{quartz}$, 30°-60°) quartz substrate structure, respectively, can depend on $\theta_{quartz}$ of TCFs when $\theta_{LT}$=80°, 125° and 148°.
Figure 19B:
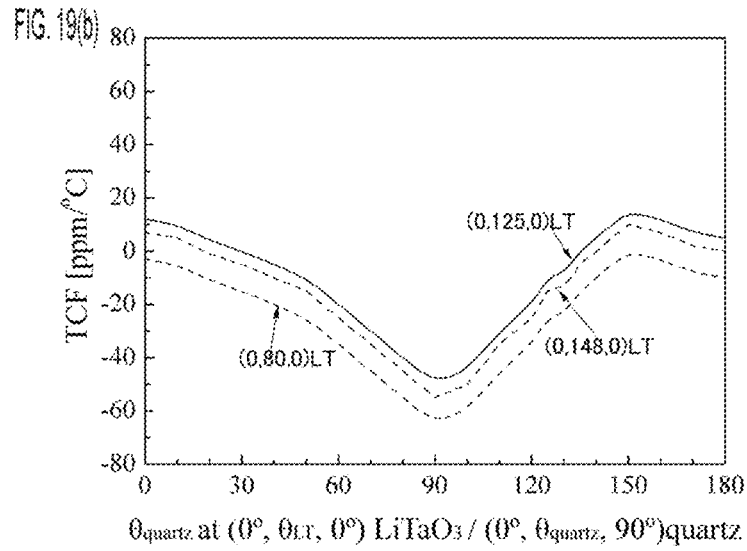
Figure 19C:
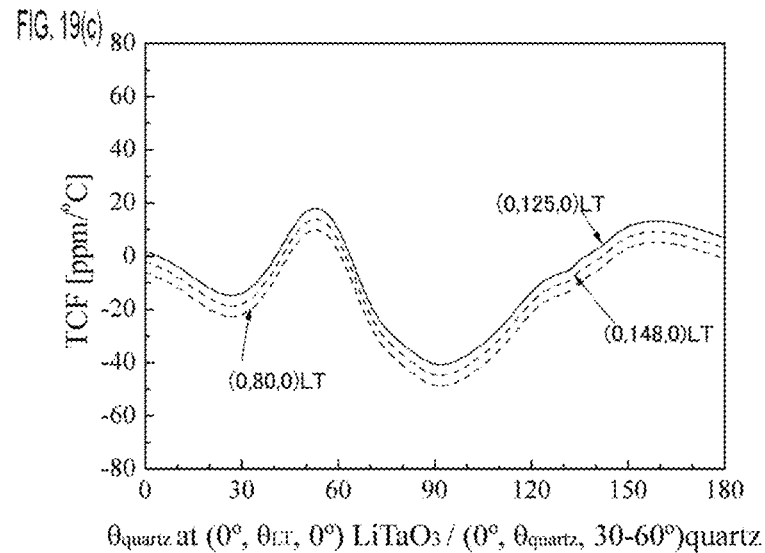

FIGS. 19(a) to 19(c) illustrate $\theta_{quartz}$-dependence of TCFs obtained by a (0°, $\theta_{LT}$, 0°) LT thin film 12 (0.15 wavelength thickness)/(0°, $\theta_{quartz}$, 0°) quartz substrate 11 structure, a (0°, $\theta_{LT}$, 0°) LT thin film 12 (0.15 wavelength thickness)/(0°, $\theta_{quartz}$, 90°) quartz substrate 11 structure, and a (0°, $\theta_{LT}$, 0°) LT thin film 12 (0.15 wavelength thickness)/(0°, $\theta_{quartz}$, 30°-60°) quartz substrate 11 structure, respectively. The expression "30-60°" of the quartz substrate 11 in FIG. 19(c) refers to a propagation direction. The propagation direction at PFA=0 may vary little by little; however, any propagation direction at PFA=0 falls within the range between 30° and 60°. Illustrated Euler angles for the LT thin film 12 among optimum orientation angles (0°, 80°-148°, 0°) are (0°, 125°, 0°) indicating a substantially maximum value of absolute values of TCSs shown in FIG. 10(c), and (0°, 80°, 0°) and (0°, 148°, 0°) indicating the minimum value. As illustrated in FIGS. 19(a) to 19(c), orientation angles that may realize a practical range between −20 ppm/° C. and +20 ppm/° C. at a half of the TCFs of the LT thin film 12 are (0°±5°, 0°-23°, 0°±5°), (0°±5°, 32°-69°, 0°±5°), (0°±5°, 118°-180°, 0°±5°), (0°±5°, 0°-62°, 90°±5°), (0°±5°, 118°-180°, 90°±5°), (0°±5°, 0°-72°, 30°-60°), and (0°±5°, 117°-180°, 30°-60°). Orientation angles of the quartz substrate 11 that may realize a better range between −10 ppm/° C. and +10 ppm/° C. are (0°±5°, 0°-12°, 0°±5°), (0°±5°, 37°-66°, 0°±5°), (0°±5°, 132°-180°, 0°±5°), (0°±5°, 0°-50°, 90°±5°), (0°±5°, 126°-180°, 90°±5°), (0°±5°, 0°-17°, 30°-60°), (0°±5°, 35°-67°, 30°-60°), and (0°±5°, 123°-180°, 30°-60°).

[Specific Examples of Acoustic Wave Devices Having a Structure of LN Thin Film/Quartz Substrate]

FIGS. 20(a) and 20(b) illustrate θ-dependence of phase velocities and electromechanical coupling coefficients respectively for a Rayleigh wave and an LSAW of a (0°, θ, 0°) LN substrate. Further, FIG. 20(c) illustrate θ-dependence of TCFs for a Rayleigh wave and an LSAW of a (0°, θ, 0°) LN substrate. As illustrated in FIGS. 20(a) and 20(b), LN substrates generally use an LSAW at θ=131°-154° allowing for a smaller leaky component and a greater coupling factor, an LSAW at the vicinity of θ=90° allowing for a greater coupling factor, or a Love wave having no leaky component by an electrode allowing phase velocities to be slow on a substrate surface. Phase velocity Vm of LSAW in use ranges between 4,150 and 4,450 m/s.

Further, as illustrated in FIG. 20(c), any one of TCFs of the LSAW of the LN substrate is negative and TCFs of the LSAW at θ=131°-154° or in the vicinity of θ=90° as used in a single LN substrate are as poor as a range between −73 and −93 ppm/° C.

FIG. 21 illustrates frequency characteristics of impedance (Z) obtained by an acoustic wave resonator in which a (0°, 131°, 0°) LN thin film 12 (0.15 wavelength thickness) having an LSAW phase velocity of 4,250 m/s is combined with a (0°, 115°, 90°) quartz substrate 11 having an LSAW phase velocity of 5,040 m/s (see FIG. 8(a)), and then an interdigital transducer electrode 13 made of Al and having a thickness of 0.08 wavelength is formed on the LN thin film 12. As illustrated in FIG. 21, the impedance ratio is 79.3 dB and greater by 19 dB than the conventional SAW characteristic of a single LN substrate. As above, better characteristics similar to the case of LT can be obtained even using LN. In other words, better characteristics can be obtained using an LN thin film 12 having a greater coupling factor and then using a quartz substrate 11 having a phase velocity of around the LSAW or a higher phase velocity.

Figure 22A:
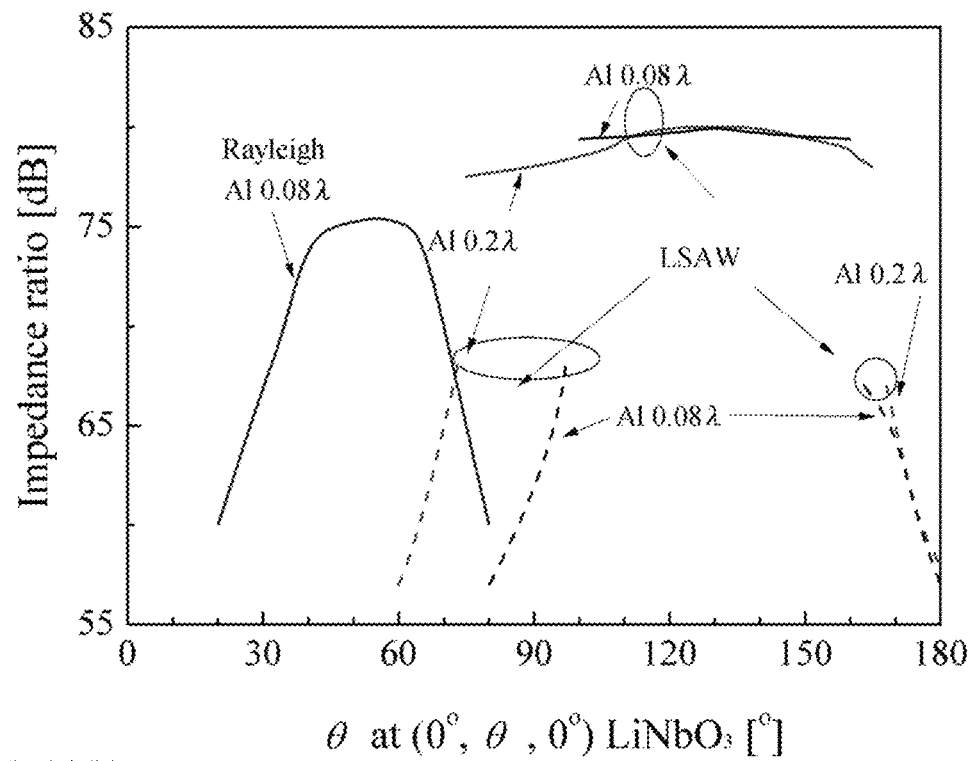
FIG. 22(a) is a graph illustrating that LSAW and Rayleigh wave impedance ratios of an acoustic wave resonator having a structure of Al-IDT/(0°, θ, 0°) LN thin film (0.15 wavelength thickness)/(0°, 130°, 0°) quartz substrate can depend on θ.

FIG. 22(a) illustrates that acoustic wave resonator impedance ratios obtained for an LSAW and a Rayleigh wave can depend on θ at LN, for acoustic wave devices 10 in which interdigital transducer electrodes made of Al and having thicknesses of 0.08 wavelength and 0.2 wavelength are formed on a (0°, 0, 0°) LN thin film 12 (0.15 wavelength thickness)/(0°, 130°, 0°) quartz substrate 11 structure. In FIG. 22(a), impedance ratios of the resonators having the Al thickness of 0.08 wavelength and 0.2 wavelength are illustrated in the case of LSAW, and solid lines extending around the center and above the impedance ratio of 70 dB indicate better characteristics without a ripple, whereas dashed lines disposed on both sides and below 70 dB indicate characteristics with a ripple. Greater impedance ratios are obtained when the Al thickness is 0.8 wavelength and θ=100°-160° for LN and when the Al thickness is 0.2 wavelength and θ=70°-165° for LN. The Al thickness ranging from 0.06 to 0.09 wavelengths may provide the same impedance ratios as those of the Al thickness of 0.08 wavelength. The Al thickness ranging from 0.09 to 0.22 wavelengths may provide the same impedance ratios as those of the Al thickness of 0.2 wavelength. On the other hand, in the case of Rayleigh wave, impedance ratios of the resonators having the Al thickness of 0.08 wavelength are indicated, and greater impedance ratios can be obtained for example as 70 dB or greater at θ=35°-70° for LN and 75 dB or greater at θ=45°-63°.

Figure 22B:
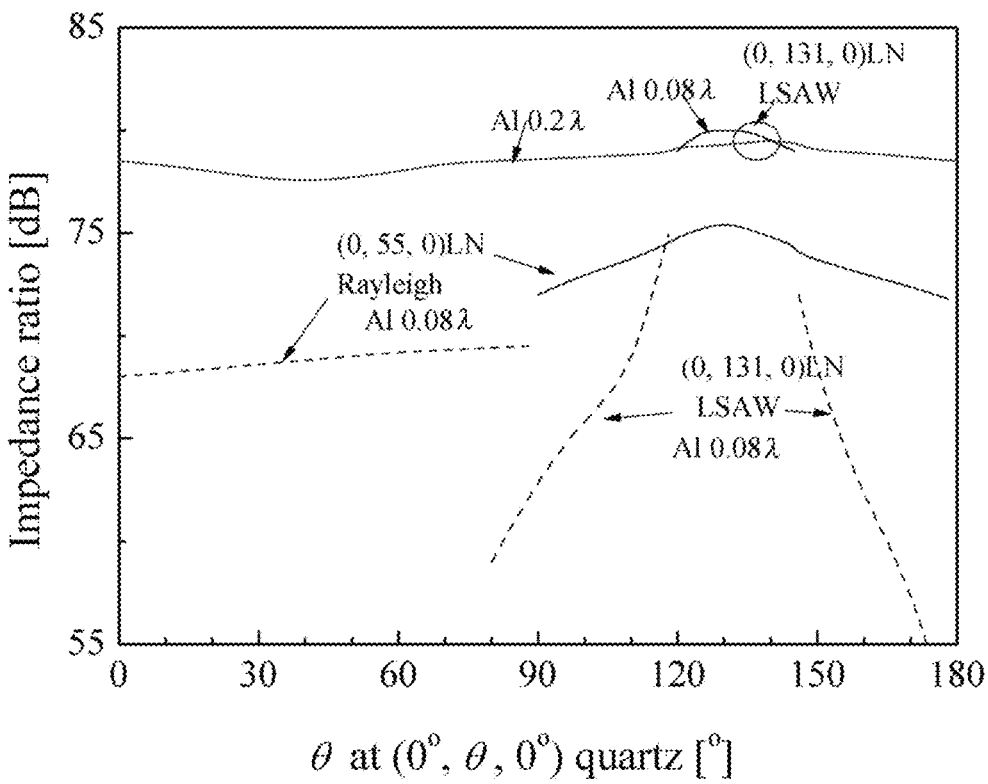
FIG. 22(b) is a graph illustrating that an LSAW impedance ratio of an acoustic wave resonator having a structure of Al-IDT/(0°, 131°, 0°) LN thin film (0.15 wavelength thickness)/(0°, θ, 0°) quartz substrate when the Al thickness is 0.08 wavelength and 0.2 wavelength can depend on θ, and that a Rayleigh wave impedance ratio of an acoustic wave resonator having a structure of Al-IDT/(0°, 55°, 0°) LN thin film (0.15 wavelength thickness)/(0°, θ, 0°) quartz substrate can depend on θ when the Al thickness is 0.08 wavelength (solid line indicates a characteristic without a ripple and dashed line indicates a characteristic with a ripple between the resonant and anti-resonant frequencies)

FIG. 22(b) illustrates θ-dependence for quartz substrate 11 of: impedance ratios of acoustic wave resonators obtained for LSAW by acoustic wave devices 10 in which interdigital transducer electrodes 13 made of Al and having thicknesses of 0.08 wavelength and 0.2 wavelength are formed on a (0°, 131°, 0°) LN thin film 12 (0.15 wavelength thickness)/(0°, θ, 0°) quartz substrate 11 structure; and impedance ratios of acoustic wave resonators obtained for Rayleigh wave by an acoustic wave device 10 in which interdigital transducer electrode made of Al and having a thickness of 0.08 wavelength is formed on a (0°, 55°, 0°) LN thin film 12 (0.15 wavelength thickness)/(0°, θ, 0°) quartz substrate 11 structure. In the figure, what indicates the impedance ratios separated on both sides below 75 dB is a characteristic including ripples within the bandwidth, whereas what indicates the values above the impedance ratio of 75 dB is a better characteristic including no ripple. As illustrated in FIG. 22(b), the (0°, 131°, 0°) LN thin film 12 may result in greater impedance ratios at θ=120°-145° for quartz even at the Al thickness of 0.08 wavelength, whereas, when the Al thickness is 0.2 wavelength, greater impedance ratios can be obtained at all the orientation angles. It is to be appreciated that the Al thickness ranging from 0.06 to 0.09 wavelengths may provide the same impedance ratios as those of the Al thickness of 0.08 wavelength. The Al thickness ranging from 0.09 to 0.22 wavelengths may provide the same impedance ratios as those of the Al thickness of 0.2 wavelength. When the Al thickness is 0.08 wavelength, the Euler angles that allow the TCF of LSAW for the quartz substrate 11 to be positive can be found from FIG. 7(b) as (0°, 132°-180°, 0°±5°) and the Euler angles for the TCF of +5 ppm/° C. can be found as (0°, 135°-180°, 0°±5°). In this case, combining the LT thin film 12 having a negative TCF with the quartz substrate 11 having a positive TCF may substantially improve the TCF of the acoustic wave device 10. Considering the TCFs and impedance ratios from the results of FIGS. 7(b) and 22(b), the Euler angles of the quartz substrate 11 may be preferably (0°, 132°-145°, 0°±5°) and more preferably (0°, 135°-145°, 0°±5°). On the other hand, as illustrated in FIG. 22(b), the (0°, 55°, 0°) LN thin film 12 may result in the impedance ratio of 70 dB at the Euler angles of the quartz substrate 11 of (0°, 90°-178°, 0°±5°) as indicated as a solid line. Also, the dashed line portion indicates the existence of a ripple and characteristically indicates the impedance ratio of 70 dB or less. In the orientation angles of this quartz substrate 11, either one of LSAW or Rayleigh wave indicates a positive TCF.

Figure 23A:
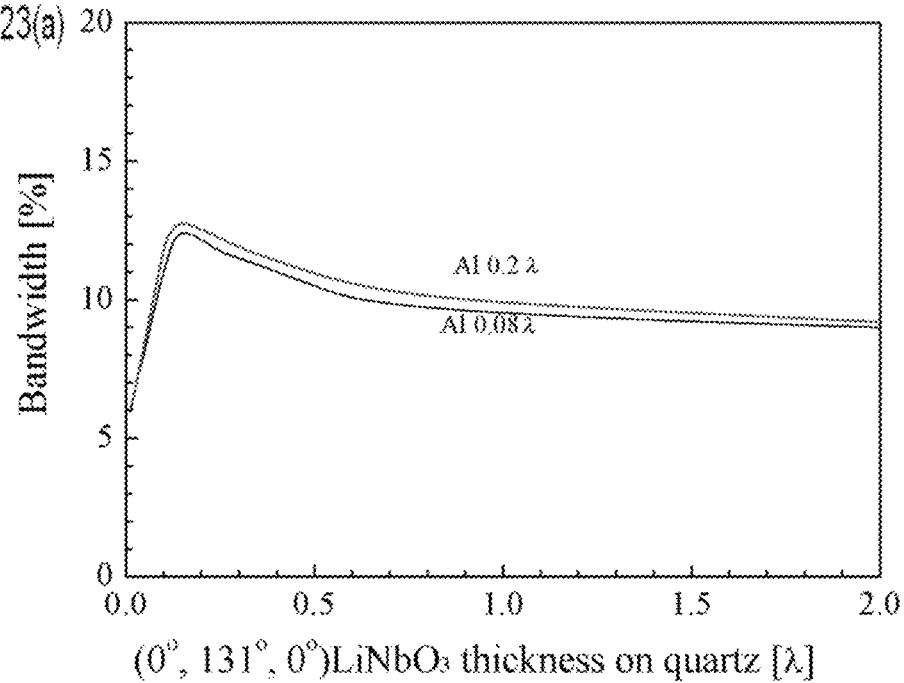
FIGS. 23(a) and 23(b) are graphs illustrating that a bandwidth and an impedance ratio respectively of an acoustic wave resonator having a structure of Al-IDT/(0°, 131°, 0°) LT thin film/(0°, 130°, 0°) quartz substrate can depend on the LT film thickness when the Al thickness is 0.08 wavelength and 0.2 wavelength.
Figure 23B:
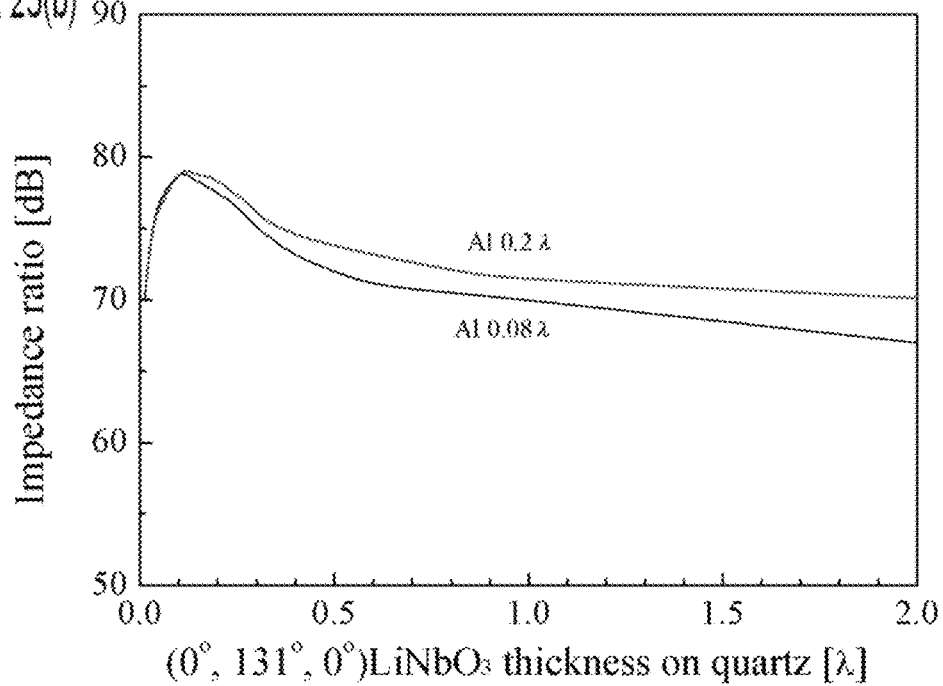

FIGS. 23(a) and 23(b) illustrate that acoustic wave resonator bandwidths and impedance ratios respectively can depend on LN film thicknesses, for acoustic wave devices 10 in which an interdigital transducer electrode 13 made of Al and having thicknesses of 0.08 wavelength and 0.2 wavelength on a (0°, 131°, 0°) LN thin film 12/(0°, 130°, 0°) quartz substrate 11 structure. As illustrated in FIG. 23(a), a bandwidth of 7% or greater is obtained at the LN film thickness of 0.03 wavelength to 2 wavelength. Further, as illustrated in FIG. 23(b), impedance ratios of 70 dB or greater, 73 dB or greater, and 75 dB can be obtained when the Al thickness is 0.08 wavelength at the LN film thicknesses of 0.012 to 0.6 wavelength, 0.02 to 0.5 wavelength, and 0.03 to 0.33 wavelength, respectively. When the Al thickness is 0.2 wavelength, impedance ratios of 70 dB or greater, 73 dB or greater, and 75 dB or greater can be obtained at the LN film thickness of 0.012 to 2 wavelength, 0.02 to 0.7 wavelength, and 0.03 to 0.4 wavelength, respectively.

Figure 24A:
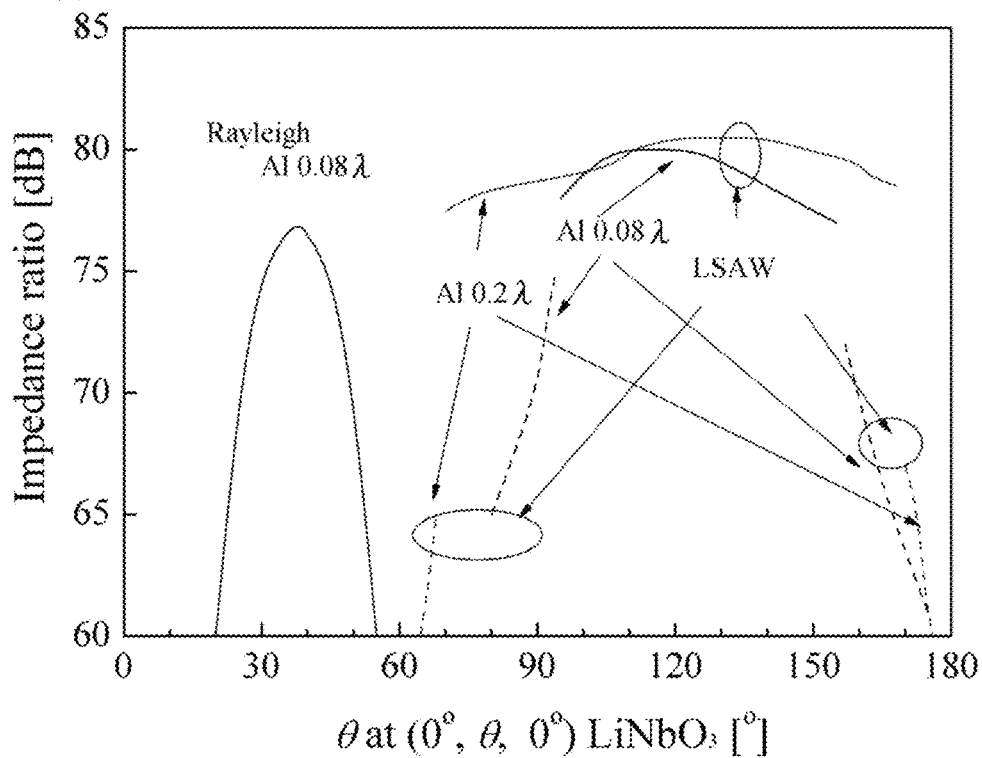
FIG. 24(a) is a graph illustrating that LSAW and Rayleigh wave impedance ratios of an acoustic wave resonator having a structure of Al-IDT/(0°, θ, 0°) LN thin film (0.15 wavelength thickness)/(0°, 130°, 90°) quartz substrate can depend on θ.

FIG. 24(a) illustrates that acoustic wave resonator impedance ratios obtained for an LSAW and a Rayleigh wave can depend on θ at LN, for acoustic wave devices 10 in which interdigital transducer electrodes made of Al and having thicknesses of 0.08 wavelength and 0.2 wavelength are formed on a (0°, θ, 0°) LN thin film 12 (0.15 wavelength thickness)/(0°, 130°, 90°) quartz substrate 11 structure. In FIG. 24(a), impedance ratios of the resonators having the Al thicknesses of 0.08 wavelength and 0.2 wavelength are illustrated in the case of LSAW, and solid lines in the center and above the impedance ratio of 70 dB indicate characteristics without a ripple within the bandwidth, whereas dashed lines disposed on both sides and below 70 dB indicate characteristics with a ripple. Greater impedance ratios can be obtained when the Al thickness is 0.8 wavelength and θ=95°-155° for LN and when the Al thickness is 0.2 wavelength and θ=95°-155° for LN. It is to be appreciated that the Al thickness ranging from 0.06 to 0.09 wavelengths may provide the same impedance ratios as those of the Al thickness of 0.08 wavelength. The Al thickness ranging from 0.09 to 0.22 wavelengths may provide the same impedance ratios as those of the Al thickness of 0.2 wavelength. On the other hand, in the case of Rayleigh wave, impedance ratios of the resonators having the Al thickness of 0.08 wavelength are indicated, and greater impedance ratios can be obtained for example as 70 dB or greater at θ=25°-51° for LN and 75 dB or greater at θ=29°-47°.

Figure 24B:
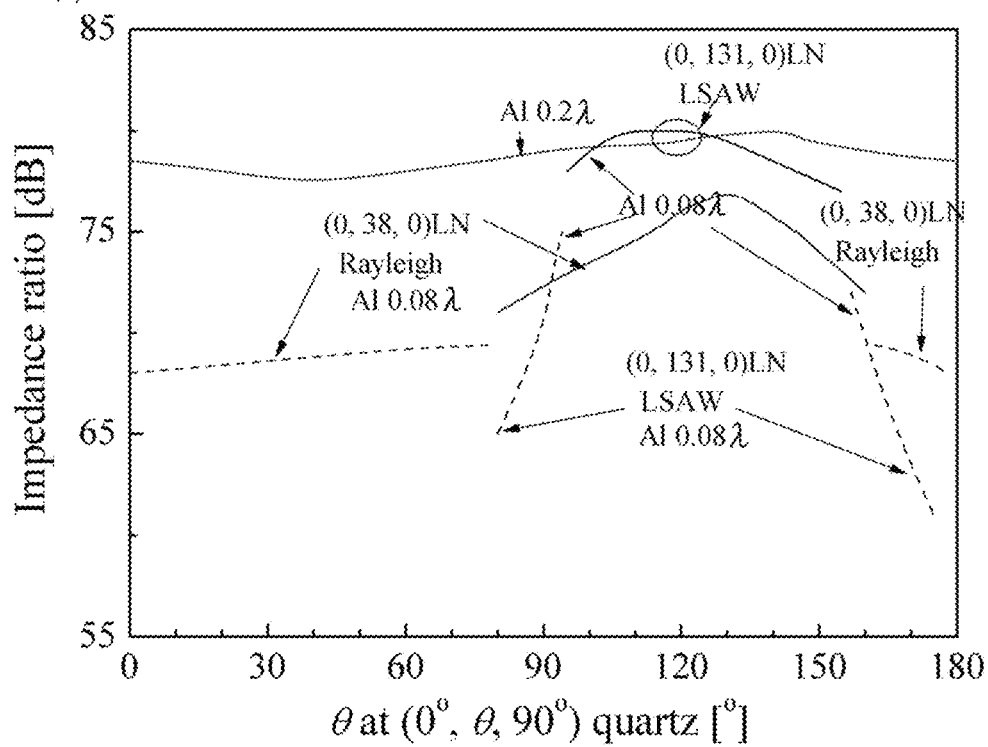
FIG. 24(b) is a graph illustrating that an LSAW impedance ratio of an acoustic wave resonator having a structure of Al-IDT/(0°, 131°, 0°) LN thin film (0.15 wavelength thickness)/(0°, θ, 90°) quartz substrate can depend on θ when the Al thickness is 0.08 wavelength and 0.2 wavelength, and that a Rayleigh wave impedance ratio of an acoustic wave resonator having a structure of Al-IDT/(0°, 38°, 0°) LN thin film (0.15 wavelength thickness)/(0°, 0, 90°) quartz substrate can depend on θ when the Al thickness is 0.08 wavelength (solid line indicates a characteristic without a ripple and dashed line indicates a characteristic with a ripple between the resonant and anti-resonant frequencies)

FIG. 24(b) illustrates θ-dependence for quartz substrate 11 of: impedance ratios of acoustic wave resonators obtained for LSAW by acoustic wave devices 10 in which interdigital transducer electrodes 13 made of Al and having thicknesses of 0.08 wavelength and 0.2 wavelength are formed on a (0°, 131°, 0°) LN thin film 12 (0.15 wavelength thickness)/(0°, θ, 90°) quartz substrate 11; and impedance ratios of acoustic wave resonators obtained for Rayleigh wave by an acoustic wave device 10 in which interdigital transducer electrode made of Al and having a thickness of 0.08 wavelength is formed on a (0°, 38°, 0°) LN thin film 12 (0.15 wavelength thickness)/(0°, θ, 90°) quartz substrate 11. As illustrated in FIG. 24(b), in the case of LSAW, solid lines in the center and above the impedance ratio of 70 dB indicate characteristics without ripples within the bandwidth, whereas dashed lines disposed on both sides and below 70 dB indicate characteristics with ripples. Greater impedance ratios can be obtained when the Al thickness is 0.8 wavelength and θ=90°-155° for quartz and when the Al thickness is 0.2 wavelength and at all of the orientation angles. It is to be appreciated that the Al thickness ranging from 0.06 to 0.09 wavelengths may provide the same impedance ratios as those of the Al thickness of 0.08 wavelength. The Al thickness ranging from 0.09 to 0.22 wavelengths may provide the same impedance ratios as those of the Al thickness of 0.2 wavelength. On the other hand, the Euler angles that allow the TCF of LSAW for the quartz substrate 11 to be positive can be found from FIG. 8(b) as (0°, 123°-180°, 90°±5°) and the Euler angles for the TCF of +5 ppm/° C. can be found as (0°, 126°-180°, 90°±5°). In this case, combining the LT thin film 12 having a negative TCF with the quartz substrate 11 having a positive TCF may substantially improve the TCF of the acoustic wave device 10. Considering the TCFs and impedance ratios from the results of FIGS. 8(b) and 24(b), the Euler angles of the quartz substrate 11 may be preferably (0°, 123°-155°, 90°±5°) and more preferably (0°, 126°-155°, 90°±5°). What is far more preferable is (0°, 127°-155°, 90°±5°) allowing the TCF of the LSAW for quartz to be +7 ppm/° C. or greater. On the other hand, in the case of Rayleigh wave, impedance ratios of 70 dB and 75 dB can be obtained at Euler angles of (0°, 80°-160°, 90°±5°) and (0°, 115°-145°, 90°±5°) respectively. Considering the orientation angles allowing LSAW or Rayleigh wave to indicate a positive TCF, the Euler angles of the quartz substrate 11 may desirably be (0°, 125°-160°, 90°±5°).

Figure 25A:
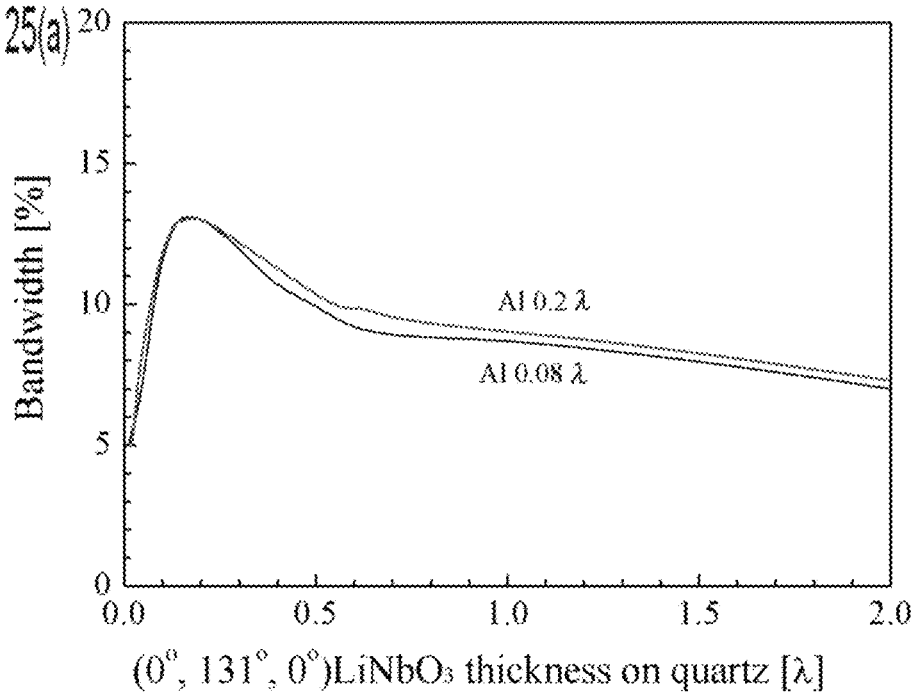
FIGS. 25(a) and 25(b) are graphs illustrating that a bandwidth and an impedance ratio respectively of an acoustic wave resonator having a structure of Al-IDT/(0°, 131°, 0°) LT thin film/(0°, 115°, 90°) quartz substrate can depend on the LT film thickness when the Al thickness is 0.08 wavelength and 0.2 wavelength.
Figure 25B:
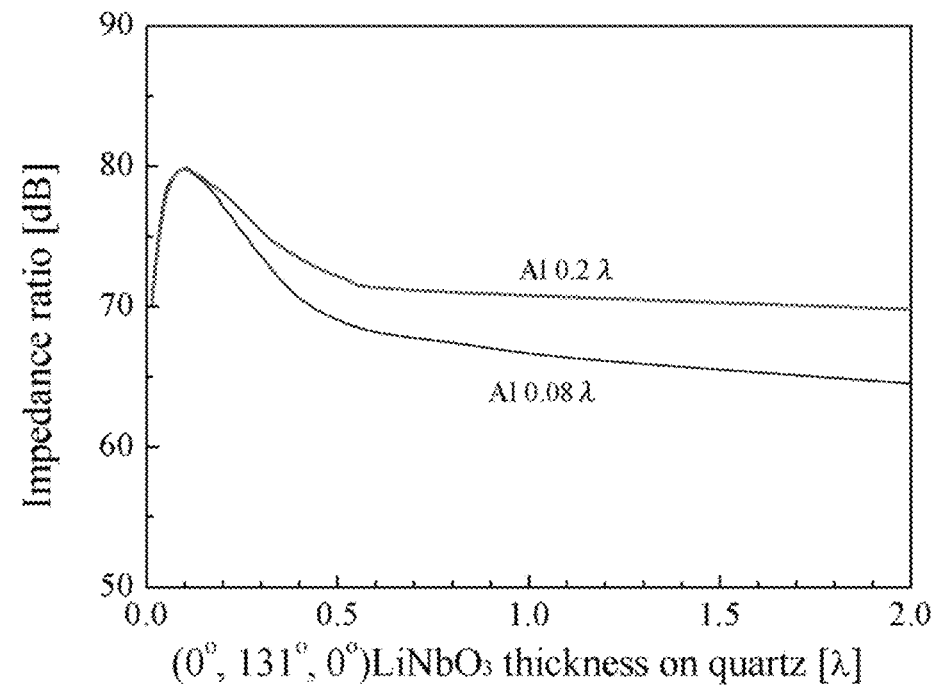

FIGS. 25(a) and 25(b) illustrate that acoustic wave resonator bandwidths and impedance ratios respectively can depend on LN film thicknesses, for acoustic wave devices 10 in which an interdigital transducer electrode 13 made of Al and having thicknesses of 0.08 wavelength and 0.2 wavelength on a (0°, 131°, 0°) LN thin film 12/(0°, 115°, 90°) quartz substrate 11. As illustrated in FIG. 25(a), a bandwidth of 5% or greater is obtained at the LN film thickness of 0.012 wavelength to 2 wavelength. Further, as illustrated in FIG. 25(b), impedance ratios of 70 dB or greater, 73 dB or greater, and 75 dB can be obtained when the Al thickness is 0.08 wavelength at the LN film thicknesses of 0.01 to 0.5 wavelength, 0.02 to 0.33 wavelength, and 0.06 to 0.3 wavelength, respectively. On the other hand, when the Al thickness is 0.2 wavelength, impedance ratios of 70 dB or greater, 73 dB or greater, and 75 dB or greater can be obtained at the LN film thickness of 0.01 to 2 wavelength, 0.02 to 0.43 wavelength, and 0.06 to 0.36 wavelength, respectively.

Figure 26A:
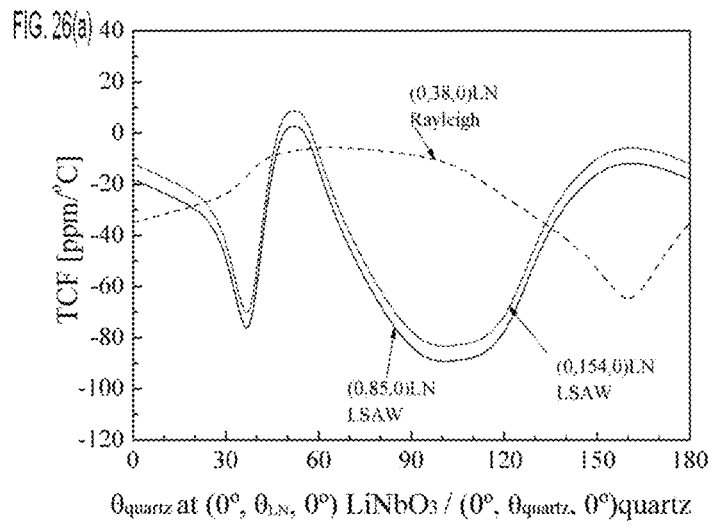
FIGS. 26(a), 26(b) and 26(c) are graphs illustrating that a (0°, $\theta_{LN}$, 0°) LN thin film (0.15 wavelength thickness)/(0°, $\theta_{quartz}$, 0°) quartz substrate structure, a (0°, $\theta_{LN}$, 0°) LN thin film (0.15 wavelength thickness)/(0°, $\theta_{quartz}$, 90°) quartz substrate structure, and a (0°, $\theta_{LN}$, 0°) LN thin film (0.15 wavelength thickness)/(0°, $\theta_{quartz}$, 30°-60°) quartz substrate structure, respectively, can depend on $\theta_{quartz}$ of TCFs when $\theta_{LT}$=38°, 85° and 154°.
Figure 26B:
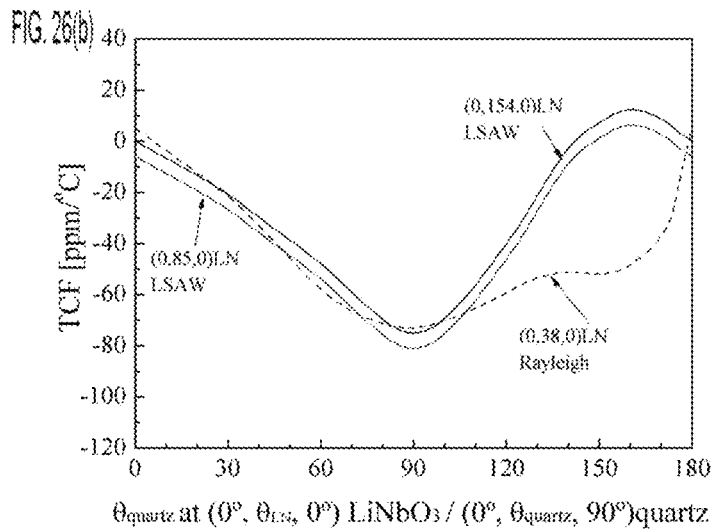
Figure 26C:
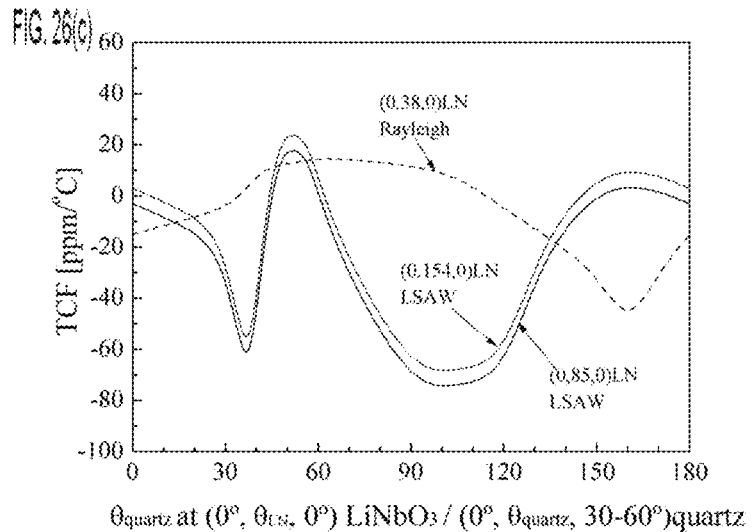

FIGS. 26(a) to 26(c) illustrate $\theta_{quartz}$ dependence of TCFs obtained by a (0°, $\theta_{LN}$, 0°) LN thin film 12 (0.15 wavelength thickness)/(0°, $\theta_{quartz}$, 90°) quartz substrate 11 structure, a (0°, $\theta_{LN}$, 0°) LN thin film 12 (0.15 wavelength thickness)/ (0°, $\theta_{quartz}$, 90°) quartz substrate 11 structure, and a (0°, $\theta_{LN}$, 0°) LN thin film 12 (0.15 wavelength thickness)/(0°, $\theta_{quartz}$, 30°-60°) quartz substrate 11 structure, respectively. The expression "30-60°" of the quartz substrate 11 in FIG. 26(c) refers to a propagation direction. The propagation direction at PFA=0 may vary little by little; however, any propagation direction at PFA=0 falls within the range between 30° and 60°. Illustrated Euler angles for the LN thin film 12 among optimum orientation angles (0°±5°, 75-165°, 0°±5°) are (0°, 154°, 0°) indicating the minimum value of absolute values of TCSs illustrated in FIG. 20(c), (0°, 85°, 0°) indicating the maximum value, and (0°, 38°, 0°) indicating an optimum orientation of Rayleigh wave. As illustrated in FIGS. 26(a) to 26(c), orientation angles that may realize a practical range between –20 ppm/° C. and +20 ppm/° C. are (0°±5°, 0°-16°, 0°±5°), (0°±5°, 42°-64°, 0°±5°), (0°±5°, 138°-180°, 0°±5°), (0°±5°, 0°-30°, 90°±5°), (0°±5°, 130°-180°, 90°±5°), (0°±5°, 0°-28°, 30°-60°), (0°±5°, 42°-70°, 30°-60°), (0°±5°, 132°-180°, 30°-60°) for LSAW. For Rayleigh wave, the orientation angles are (0°±5°, 32°-118°, 0°±5°), (0°±5°, 0°—30°, 90°±5°), (0°±5°, 173°-180°, 90°±5°), and (0°±5°, 0°-142°, 30°-60°). Orientation angles of the quartz substrate 11 that may realize a better range between –10 ppm/° C. and +10 ppm/° C. are (0°±5°, 43°-61°, 0°±5°), (0°±5°, 147°-180°, 0°±5°), (0°±5°, 0°-15°, 90°±5°), (0°±5°, 134°-180°, 90°±5°), (0°±5°, 0°-23°, 30°-60°), (0°±5°, 43°-67°, 30°-60°), and (0°±5°, 137°-180°, 30°-60°) for LSAW. For Rayleigh wave, the orientation angles are (0°±5°, 40°-102°, 0°±5°), (0°±5°, 0°-17°, 90°±5°), (0°±5°, 175°-180°, 90°±5°), (0°±5°, 13°-130°, 30°-60°).

Figure 27:
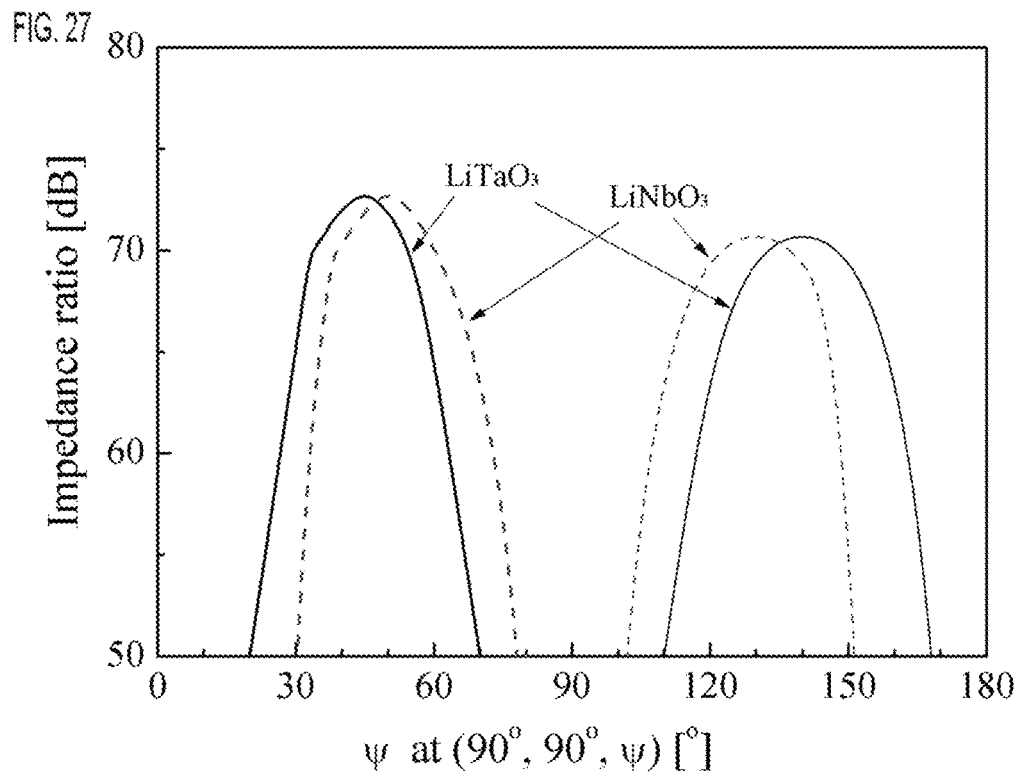
FIG. 27 is a graph illustrating that impedance ratios of longitudinal-wave-type leaky surface acoustic wave resonators having structures of Al-IDT/(90°, 90°, ψ) LT thin film (0.15 wavelength thickness)/(0°, 132.75°, 90°) quartz substrate and Al-IDT/(90°, 90°, ψ) LN thin film (0.15 wavelength thickness)/(0°, 132.75°, 90°) quartz substrate can depend on w.

FIG. 27 illustrates that impedance ratios can depend on ψ at LT, for acoustic wave devices 10 of longitudinal-wave-type leaky surface acoustic wave resonators in which an interdigital transducer electrode 13 made of Al and having a thickness of 0.08 wavelength is formed on a (90°, 90°, ψ) LT thin film 12 (0.15 wavelength thickness)/(0°, 132.75°, 90°) quartz substrate 11 structure, and a (90°, 90°, ψ) LN thin film 12 (0.15 wavelength thickness)/(0°, 132.75°, 90°) quartz substrate 11. As illustrated in FIG. 27, impedance ratios of 70 dB or greater can be obtained for the LT thin film 12 at ψ=33°-55° and 125°-155° and for the LN thin film 12 at ψ=38°-65° and 118°-140°.

[Discussion on Substrates Other than Quartz Substrate]

Figure 28:
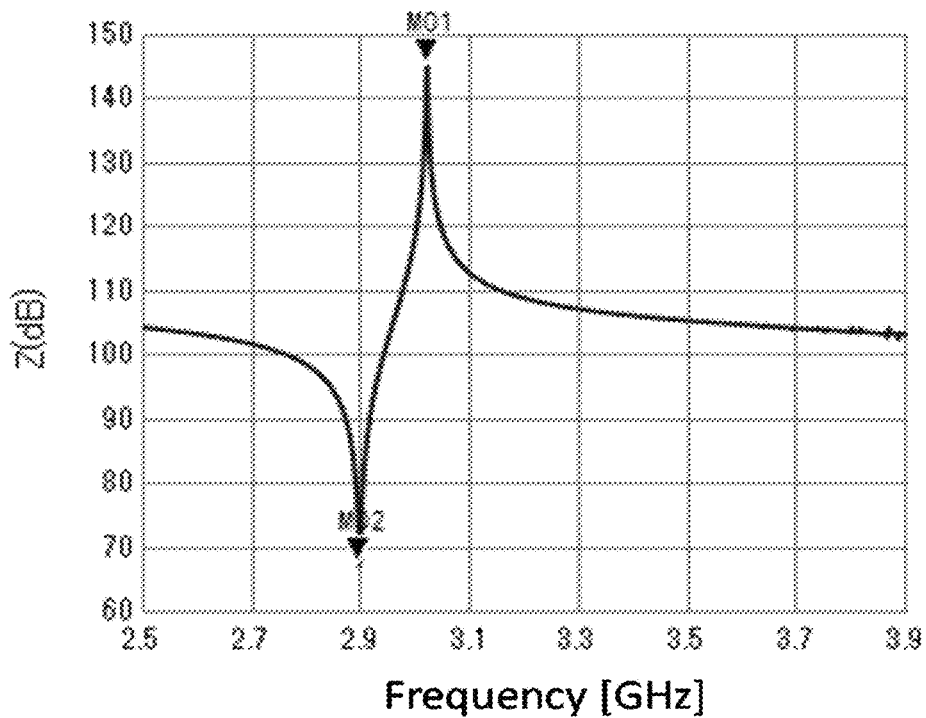
FIG. 28 is a graph illustrating a frequency characteristic of impedance (Z) of an acoustic wave resonator having a structure of Al-IDT/(0°, 110°, 0°) LT thin film (0.15 wavelength thickness)/fused quartz substrate.
Figure 37B:
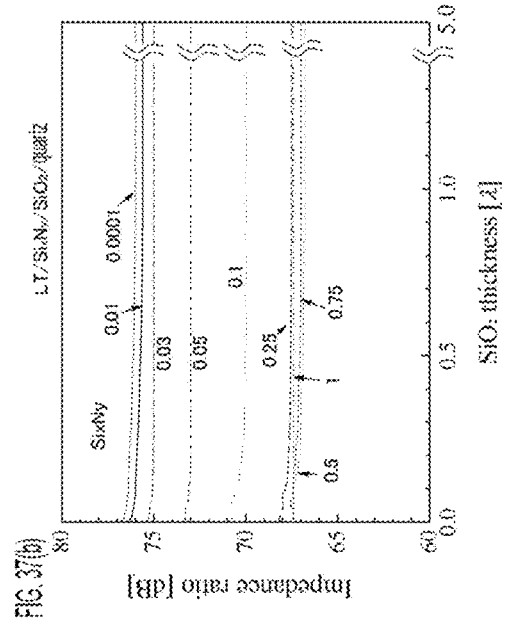
FIGS. 37(a), 37(b), 37(c) and 37(d) are graphs that impedance ratios of acoustic wave resonators having structures of Al-IDT/(0°, 110°, 0°) LT thin film (0.15 wavelength thickness)/SiO$_2$/Si$_x$N$_y$/(0°, 132.75°, 90°) quartz substrate, Al-IDT/(0°, 110°, 0°) LT thin film (0.15 wavelength thickness)/Si$_x$N$_y$/SiO$_2$/(0°, 132.75°, 90°) quartz substrate, Al-IDT/(0°, 110°, 0°) LT thin film (0.15 wavelength thickness)/ZnO/SiO$_2$/(0°, 132.75°, 90°) quartz substrate, and Al-IDT/(0°, 110°, 0°) LT thin film (0.15 wavelength thickness)/Ta$_2$O$_5$/SiO$_2$/(0°, 132.75°, 90°) quartz substrate, respectively, can depend on the SiO$_2$ film thickness.
Figure 37D:
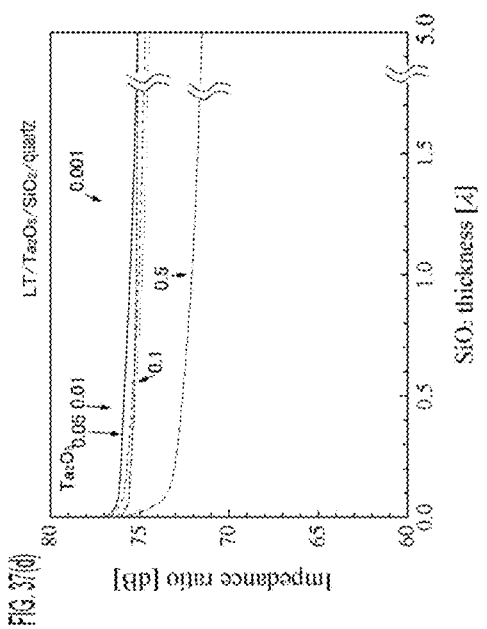
Figure 37A:
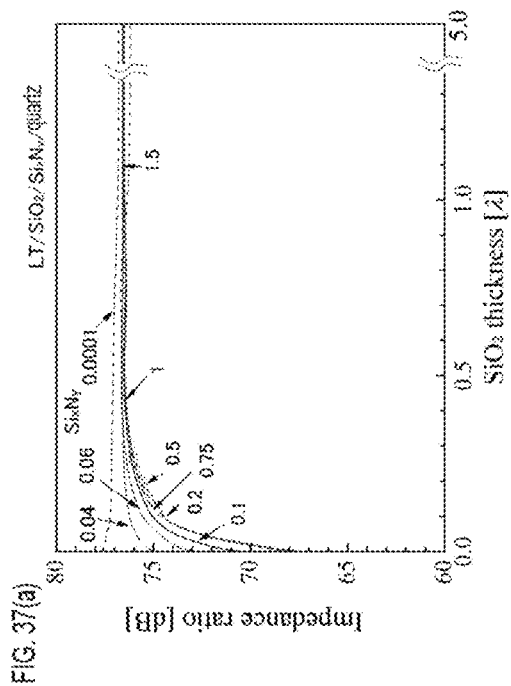
Figure 37C:
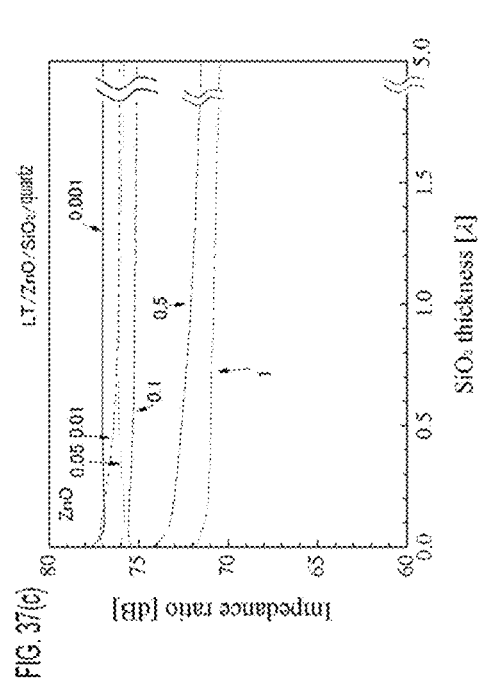

Materials other than quartz to be used for the substrate 11 are discussed below. FIG. 28 illustrates frequency characteristics of impedance (Z) for an acoustic wave device 10 in which a fused quartz substrate is used as a substrate 11 and an interdigital transducer electrode 13 made of Al and having a thickness of 0.08 wavelength is formed on a (0°, 110°, 0°) LT thin film 12 (0.15 wavelength thickness)/fused quartz substrate structure. Also, Table 7 shows constants of various materials used for a thin film of the substrate 11 such as fused quartz. As listed in Table 7, the fused quartz in use contains 100 weight % of $SiO_2$ and has a phase velocity of shear wave of a bulk wave of approximately 3,757 m/s. As illustrated in FIG. 28, a better impedance ratio of 76 dB can be obtained in a fused quartz substrate. As listed in Table 7, the constants of a $SiO_2$ film are the same as those of fused quartz. A film containing SiO is exemplified as a film of SiOF, SiON or the like and indicates a film containing a compound of the formula $SiO_xZ_y$, where Z is a component other than SiO, x/(x+y) is 30% or greater. This film may provide the same characteristics as the $SiO_2$ film.

TABLE 7

| Material | Density (kg/m3) | C33E (Pa) | Longitudinal wave phase velocity (m/s) | Acoustic impedance | C44E (Pa) | Shear wave phase velocity (m/s) | Acoustic impedance | Linear expansion coefficient (/° C.) | SiO2 component |
|---|---|---|---|---|---|---|---|---|---|
| TeO2 | 5990 | 1.058E+11 | 4202.71 | 2.517E+07 | 2.650E+10 | 2103.34 | 1.260E+07 | | 0 |
| Ta2O5 | 8015 | 2.148E+11 | 5176.85 | 4.149E+07 | 5.690E+10 | 2664.43 | 2.136E+07 | | 0 |
| TaN | 14300 | 4.570E+11 | 5653.14 | 8.084E+07 | 1.056E+11 | 2717.46 | 3.886E+07 | | 0 |
| ZnO | 5665 | 2.096E+11 | 6082.69 | 3.446E+07 | 4.230E+10 | 2732.56 | 1.548E+07 | | 0 |
| Silica glass | 2400 | 7.100E+10 | 5439.06 | 1.305E+07 | 2.500E+10 | 3227.49 | 7.746E+06 | | 60% |
| Pyrex | 2230 | 7.270E+10 | 5709.72 | 1.273E+07 | 2.72E+10 | 3494.39 | 7.792E+06 | | 81% |
| Borosilicate glass | 2365 | 7.470E+10 | 5620.11 | 1.329E+07 | 2.930E+10 | 3519.80 | 8.324E+06 | | 82% |
| LN | 4640 | 2.424E+11 | 7227.82 | 3.354E+07 | 5.94E+10 | 3577.95 | 1.660E+07 | 1.54E−05 | 0 |
| LT | 7454 | 2.80E+11 | 6126.74 | 4.567E+07 | 9.68E+10 | 3603.65 | 2.686E+07 | 1.61E−05 | 0 |
| Synthetic quartz | 2200 | 7.820E+10 | 5962.00 | 1.312E+07 | 2.900E+10 | 3630.68 | 7.987E+06 | 4.70E−07 | 99% |
| Fused quartz | 2210 | 7.850E+10 | 5959.90 | 1.317E+07 | 3.120E+10 | 3757.35 | 8.304E+06 | 5.90E−07 | 100% |
| SiO2 film | (Same as those of fused quarts) | | | | | | | | |
| Film consisting primarily of SiO | 2000-2200 | 7.2-7.9E+10 | 5500-6000 | 1.26-1.32E+07 | 2.6-3.2E+10 | 3490-3760 | 7.7-8.4E+07 | | >30% |
| Quartz glass | 2200 | 7.860E+10 | 5977.23 | 1.315E-07 | 3.130E+10 | 3771.91 | 8.298E+06 | 4.70E−07 | 98% |
| Quartz | 2650 | 1.07E+11 | 6360.25 | 1.685E+07 | 5.79E+10 | 4675.91 | 1.239E+07 | 1.04E−05 | 100% |
| Polycrystalline Si | 2331 | 1.865E+11 | 8944.75 | 2.085E+07 | 6.650E+10 | 5341.21 | 1.245E+07 | | 0 |
| TiO2 | 4249 | 4.790E+11 | 10617.55 | 4.511E+07 | 1.232E+11 | 5384.71 | 2.288E+07 | 6.90E−06 | 0 |
| Single crystal Si | 2331 | 1.657E+11 | 8431.21 | 1.965E+07 | 7.960E+10 | 5843.67 | 1.362E+07 | 3.35E−06 | 0 |
| $Si_xN_y$ | 3200 | 3.710E+11 | 10767.43 | 3.446E+07 | 1.130E+11 | 5942.43 | 1.902E+07 | | 0 |
| AlN | 3260 | 3.950E+11 | 11007.53 | 3.588E+07 | 1.180E+11 | 6016.34 | 1.961E+07 | | 0 |
| Sapphire | 3986 | 4.980E+11 | 11177.53 | 4.455E+07 | 1.470E+11 | 6072.81 | 2.421E+07 | 7.10E−06 | 0 |
| Al2O3 (Almina) | 3800 | 4.170E+11 | 10475.54 | 3.981E+07 | 1.460E+11 | 6198.47 | 2.355E+07 | | 0 |
| SiC | 3200 | 4.580E+11 | 11963.49 | 3.828E+07 | 1.85E+11 | 7603.45 | 2.433E+07 | | 0 |

FIG. 29 illustrates that impedance ratios can depend on LT film thicknesses, for acoustic wave devices 10 in which Pyrex glass, borosilicate glass, synthetic quartz, fused quarts, and quartz glass are used as a substrate 11 and an interdigital transducer electrode 13 made of Al and having a thickness of 0.08 wavelength is formed on a (0°, 110°, 0°) LT thin film 12 (0.15 wavelength thickness)/each substrate 11. As illustrated in FIG. 29, a better impedance ratio of 70 dB or greater can be obtained in substrates made of fused quartz, synthetic quartz and quartz glass that have higher rate of $SiO_2$ content when the LT film thickness is 0.52 wavelength or less and also in substrates made of Pyrex glass and borosilicate glass that have rate of $SiO_2$ content of approximately 70 to 80 mass % when the LT film thickness is 0.34 wavelength or less. It is confirmed that, even when an LN thin film is used in place of the LT thin film, similar characteristics can be obtained.

FIG. 30 illustrates that impedance ratios for LSAW can depend on $SiO_2$ film thickness, for acoustic wave devices 10 in which an interdigital transducer electrode 13 made of Al and having a thickness of 0.08 wavelength is formed on a (0°, 110°, 0°) LT thin film 12/$SiO_2$ film/high-phase-velocity substrate and a (0°, 131°, 0°) LN thin film 12/$SiO_2$ film/high-phase-velocity substrate. Merely forming an LT or LN thin film on a high-phase-velocity substrate made of sapphire, alumina ($Al_2\theta_3$), or the like as listed in Table 7 that has a shear wave velocity of 5,900 m/s or greater may result in a poor impedance ratio such as 70 dB or less, which is similar to the example of c-sapphire substrate illustrated in FIG. 6(b). However, further forming a $SiO_2$ film of 0.15 wavelength on a boundary between the high-phase-velocity substrate and the thin film may result in greater impedance ratios of 73 dB for the LT thin film and 78 dB for the LN thin film. Further, greater impedance ratios of 75 dB for the LT thin film and 79 dB for the LN thin film can be obtained when the thickness of the $SiO_2$ film is 0.3 wavelength or greater. Too thick $SiO_2$ film is not preferable because a substrate on which a thicker $SiO_2$ film may be warped. Accordingly, it is desirable for the thickness of the $SiO_2$ film to be 1 wavelength or less, and to be 0.5 wavelength or less if possible.

[Discussion on Interdigital Transducer Electrodes]

Optimum thicknesses and metalization ratios of an interdigital transducer electrode 13 are discussed below. FIGS. 31(a) and 31(b) illustrate that acoustic wave resonator bandwidths and impedance ratios respectively can depend on the thickness of interdigital transducer electrode 13, for acoustic wave devices 10 in which interdigital transducer electrodes 13 made of various materials are formed on a (0°, 110°, 0°) LT thin film 12 (0.15 wavelength thickness)/(0°, 132.75°, 90°) quartz substrate 11 structure. Interdigital transducer electrodes 13 made of Al, Cu, Mo and Pt are used. Further, the metalization ratio of the interdigital transducer electrodes 13 is set to be 0.5.

As illustrated in FIG. 31(a), a bandwidth of 4% or greater can be obtained at an electrode thickness of 0.005 to 0.2 wavelength even when the interdigital transducer electrode 13 is made of any one of the materials. Further, as illustrated in FIG. 31(b), impedance ratios of 70 dB or greater at the electrode thickness of 0.005-0.32 wavelength and 75 dB or greater at 0.005-0.25 wavelength can be obtained, when the interdigital transducer electrode 13 is made of Al having a density of 2,699 kg/m³. Yet further, impedance ratios of 70 dB or greater at the electrode thickness of 0.005-0.20 wavelength, 73 dB or greater at 0.005-0.19 wavelength, and 75 dB or greater at 0.005-0.18 wavelength can be obtained, when the interdigital transducer electrode 13 is made of Cu having a density of 8,930 kg/m³.

Still further, impedance ratios of 70 dB or greater at the electrode thickness of 0.005-0.28 wavelength, 73 dB or greater at 0.005-0.27 wavelength, and 75 dB or greater at 0.005-0.20 wavelength can be obtained, when the interdigital transducer electrode 13 is made of Mo having a density of 10,219 kg/m³. Yet still further, impedance ratios of 70 dB or greater at the electrode thickness of 0.005-0.20 wavelength, 73 dB or greater at 0.005-0.13 wavelength, and 75 dB or greater at 0.005-0.11 wavelength can be obtained, when the interdigital transducer electrode 13 is made of Pt having a density of 21,400 kg/m³.

As above, an optimum thickness may vary depending on the electrode type, and the lower the density is, the broader the range of the optimum thickness to ensure greater impedance ratios. This means that the optimum thickness range may depend on the electrode density. Table 8 shows relationships between the optimum thickness range and the electrode density. In Table 8, "A" indicates conditions for obtaining impedance ratios of 70 dB or greater, "B" indicates conditions for obtaining impedance ratios of 73 dB or greater, and "A" indicates conditions for obtaining impedance ratios of 75 dB or greater. When an alloy or a multi-layer electrode film is used, an average density is derived from the electrode thickness and the theoretical electrode density, and then an optimum electrode thickness can be derived from Table 8 based on the average density. It is confirmed that the relationships listed in Table 8 can be applied when the piezoelectric thin film 12 is made of LN.

TABLE 8

| Density range | Thickness of electrode [wavelength (λ)] | | |
|---|---|---|---|
| (kg/m³) | A | B | C |
| 2000-5000 | 0.005-0.32 | 0.005-0.28 | 0.005-0.25 |
| 5001-9500 | 0.005-0.20 | 0.005-0.19 | 0.005-0.18 |
| 9501-15000 | 0.005-0.28 | 0.005-0.27 | 0.005-0.20 |
| 15001-220000 | 0.005-0.20 | 0.005-0.13 | 0.005-0.11 |

FIGS. 32(*a*) and 32(*b*) illustrate that acoustic wave resonator bandwidths and impedance ratios respectively can depend on electrode metalization ratios, for acoustic wave devices 10 in which interdigital transducer electrodes 13 of respective materials on a (0°, 110°, 0°) LT thin film 12 (0.15 wavelength thickness)/(0°, 132.75°, 90°) quartz substrate 11 structure. Optimum film thicknesses derived from FIG. 31(*b*) are set for respective interdigital transducer electrodes 13. In other words, the electrode thicknesses are set to be 0.08 wavelength when the interdigital transducer electrode 13 is made of Al, 0.045 wavelength for Cu, 0.05 wavelength for Mo, and 0.03 wavelength for Pt.

As illustrated in FIG. 32(*a*), the broadest bandwidth is obtained where the metalization ratio is slightly below 0.5 even when the interdigital transducer electrode 13 is made of any one of the materials. Further, as illustrated in FIG. 32(*b*), a metalization ratio allowing the impedance ratio to be higher, i.e., the optimum metalization ratio, may vary depending on the electrode type. Table 9 shows relationships between the optimum metalization ratio and the electrode density. In Table 9, "A" indicates conditions for obtaining higher impedance ratios (approximately 75.5 dB or greater), "B" indicates conditions for obtaining far higher impedance ratios (approximately 76.5 dB or greater), and "C" indicates conditions for obtaining the highest impedance ratios (approximately 77.5 dB or greater). When an alloy or a multi-layer metalization ratio film is used, an average density is derived from the electrode thickness and the theoretical electrode density, and then an optimum metalization ratio can be derived from Table 9 based on the average density. It is confirmed that the relationships listed in Table 9 can be applied when the piezoelectric thin film 12 is made of LN.

TABLE 9

| Density range | Electrode metalization ratio | | |
|---|---|---|---|
| (kg/m³) | A | B | C |
| 2000-5000 | 0.15-0.63 | 0.27-0.58 | 0.32-0.48 |
| 5001-9500 | 0.15-0.63 | 0.24-0.53 | 0.3-0.48 |
| 9501-15000 | 0.15-0.71 | 0.20-0.6 | 0.32-0.48 |
| 15001-220000 | 0.15-0.65 | 0.21-0.54 | 0.27-0.48 |

[Alternative Examples of Arrangements of Quartz Substrate, Piezoelectric Thin Film, Interdigital Transducer Electrode, and Shunt Electrode]

Although FIG. 1(*b*) illustrates the acoustic wave device 10 of a structure having an IDT (interdigital transducer electrode) 13/piezoelectric thin film 12/quartz substrate 11 structure, other structures can be considered as illustrated in FIGS. 33(*a*) to 33(*d*) including a shunt electrode 32. It is to be appreciated that FIGS. 33(*a*) to 33(*d*) illustrate examples where the piezoelectric thin film 12 is made of LiTaO₃ crystal (LT) and the substrate 11 is made of quartz. FIG. 33(*a*) illustrates a structure that has an IDT 13/piezoelectric thin film 12 (LT)/substrate 11 and the same structure as that of FIG. 1(*b*). FIG. 33(*b*) illustrates an IDT 13/piezoelectric thin film 12 (LT)/shunt electrode 32/substrate 11 structure. FIG. 33(*c*) illustrates piezoelectric thin film 12 (LT)/IDT 13/substrate 11 structures in which the IDT 13 is embedded in the substrate 11 (upper portion) and embedded in the piezoelectric thin film 12 (lower portion). FIG. 33(*d*) illustrates piezoelectric thin film 12 (LT)/IDT 13/substrate 11 structures in which the IDT 13 is embedded in the substrate 11 (upper portion) and embedded in the piezoelectric thin film 12 (lower portion).

FIGS. 34(*a*) and 34(*b*) illustrate that acoustic wave resonator bandwidths and impedance ratios respectively obtained by acoustic wave devices 10 having structures of four types as illustrated in FIGS. 33(*a*) to 33(*d*) can depend on LT film thicknesses. Here, the piezoelectric thin film 12 is a (0°, 110°, 0°) LT thin film, the quartz substrate 11 is a (0°, 132.75°, 90°) quartz substrate, and the IDT 13 is an Al electrode having a thickness of 0.08 wavelength. It is to be appreciated that the shunt electrode 31 is provided as thin electrode surfaces to cover the entire surface of the quartz substrate 11 and the piezoelectric thin film 12 and all the electrode surfaces are electrically short-circuited. Further, the shunt electrode 31 may be a floating electrode having no connection with the IDT 13.

As illustrated in FIG. 34(*a*), the broadest bandwidth is obtained by the IDT/LT/quartz structure of FIG. 33(*a*) no matter how the LT film thickness is. Further, as illustrated in FIG. 34(*b*), greater impedance ratios are obtained by the IDT/LT/quartz structure of FIG. 33(*a*) and the IDT/LT/shunt electrode/quartz structure of FIG. 33(*b*). It is to be appreciated that, although a bandwidth to be required varies according to an application, a greater impedance ratio would be better because such an impedance ratio may largely affect the mechanical Q. Accordingly, it is considered that even the structure illustrated in FIG. 33(*b*) may result in an effect similar to what is achieved under the same structural condition as illustrated in FIG. 33(*a*).

Further, as illustrated in FIG. 35, the acoustic wave device 10 may have either the structure of the IDT 13 entirely embedded in the piezoelectric thin film 12, or the structure of the lower portion embedded in the piezoelectric thin film 12 and the upper portion protruded from the piezoelectric thin film 12. FIG. 35 illustrates that impedance ratios obtained by the two structures as mentioned above and the structure of FIG. 33(a) can depend on film thicknesses of the piezoelectric thin film 12. Here, the piezoelectric thin film 12 is a (0°, 110°, 0°) LT thin film, the quartz substrate 11 is a (0°, 132.75°, 90°) quartz substrate, and the IDT 13 is an Al electrode having a thickness of 0.08 wavelength. As illustrated in FIG. 35, impedance ratios are obtained in any one of the structures at the LT film thickness of 0.5 wavelength or less. Further, as illustrated in FIG. 35, the structure of the IDT 13 being embedded in the piezoelectric thin film 12 may allow for a higher phase velocity and is thought to be advantageous for higher frequencies as compared with the structure having no embedding.

[Alternative Examples Having Boundary Films]

As illustrated in FIG. 1(c), the acoustic wave device 10 may include an insulating boundary film 32 between the quartz substrate 11 and the piezoelectric thin film 12. The boundary film 32 may preferably be made of a hard material having lower sound absorbency such as tantalum pentoxide ($Ta_2O_5$), zinc oxide (ZnO), silicon dioxide ($SiO_2$), polycrystalline Si, silicon nitride ($Si_xN_y$, where x and y are integers), and the like.

FIGS. 36(a) to 36(c) illustrate that acoustic wave resonator phase velocities, bandwidths and impedance ratios respectively can depend on film thicknesses of the boundary film 32, for acoustic wave devices 10 in which an interdigital transducer electrode 13 made of Al and having a thickness of 0.08 wavelength is formed on a (0°, 110°, 0°) LT thin film 12 (0.15 wavelength thickness)/boundary film 32/(0°, 132.75°, 90°) quartz substrate 11. Tantalum pentoxide (Ta2O5), zinc oxide (ZnO), silicon dioxide (SiO2), polycrystalline Si, and silicon nitride (SixNy, where x and y are integers) are used for the boundary film 32. Table 7 shows material constants of the boundary films 32 in use. It is to be appreciated that Table 7 also shows material constants that are not discussed here but can be used for the boundary films 32.

As illustrated in FIGS. 36(a) to 36(c), when the boundary film 32 is made of $Ta_2O_5$ or ZnO in which a bulk shear wave phase velocity $[(C_{44}^E/density)^{1/2}]$ is considerably slower than the phase velocity of quartz, the phase velocity of SAW drastically decreases, the bandwidth drastically narrows, and the impedance ratio drastically decreases, as the film thickness of the boundary film 32 increases. Further, when the boundary film 32 is made of $Si_xN_y$ in which the shear wave phase velocity is faster, the phase velocity of SAW increases, the bandwidth slightly decreases, and the impedance ratio slightly decreases, as the film thickness of the boundary film 32 increases. Further, when the boundary film 32 is made of polycrystalline Si or $SiO_2$ in which the shear wave phase velocity is close to the phase velocity of quartz, the phase velocity of SAW slightly varies and the bandwidth slightly narrows as the thickness of the boundary film 32 increases, whereas the impedance ratio is not regarded as having a large variation until the boundary film 32 reaches a thickness of three wavelengths. Especially when made of $SiO_2$ having a positive TCF, the boundary film 32 is effective in improving the TCF. The TCF is improved by +5 ppm/° C. at the $SiO_2$ film of 0.1 wavelength or greater, and by +10 ppm/° C. at the $SiO_2$ film of 0.2 wavelength or greater. Further, the same TCF can be obtained even when the orientation angle θ of quartz is shifted approximately ±10°. In addition, as illustrated in FIG. 36(c), there is no deterioration in the impedance ratio when the $SiO_2$ film is below 1.2 wavelength. Further, as illustrated in FIG. 36(b), the bandwidth presents no decrease and thus the bandwidth of 94% can be ensured even at 0.5 wavelength when the $SiO_2$ film is below 0.3 wavelength. Further, the same characteristics as those of $SiO_2$ can be obtained even by a $SiO_xZ_y$ film formed primarily of SiO as mentioned above.

Table 7 and FIG. 36 indicate that the relationship between the boundary film 32 and its optimum thickness depends on the bulk shear wave phase velocity. According to the characteristics of the acoustic wave device 10 using the boundary film 32, a greater impedance ratio can be obtained substantially regardless of the bulk shear wave phase velocity when the boundary film 32 has a thickness of 0.34 wavelength or less as illustrated in FIG. 36(c). However, when the thickness is greater than the above amount, the optimum thickness of the boundary film 32 largely depends on the bulk shear wave phase velocity of the boundary film 32. Further, a greater impedance ratio can obtained when the thickness of the boundary film 32 is 0.13 wavelength or less, and a far greater impedance ratio can be obtained when the thickness of the boundary film 32 is 0.04 wavelength or less.

Table 10 shows relationships between the shear wave phase velocity of the boundary film 32 and the optimum film thickness of the boundary film 32. In Table 10, "A" indicates conditions for obtaining higher impedance ratios (approximately 70 dB or greater), "B" indicates conditions for obtaining far higher impedance ratios (approximately 73 dB or greater), and "C" indicates conditions for obtaining the highest impedance ratios (approximately 75 dB or greater). It is confirmed that the relationships listed in Table 10 can be applied when the piezoelectric thin film 12 is made of LN.

TABLE 10

| Sear wave phase velocity | Thickness T [wavelength] | | |
|---|---|---|---|
| Vs (m/s) | A | B | C |
| 1500 <= Vs1 <= 2200 | 0 < T <= 0.5 | 0 < T <= 0.22 | 0 < T <= 0.12 |
| 2200 < Vs2 <= 3400 | 0 < T <= 0.67 | 0 < T <= 0.54 | 0 < T <= 0.23 |
| 3400 < Vs3 <= 5900 | 0 < T <= 3 | 0 < T <= 3 | 0 < T <= 3 |
| 5900 < Vs4 <= 13000 | 0 < T <= 0.6 | 0 < T <= 0.22 | 0 < T <= 0.12 |

[Alternative Examples with Multiple Boundary Films]

The case where the boundary layer 32 has two layers is discussed below. For an acoustic wave device 10 in which an interdigital transducer electrode 13 made of Al and having a thickness of 0.08 wavelength is formed on a (0°, 110°, 0°) LT thin film 12 (0.15 wavelength thickness)/first layer of boundary film 32/second layer of boundary film 32/(0°, 132.75°, 90°) quartz substrate 11, how the resonator impedance ratio can depend on the film thicknesses of the first and second layers of the boundary film 32 is evaluated. Then, materials of four types having different shear wave phase velocities listed in Table 10 are classified respectively as Vs1, Vs2, Vs3 and Vs4 and the evaluation is made to two of them that are variously combined as the first and second layers of the boundary film 32. Also, cases where Vs1 is $Ta_2O_5$, Vs2 is ZnO, Vs3 is $SiO_2$, and Vs4 is $Si_xN_y$ are examined.

Among the examination results, FIGS. 37(a) to 37(d) illustrate the results of film thickness dependence of Vs3 ($SiO_2$) film where the first and second layers are assumed as Vs3 and Vs4 films, Vs4 and Vs3 films, Vs2 and Vs3 films, and Vs1 and Vs3 films, respectively. Each of the numerical values shown in each figure indicates a film thickness (wavelength) of the one other than Vs3 of the layers of the boundary film 32. Also, Table 11 shows relationships between the combination of the first and second layers of the boundary film 32 and an optimum total film thickness derived from these examination results. In Table 11, "A" indicates conditions for obtaining higher impedance ratios (approximately 70 dB or greater), "B" indicates conditions for obtaining far higher impedance ratios (approximately 73 dB or greater), and "C" indicates conditions for obtaining the highest impedance ratios (approximately 75 dB or greater). In order to obtain better impedance ratios, the first layer of the boundary film 32 must satisfy the conditions listed in Table 10 and the total film thickness of the first and second layers must satisfy the conditions listed in Table 11. It is to be appreciated that, as illustrated in FIGS. 37(*a*) to 37(*d*), impedance ratios of 75 dB or greater can be obtained when the $SiO_2$ film is 1.5 wavelength or less by appropriately selecting the type and the thickness of the first layer when the second layer is the $SiO_2$ film.

TABLE 11

Cases of two layers

| Combination of first | | Total film thickness T [wavelength] | | |
|---|---|---|---|---|
| and second layers | | A | B | C |
| Vs1 | Vs2 | 0 < T <= 1.17 | 0 < T <= 0.76 | 0 < T <= 0.35 |
| Vs1 | Vs3 | 0 < T <= 3.5 | 0 < T <= 3.22 | 0 < T <= 3.12 |
| Vs1 | Vs4 | 0 < T <= 1.1 | 0 < T <= 0.44 | 0 < T <= 0.24 |
| Vs2 | Vs3 | 0 < T <= 3.67 | 0 < T <= 3.54 | 0 < T <= 3.23 |
| Vs2 | Vs4 | 0 < T <= 1.27 | 0 < T <= 0.76 | 0 < T <= 0.35 |
| Vs3 | Vs4 | 0 < T <= 3.6 | 0 < T <= 3.22 | 0 < T <= 3.12 |

Next, the case where the boundary layer 32 has three layers is discussed below. For an acoustic wave device 10 in which an interdigital transducer electrode 13 made of Al and having a thickness of 0.08 wavelength is formed on a (0°, 110°, 0°) LT thin film 12 (0.15 wavelength thickness)/first layer of boundary film 32/second layer of boundary film 32/third layer of boundary film 32/(0°, 132.75°, 90°) quartz substrate 11, how the resonator impedance ratio can depend on the film thickness of the third layer of the boundary film 32 is evaluated. Then, materials of four types having different shear wave phase velocities listed in Table 10 are classified respectively as Vs1, Vs2, Vs3 and Vs4 and the evaluation is made to three of them that are variously combined as the first, second, and third layers of the boundary film 32. Also, cases where Vs1 is $Ta_2O_5$, Vs2 is ZnO, Vs3 is $SiO_2$, and Vs4 is $Si_xN_y$, are examined.

Among the examination results, FIG. 38(*a*) illustrates the results where the first layer of the boundary film 32 is Vs3 (0.1 wavelength thickness), the second layer is Vs4 (0.1 wavelength thickness), and the third layer is Vs1, Vs2, Vs3, or Vs4. As illustrated in FIG. 38(*a*), impedance ratios of 70 dB or greater can be obtained when the third layer is Vs1 ($Ta_2O_5$) film or Vs2 (ZnO) film and has a thickness of 1 wavelength or less, and impedance ratios of approximately 75 dB can be obtained when the third layer is Vs3 ($SiO_2$) film or Vs4 ($Si_xN_y$) film and has a thickness of 5 wavelength or less.

Also, among the examination results, FIG. 38(*b*) illustrates the results where the first layer of the boundary film 32 is Vs4 (0.01 wavelength thickness), the second layer is Vs3 (0.1 wavelength thickness), and the third layer is Vs1, Vs2, Vs3, or Vs4. As illustrated in FIG. 38(*b*), impedance ratios of 70 dB or greater can be obtained when the third layer is Vs1 ($Ta_2O_5$) film or Vs2 (ZnO) film and has a thickness of 1 wavelength or less, and impedance ratios of approximately 73 dB can be obtained when the third layer is Vs3 ($SiO_2$) film or Vs4 ($Si_xN_y$) film and has a thickness of 5 wavelength or less.

Also, Table 12 shows relationships between the combination of the first to third layers of the boundary film 32 and an optimum total film thickness derived from these examination results. In Table 12, "A" indicates conditions for obtaining higher impedance ratios (approximately 70 dB or greater), and "B" indicates conditions for obtaining far higher impedance ratios (approximately 73 dB or greater). In order to obtain better impedance ratios, the first layer of the boundary film 32 must satisfy the conditions listed in Table 10 and the total film thickness of the first to third layers must satisfy the conditions listed in Table 12. It is to be appreciated that, even when the boundary film 32 includes four or more layers, the first layer needs to satisfy the conditions of Table 10.

It is to be appreciated that the constants of the materials for deriving the phase velocity and the like are based on publicly published constants. In addition, in the case of mixed film in which the thin film has two or more films, arithmetic average of respective films may be used.

It is to be appreciated that, as illustrated in FIGS. 38(*a*) and 38(*b*), impedance ratios of 75 dB or greater can be obtained when the $SiO_2$ film is 1.5 wavelength or less by appropriately selecting the type and the thickness of the layer other than the $SiO_2$ film when the first or second layer is the $SiO_2$ film.

TABLE 12

Cases of three layers

| Combination of first, second and third layers | | | Total film thickness of first, second and third layers T [wavelength] | |
|---|---|---|---|---|
| | | | A | B |
| Vs1 | Vs2 | Vs1 | 0 < T <= 1.67 | 0 < T <= 0.98 |
| Vs1 | Vs2 | Vs3 | 0 < T <= 4.17 | 0 < T <= 3.76 |
| Vs1 | Vs2 | Vs4 | 0 < T <= 1.77 | 0 < T <= 0.98 |
| Vs1 | Vs3 | Vs1 | 0 < T <= 4.00 | 0 < T <= 3.44 |
| Vs1 | Vs3 | Vs4 | 0 < T <= 4.17 | 0 < T <= 3.44 |
| Vs1 | Vs4 | Vs1 | 0 < T <= 1.6 | 0 < T <= 0.66 |
| Vs2 | Vs1 | Vs2 | 0 < T <= 1.84 | 0 < T <= 1.3 |
| Vs2 | Vs3 | Vs2 | 0 < T <= 4.34 | 0 < T <= 4.08 |
| Vs2 | Vs3 | Vs4 | 0 < T <= 4.27 | 0 < T <= 3.76 |
| Vs3 | Vs1 | Vs3 | 0 < T <= 6.5 | 0 < T <= 6.22 |
| Vs3 | Vs2 | Vs3 | 0 < T <= 6.67 | 0 < T <= 6.54 |
| Vs3 | Vs4 | Vs3 | 0 < T <= 6.6 | 0 < T <= 6.22 |
| Vs4 | Vs1 | Vs4 | 0 < T <= 1.70 | 0 < T <= 0.66 |
| Vs4 | Vs2 | Vs4 | 0 < T <= 1.87 | 0 < T <= 0.98 |
| Vs4 | Vs3 | Vs4 | 0 < T <= 4.20 | 0 < T <= 3.44 |

[Discussion on Cases where Higher Order Modes of Surface Acoustic Waves are Used]

Figure 39:
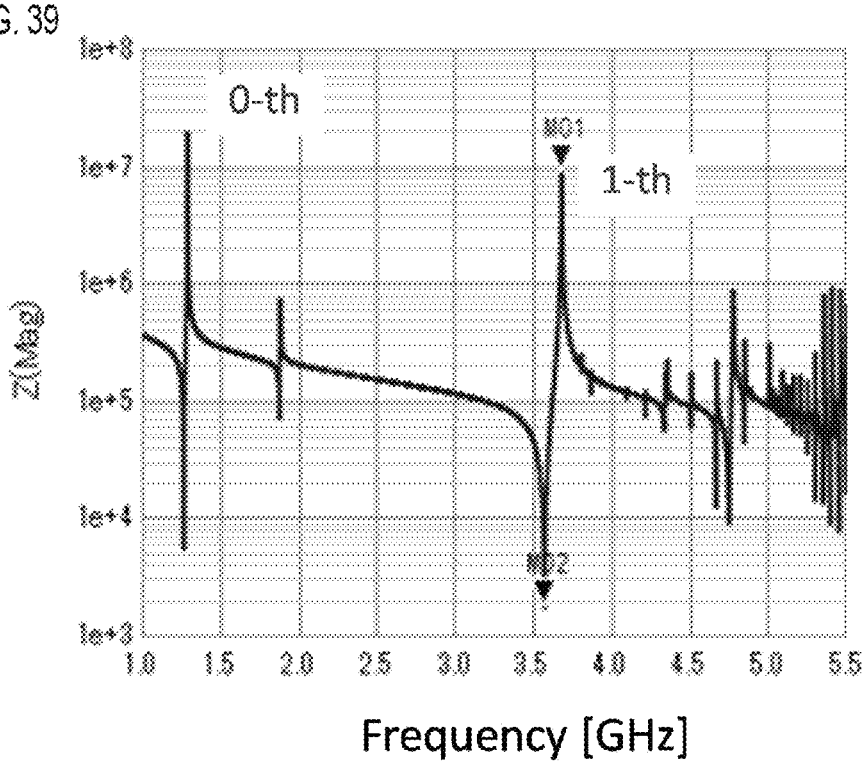
FIG. 39 is a graph illustrating a frequency characteristic of impedance (Z) of an acoustic wave resonator having a structure of Al-IDT/(0°, 110°, 0°) LN thin film (0.15 wavelength thickness)/(0°, 132.75°, 90°) quartz substrate.

The case where higher order modes of surface acoustic waves are used is discussed below. FIG. 39 illustrates frequency characteristics of impedance (Z) for an acoustic wave device 10 in which an interdigital transducer electrode 13 made of Al and having a thickness of 0.6 wavelength is formed on a (0°, 110°, 0°) LT thin film 12 (0.15 wavelength thickness)/(0°, 132.75°, 90°) quartz substrate 11 structure. As illustrated in FIG. 39, it is confirmed that a basic mode (0-th) exists at 1.25 GHz and its higher mode (1-th) exists at 3.6 GHz.

Figure 40:
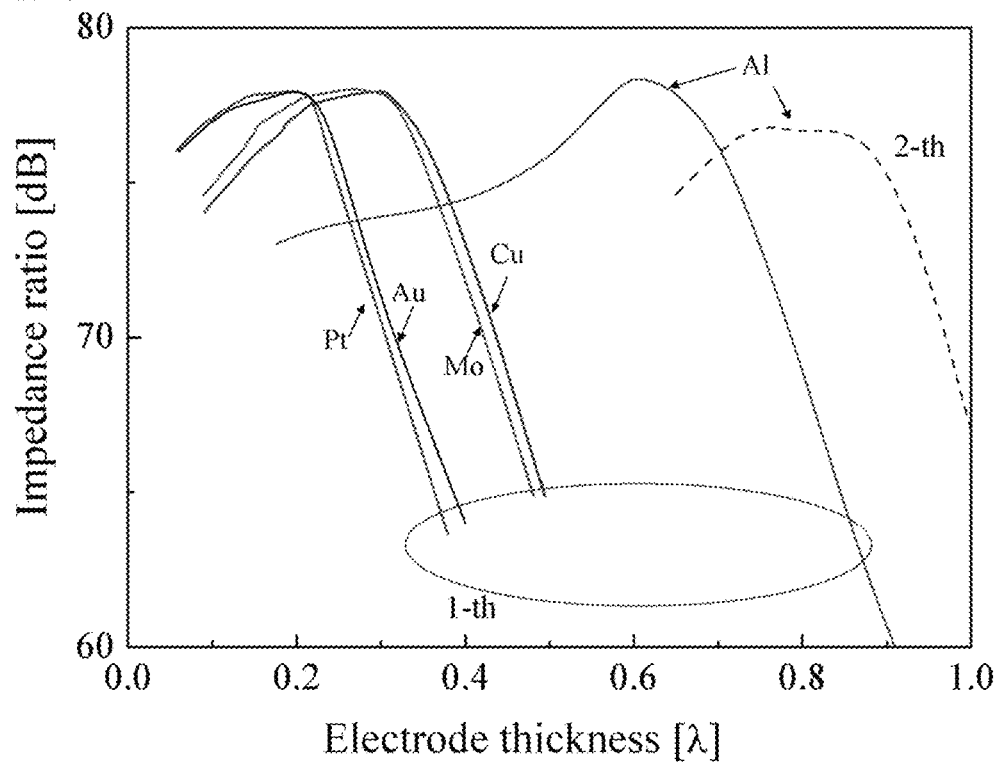
FIG. 40 is a graph illustrating that impedance ratios in higher order modes of acoustic wave resonators having structures of various IDTs/(0°, 110°, 0°) LT thin film (0.15 wavelength thickness)/(0°, 132.75°, 90°) quartz substrate can depend on the thickness of the interdigital transducer electrodes (electrode thickness) made of various materials.

FIG. 40 illustrates relationships between the impedance ratios and the electrode thicknesses of acoustic wave devices 10 in higher order modes for interdigital transducer electrodes 13 made of various materials. In this case, the acoustic wave devices 10 use interdigital transducer electrodes 13 of various type having a thickness of 0.6 wavelength formed on a (0°, 110°, 0°) LT thin film 12 (0.15 wavelength thickness)/(0°, 132.75°, 90°) quartz substrate 11 structure. As illustrated in FIG. 40, the optimum thickness may vary depending on the electrode type, and the lower the electrode density is, the broader the optimum thickness ranges to allow for greater impedance ratios and the greater the optimum thickness is. Table 13 shows relationships between the optimum thickness range and the electrode density. Table 13 refers to the case where the metalization ratio of the interdigital transducer electrode 13 is 0.5.

TABLE 13

| Density range (kg/m$^3$) | Relevant electrode example | Suitable electrode thickness [wavelength] |
| --- | --- | --- |
| 2000-5000 | Al, Ti | 0.17-0.8 |
| 5001-9500 | Cu, Ni | 0.08-0.44 |
| 9501-15000 | Mo, Ag | 0.08-0.43 |
| 15000-220000 | Au, Pt | 0.06-0.4 |

When an alloy or a multi-layer electrode film is used as the interdigital transducer electrode 13, an average density is derived from the electrode thickness and the theoretical electrode density, and then an optimum electrode thickness can be derived from Table 13 based on the average density. In addition, when the metalization ratio is 0.25 for example, the electrode thickness to be considered can be twice as that of Table 13 because Table 13 refers to the case where the metalization ratio is 0.5 and the electrode thickness can be calculated as 0.5/0.25=2.

Figure 41:
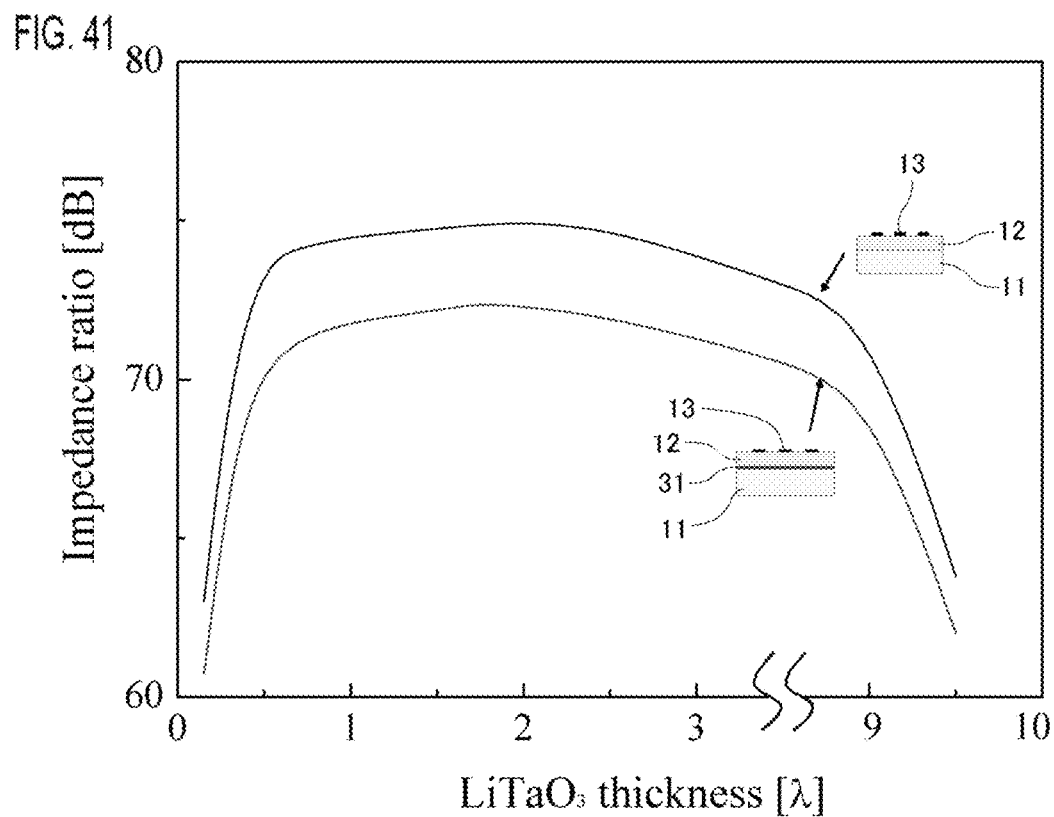
FIG. 41 is a graph illustrating that impedance ratios of acoustic wave resonators having structures of Au-IDT/(0°, 110°, 0°) LT thin film/(0°, 132.75°, 90°) quartz substrate, and Au-IDT/(0°, 110°, 0°) LT thin film/shunt electrode/(0°, 132.75°, 90°) quartz substrate can depend on the LT film thickness.

The thickness of the piezoelectric thin film 12 is discussed for the case where a higher order mode of surface acoustic wave is used. FIG. 41 illustrates that impedance ratios can depend on film thicknesses of the piezoelectric thin film 12 for acoustic wave devices 10 having an IDT 13/piezoelectric thin film 12/quartz substrate 11 structure as illustrated in FIG. 33(a) and an IDT 13/piezoelectric thin film 12/shunt electrode 31/quartz substrate 11 structure. Here, the piezoelectric thin film 12 is a (0°, 110°, 0°) LT thin film, the quartz substrate 11 is a (0°, 132.75°, 90°) quartz substrate, and the IDT 13 is an Au electrode having a thickness of 0.2 wavelength. As illustrated in FIG. 41, impedance ratios of 70 dB or greater can be obtained at the LT film thickness of 0.35-9.3 wavelength when the structure of FIG. 33(a) having no shunt electrode 31, and at the LT film thickness of 0.5-9 wavelength when the structure of FIG. 33(b) having the shunt electrode 31. It is confirmed that, even when an LN thin film is used in place of the LT thin film, similar characteristics are obtained.

Figure 42A:
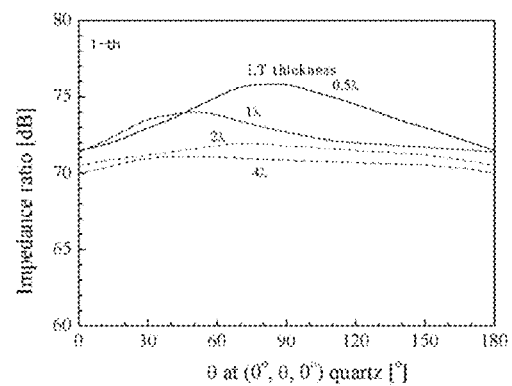
FIGS. 42(a) and 42(b) are graphs illustrating that impedance ratios of acoustic wave resonators having structures of Al-IDT/(0°, 110°, 0°) LT thin film/(0°, θ, 0°) quartz substrate and Al-IDT/(0°, 110°, 0°) LT thin film/(0°, θ, 90°) quartz substrate, respectively, can depend on θ in a higher mode (1-th) for various LT film thickness.
Figure 42B:
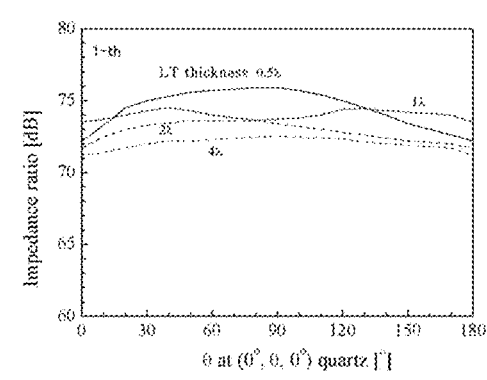

FIGS. 42(a) and 42(b) illustrate that acoustic wave resonator impedance ratios in a higher order mode (1-th) can depend on θ at quartz substrate 11 for acoustic wave devices 10 in which an interdigital transducer electrode 13 made of Au is formed on a (0°, 110°, 0°) LT thin film 12/(0°, θ, 0°) quartz substrate 11 (FIG. 42(a)) and a (0°, 110°, 0°) LT thin film 12/(0°, θ, 90°) quartz 11 (FIG. 42(b)), respectively. Here, the LT thickness is set to include four types, i.e., 0.5 wavelength (λ), 1λ, 2λ and 4λ. Further, the thickness of the interdigital transducer electrode 13 is set to be 0.2λ.

As illustrated in FIGS. 42(a) and 42(b), impedance ratios of approximately 70 dB or greater can be obtained across almost all the angles of θ when the LT film thickness is 0.5-4λ. This is thought to be because, similar to the case of the basic mode, the Au thickness of the interdigital transducer electrode 13 is 0.2λ and relatively thick even if the LT film thickness is thicker.

[Methods of Manufacturing Acoustic Wave Devices According to Embodiments of the Present Invention]

Figure 43:
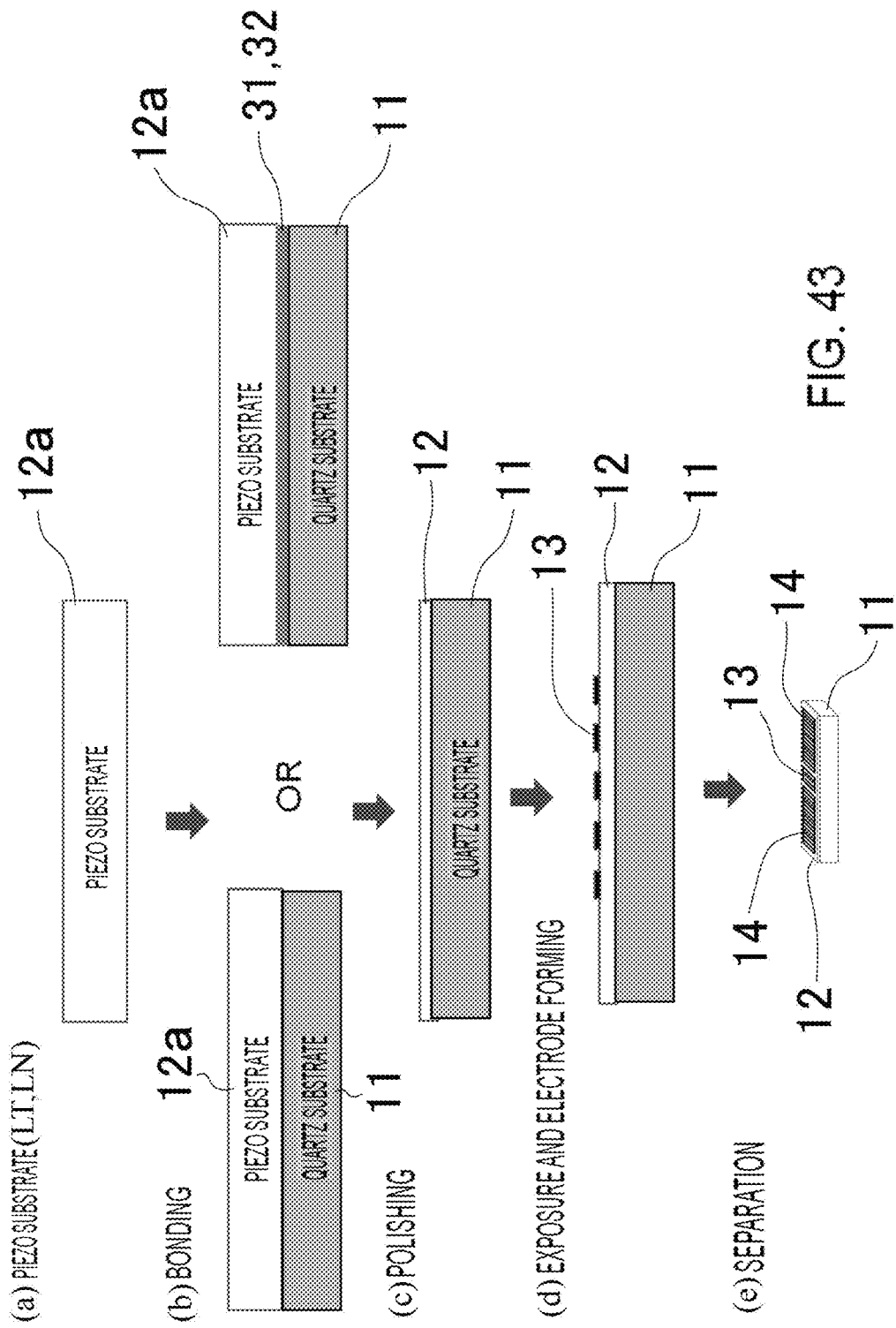
FIG. 43 illustrates side elevation views representing a method of manufacturing an acoustic wave device according to an embodiment of the present invention.

As illustrated in FIG. 43, the acoustic wave device 10 can be manufactured as discussed below. First, a piezoelectric substrate 12a having LT or LN is prepared (see FIG. 43(a)), and the piezoelectric substrate 12a is bonded on a quartz substrate 11 (see left-handed portion of FIG. 43(b)). Alternatively, when a shunt electrode 31 or a boundary film 32 is formed between the piezoelectric substrate 12a and the quartz substrate 11, the shunt electrode 31 or the boundary film 32 is bonded on the quartz substrate 11 and then the piezoelectric substrate 12a is bonded thereon (see right-handed portion of FIG. 43(b)). Respective substrates and films may be bonded using adhesives, whereas these may be bonded by a process of activating a bonding surface with plasma or the like, which is known as a direct bonding process.

After the bonding process, the piezoelectric substrate 12a is polished to be a thin film (piezoelectric thin film 12) (see FIG. 43(c)). An electrode film made of Al or the like is formed on the surface of the piezoelectric thin film 12 and a resist is applied thereon. Then, the resist is removed via a patterning (exposing and developing) and etching processes such that an interdigital transducer electrode 13 and reflectors 14 are formed (see FIG. 43(d)). Thereafter, unnecessary portions are removed and the acoustic wave device 10 is manufactured (see FIG. 43(e)). It is to be appreciated that, although FIGS. 43(c) to 43(e) illustrate the processes corresponding to the left-handed portion of FIG. 43(b), the acoustic wave device 10 including the shunt electrode 31 or the boundary film 32 between the quartz substrate 11 and the piezoelectric thin film 12 may be manufactured.

REFERENCES SIGNS LIST 10 acoustic wave device
11 substrate (quartz substrate)
12 piezoelectric thin film (LT thin film or LN thin film)
12a piezoelectric substrate
13 interdigital transducer electrode (IDT)
21 electrode finger
14 reflector
31 shunt electrode
32 boundary film
50 conventional acoustic wave device
51 piezoelectric substrate
52 interdigital transducer electrode (IDT)
53 reflector

The invention claimed is:

1. A method for fabricating an acoustic wave device, the method comprising:
   providing or forming a substrate containing 70 mass % or greater of silicon dioxide (SiO2);
   providing or forming a piezoelectric thin film with LiTaO3 crystal or LiNbO3 crystal on the substrate, Euler angles of the substrate and Euler angles of the piezoelectric thin film selected such that a phase velocity of a surface acoustic wave propagating along the substrate is greater than a phase velocity of the surface acoustic wave propagating along the piezoelectric thin film; and
   implementing an interdigital transducer electrode to be in contact with the piezoelectric thin film.

2. The method of claim 1 further comprising implementing a Si-containing film between the substrate and the piezoelectric thin film.

3. The method of claim 2 wherein the Si-containing film contains 30% or greater of SiO$_2$ or SiO, and has a thickness of 0.15 times to 1 times a wavelength of the surface acoustic wave.

4. The method of claim 2 wherein the Si-containing film contains 30% or greater of $SiO_2$ or SiO, and has a thickness of 0.3 times to 0.5 times a wavelength of the surface acoustic wave.

5. The method of claim 1 wherein the substrate includes a quartz substrate and a phase velocity of the surface acoustic wave to propagate is 4,500 m/s or greater, 4,800 m/s or greater, or 5,000 m/s or greater.

6. The method of claim 5 wherein the substrate includes a quartz substrate, and the surface acoustic wave to propagate includes a leaky acoustic wave including primarily a SH component or an S wave having a phase velocity of 4,500 m/s or greater.

7. The method of claim 1 further comprising implementing a shunt electrode and/or an insulating boundary film between the substrate and the piezoelectric thin film.

8. The method of claim 1 wherein implementing the interdigital transducer electrode results in at least a lower portion of the interdigital transducer electrode being embedded in the piezoelectric thin film and/or at least an upper portion of the interdigital transducer electrode protruding from the piezoelectric thin film.

9. The method of claim 1 wherein providing or forming the substrate includes providing or forming a quartz substrate.

10. The method of claim 1 wherein the substrate has a shear wave phase velocity of a bulk wave of 3,400 to 4,800 m/s.

11. The method of claim 1 wherein the substrate includes an isotropic substrate, and the piezoelectric thin film has a thickness of 0.001 mm or greater and less than 0.01 mm.

12. The method of claim 1 wherein the substrate has the surface acoustic wave propagate in 4,500 m/s or greater and has Euler angles of (0°±5°, 70°-165°, 0°±5°), (0°±5°, 95°-155°, 90°±5°), or crystallographically equivalent Euler angles thereof.

13. The method of claim 1 wherein the substrate has Euler angles of (0°±5°, 0°-125°, 0°±5°), (0°±5°, 0°-36°, 90°±5°), (0°±5°, 172°-180°, 90°±5°), (0°±5°, 120°-140°, 30°-49°), (0°±5°, 25°-105°, 0°±5°), (0°±5°, 0°-45°, 15°-35°), (0°±5°, 10°-20°, 60°-70°), (0°±5°, 90°-180°, 30°-45°), (0°±5°, 0°±5°, 85°-95°), (90°±5°, 90°±5°, 25°-31°), (0°±5°, 90°±5°, −3° to 3°), or crystallographically equivalent Euler angles thereof.

14. The method of claim 1 wherein the substrate has Euler angles of (20°±5°, 120°±10°, 115°±10°), (0°±5°, 90°±5°, 0°±10°), (0°±5°, 90°±5°, 75°±10°), (0°±5°, 0°±5°, 0°±10°), (0°±5°, 0°±5°, 60°±10°), or crystallographically equivalent Euler angles thereof.

15. The method of claim 1 wherein the piezoelectric thin film includes $LiTaO_3$ crystal and has Euler angles of (90°±5°, 90°±5°, 33°-55°), (90°±5°, 90°±5°, 125°-155°), or crystallographically equivalent Euler angles thereof.

16. The method of claim 1 wherein the piezoelectric thin film includes $LiNbO_3$ crystal and has Euler angles of (90°±5°, 90°±5°, 38°-65°), (90°±5°, 90°±5°, 118°-140°), or crystallographically equivalent Euler angles thereof.

17. The method of claim 1 wherein the interdigital transducer electrode has a thickness, in fraction of a wavelength of the surface acoustic wave, of 0.005-0.32, 0.005-0.20, 0.005-0.28, or 0.005-0.20 for a density range, in $kg/m^3$, of 2000-5000, 5001-9500, 9501-15000, or 15001-220000, respectively.

18. The method of claim 1 wherein the interdigital transducer electrode has a metalization ratio of 0.15-0.63, 0.15-0.63, 0.15-0.71, or 0.15-0.65 for a density range, in $kg/m^3$, of 2000-5000, 5001-9500, 9501-15000, or 15001-220000, respectively.

19. The method of claim 1 further comprising implementing an insulating boundary film between the substrate and the piezoelectric thin film, the boundary film having a thickness that is greater than or equal to 0.34 times a wavelength of the surface acoustic wave.

20. The method of claim 1 further comprising implementing an insulating boundary film disposed between the substrate and the piezoelectric thin film, the boundary film having one or more layers, one layer closest to the piezoelectric thin film having a thickness T, in fraction of a wavelength of the surface acoustic wave, of 0<T<=0.5, 0<T<=0.67, 0<T<=3, or 0<T<=0.6 for a shear wave phase velocity Vs, in m/s, of 1500<=Vs<=2200, 2200<Vs<=3400, 3400<Vs<=5900, or 5900<Vs<=13000, respectively.

21. The method of claim 1 wherein the surface acoustic wave has a higher order mode, and the interdigital transducer electrode has a thickness, in fraction of a wavelength of the surface acoustic wave, of 0.17-0.8, 0.08-0.44, 0.08-0.43, or 0.06-0.4 for a density range, in $kg/m^3$, of 2000-5000, 5001-9500, 9501-15000, or 15001-220000, respectively.

22. The method of claim 1 wherein the surface acoustic wave has a higher order mode, and the piezoelectric thin film has a thickness of 0.35 times to 9.3 times a wavelength of the surface acoustic wave.

23. The method of claim 1 wherein the surface acoustic wave includes either or both of a leaky surface acoustic wave and a longitudinal-wave-type leaky surface acoustic wave.

24. The method of claim 1 wherein the piezoelectric thin film includes $LiNbO_3$ crystal, and the surface acoustic wave includes a Rayleigh wave.

* * * * *